(12) United States Patent
Lin

(10) Patent No.: US 9,391,021 B2
(45) Date of Patent: Jul. 12, 2016

(54) CHIP PACKAGE AND METHOD FOR FABRICATING THE SAME

(75) Inventor: Mou-Shiung Lin, Hsin-Chu (TW)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 12/506,278

(22) Filed: Jul. 21, 2009

(65) Prior Publication Data

US 2010/0013082 A1      Jan. 21, 2010

Related U.S. Application Data

(63) Continuation of application No. 11/836,816, filed on Aug. 10, 2007, now Pat. No. 7,569,422.

(60) Provisional application No. 60/822,085, filed on Aug. 11, 2006.

(51) Int. Cl.
*H01L 23/525* (2006.01)
*H01L 21/56* (2006.01)
(Continued)

(52) U.S. Cl.
CPC ............ *H01L 23/525* (2013.01); *H01L 21/568* (2013.01); *H01L 21/6835* (2013.01);
(Continued)

(58) Field of Classification Search
CPC .............. H01L 21/568; H01L 23/5389; H01L 23/3128; H01L 21/6835; H01L 23/525; H01L 23/5289; H01L 24/19; H01L 24/11; H01L 2224/114–2224/116; H01L 2224/5548; H01L 2224/12105; H01L 2224/211; H01L 2924/15787; H01L 2924/18162; H01L 2924/1024; H01L 2924/1013; H01L 2924/15174; H01L 2924/1079; H01L 2924/4953; H01L 2924/15153; H01L 2924/1073–2924/1074
USPC .................. 438/108, 110, 113; 257/778, 620
See application file for complete search history.

(56) References Cited

U.S. PATENT DOCUMENTS 4,622,058 A    11/1986  Leary-Renick et al.
5,188,984 A    2/1993   Nishiguchi
(Continued)

FOREIGN PATENT DOCUMENTS

TW         466725      12/2001
TW      200427029      12/2004
(Continued)

OTHER PUBLICATIONS

"Design, Process Development and Prototyping of 3D Packaging with Multi-Stacked Flip Chips and Peripheral Through Silicon Via Interconnection", authors by Ronald Hon and S. W. Ricky Lee; Electronic Packaging Laboratory/Center for Advanced Micro-systems Packaging.*
(Continued)

*Primary Examiner* — Bilkis Jahan
*Assistant Examiner* — Nga Doan
(74) *Attorney, Agent, or Firm* — Seyfarth Shaw LLP

(57) ABSTRACT

A method for fabricating chip package includes providing a semiconductor chip with a metal bump, next adhering the semiconductor chip to a substrate using a glue material, next forming a polymer material on the substrate, on the semiconductor chip, and on the metal bump, next polishing the polymer material, next forming a patterned circuit layer over the polymer material and connected to the metal bump, and then forming a tin-containing ball over the patterned circuit layer and connected to the patterned circuit layer.

16 Claims, 57 Drawing Sheets

(51) Int. Cl.
*H01L 21/683* (2006.01)
*H01L 23/31* (2006.01)
*H01L 23/538* (2006.01)
*H01L 23/00* (2006.01)

(52) U.S. Cl.
CPC ........ *H01L23/3128* (2013.01); *H01L 23/5389* (2013.01); *H01L 24/03* (2013.01); *H01L 24/11* (2013.01); *H01L 24/19* (2013.01); *H01L 24/97* (2013.01); *H01L 2221/68345* (2013.01); *H01L 2224/0231* (2013.01); *H01L 2224/0347* (2013.01); *H01L 2224/03912* (2013.01); *H01L 2224/0401* (2013.01); *H01L 2224/04105* (2013.01); *H01L 2224/05548* (2013.01); *H01L 2224/114* (2013.01); *H01L 2224/116* (2013.01); *H01L 2224/1147* (2013.01); *H01L 2224/11334* (2013.01); *H01L 2224/12105* (2013.01); *H01L 2224/13111* (2013.01); *H01L 2224/13144* (2013.01); *H01L 2224/13147* (2013.01); *H01L 2224/20* (2013.01); *H01L 2224/211* (2013.01); *H01L 2224/24137* (2013.01); *H01L 2224/24195* (2013.01); *H01L 2224/24227* (2013.01); *H01L 2224/32225* (2013.01); *H01L 2224/32245* (2013.01); *H01L 2224/73267* (2013.01); *H01L 2224/92244* (2013.01); *H01L 2224/97* (2013.01); *H01L 2924/00013* (2013.01); *H01L 2924/014* (2013.01); *H01L 2924/0105* (2013.01); *H01L 2924/01005* (2013.01); *H01L 2924/01006* (2013.01); *H01L 2924/01007* (2013.01); *H01L 2924/01011* (2013.01); *H01L 2924/01013* (2013.01); *H01L 2924/01014* (2013.01); *H01L 2924/01015* (2013.01); *H01L 2924/01018* (2013.01); *H01L 2924/01019* (2013.01); *H01L 2924/01022* (2013.01); *H01L 2924/01024* (2013.01); *H01L 2924/01028* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/04941* (2013.01); *H01L 2924/04953* (2013.01); *H01L 2924/05042* (2013.01); *H01L 2924/10329* (2013.01); *H01L 2924/12044* (2013.01); *H01L 2924/1305* (2013.01); *H01L 2924/14* (2013.01); *H01L 2924/15153* (2013.01); *H01L 2924/15165* (2013.01); *H01L 2924/15174* (2013.01); *H01L 2924/15311* (2013.01); *H01L 2924/15787* (2013.01); *H01L 2924/15788* (2013.01); *H01L 2924/18162* (2013.01); *H01L 2924/19041* (2013.01); *H01L 2924/19042* (2013.01); *H01L 2924/19043* (2013.01)

(56) References Cited

U.S. PATENT DOCUMENTS

| | | | |
|---|---|---|---|
| 5,241,456 A | 8/1993 | Marcinkiewicz et al. | |
| 5,324,687 A | 6/1994 | Wojnarowski | |
| 5,548,091 A | 8/1996 | DiStefano et al. | |
| 5,656,863 A | 8/1997 | Yasunaga et al. | |
| 5,663,106 A | 9/1997 | Karavakis et al. | |
| 5,776,796 A | 7/1998 | DiStefano et al. | |
| 5,817,541 A | 10/1998 | Averkiou et al. | |
| 5,834,339 A | 11/1998 | DiStefano et al. | |
| 5,841,193 A | 11/1998 | Eichelberger | |
| 5,875,545 A | 3/1999 | DiStefano et al. | |
| 6,002,592 A | 12/1999 | Nakamura et al. | |
| 6,015,652 A * | 1/2000 | Ahlquist et al. | 430/315 |
| 6,030,856 A | 2/2000 | DiStefano et al. | |
| 6,045,655 A | 4/2000 | DiStefano et al. | |
| 6,046,076 A | 4/2000 | Mitchell et al. | |
| 6,080,605 A | 6/2000 | DiStefano et al. | |
| 6,093,584 A | 7/2000 | Fjelstad | |
| 6,107,123 A | 8/2000 | DiStefano et al. | |
| 6,126,428 A | 10/2000 | Mitchell et al. | |
| 6,130,116 A | 10/2000 | Smith et al. | |
| 6,163,456 A | 12/2000 | Suzuki et al. | |
| 6,168,965 B1 | 1/2001 | Malinovich et al. | |
| 6,202,299 B1 | 3/2001 | DiStefano et al. | |
| 6,204,091 B1 | 3/2001 | Smith et al. | |
| 6,218,215 B1 | 4/2001 | DiStefano et al. | |
| 6,232,152 B1 | 5/2001 | DiStefano et al. | |
| 6,255,738 B1 | 7/2001 | DiStefano et al. | |
| 6,277,669 B1 | 8/2001 | Kung et al. | |
| 6,287,893 B1 | 9/2001 | Elenius et al. | |
| 6,291,884 B1 | 9/2001 | Glenn et al. | |
| 6,294,040 B1 | 9/2001 | Raab et al. | |
| 6,303,423 B1 | 10/2001 | Lin | |
| 6,309,915 B1 | 10/2001 | DiStefano | |
| 6,329,224 B1 | 12/2001 | Nguyen et al. | |
| 6,359,335 B1 | 3/2002 | DiStefano et al. | |
| 6,373,141 B1 | 4/2002 | DiStefano et al. | |
| 6,388,340 B2 | 5/2002 | DiStefano | |
| 6,423,570 B1 | 7/2002 | Ma et al. | |
| 6,458,681 B1 | 10/2002 | DiStefano et al. | |
| 6,460,245 B1 | 10/2002 | DiStefano | |
| 6,486,005 B1 | 11/2002 | Kim | |
| 6,495,914 B1 | 12/2002 | Sekine et al. | |
| 6,521,996 B1 * | 2/2003 | Seshan | 257/737 |
| 6,582,991 B1 | 6/2003 | Maeda et al. | |
| 6,602,740 B1 | 8/2003 | Mitchell | |
| 6,607,970 B1 | 8/2003 | Wakabayashi | |
| 6,653,172 B2 | 11/2003 | DiStefano et al. | |
| 6,673,698 B1 * | 1/2004 | Lin et al. | 438/459 |
| 6,686,015 B2 | 2/2004 | Raab et al. | |
| 6,780,747 B2 | 8/2004 | DiStefano et al. | |
| 6,794,273 B2 | 9/2004 | Saito et al. | |
| 6,800,941 B2 * | 10/2004 | Lee et al. | 257/773 |
| 7,019,406 B2 * | 3/2006 | Huang et al. | 257/778 |
| 7,272,888 B2 | 9/2007 | DiStefano | |
| 7,339,279 B2 | 3/2008 | Yang | |
| 7,454,834 B2 | 11/2008 | DiStefano | |
| 7,569,422 B2 | 8/2009 | Lin | |
| 8,022,544 B2 * | 9/2011 | Lin et al. | 257/758 |
| 8,148,210 B1 | 4/2012 | Fuergut et al. | |
| 8,202,763 B2 | 6/2012 | Meyer et al. | |
| 8,236,151 B1 | 8/2012 | Olson et al. | |
| 8,535,978 B2 | 9/2013 | Scanlan | |
| 8,569,892 B2 | 10/2013 | Mori et al. | |
| 8,604,600 B2 | 12/2013 | Scanlan | |
| 8,609,471 B2 | 12/2013 | Xu | |
| 2001/0026010 A1 | 10/2001 | Horiuchi et al. | |
| 2002/0006718 A1 | 1/2002 | DiStefano | |
| 2002/0007904 A1 | 1/2002 | Raab et al. | |
| 2002/0094671 A1 | 7/2002 | DiStefano et al. | |
| 2002/0168797 A1 | 11/2002 | DiStefano et al. | |
| 2002/0184758 A1 | 12/2002 | DiStefano | |
| 2003/0027373 A1 | 2/2003 | DiStefano et al. | |
| 2003/0215980 A1 * | 11/2003 | Otaki | 438/106 |
| 2004/0009629 A1 | 1/2004 | Ahn et al. | |
| 2004/0113245 A1 | 6/2004 | Takaoka et al. | |
| 2004/0121563 A1 | 6/2004 | Farnworth et al. | |
| 2005/0098891 A1 * | 5/2005 | Wakabayashi et al. | 257/758 |
| 2005/0121804 A1 | 6/2005 | Kuo et al. | |
| 2005/0224966 A1 | 10/2005 | Fogel et al. | |
| 2005/0242408 A1 | 11/2005 | Yang et al. | |
| 2006/0079025 A1 * | 4/2006 | Kripesh | H01L 23/3185 438/113 |
| 2006/0225272 A1 | 10/2006 | DiStefano | |
| 2007/0164430 A1 * | 7/2007 | Lin | H01L 21/288 257/734 |
| 2007/0205520 A1 * | 9/2007 | Chou | H01L 24/11 257/780 |
| 2008/0020511 A1 | 1/2008 | Yang et al. | |
| 2008/0085572 A1 | 4/2008 | Yang et al. | |
| 2008/0108168 A1 | 5/2008 | Yang et al. | |

(56) References Cited

U.S. PATENT DOCUMENTS

| | | | |
|---|---|---|---|
| 2011/0156240 | A1 | 6/2011 | Luan et al. |
| 2011/0198762 | A1 | 8/2011 | Scanlan |
| 2011/0202896 | A1 | 8/2011 | Scanlan et al. |
| 2011/0291272 | A1* | 12/2011 | Lin et al. .......... 257/737 |
| 2011/0308955 | A1 | 12/2011 | Olson |
| 2013/0167102 | A1 | 6/2013 | Olson et al. |
| 2013/0241074 | A1 | 9/2013 | Scanlan et al. |
| 2013/0244376 | A1 | 9/2013 | Scanlan |
| 2013/0248361 | A1 | 9/2013 | Sto. Domingo |
| 2013/0249088 | A1 | 9/2013 | Scanlan et al. |
| 2013/0280826 | A1 | 10/2013 | Scanlan et al. |
| 2014/0008809 | A1 | 1/2014 | Scanlan |
| 2014/0024178 | A1 | 1/2014 | Scanlan et al. |

FOREIGN PATENT DOCUMENTS

| | | |
|---|---|---|
| TW | 200509345 | 3/2005 |
| TW | 200520192 | 6/2005 |
| TW | I240338 | 9/2005 |
| TW | 200536025 | 11/2005 |

OTHER PUBLICATIONS

"Direct Bump-On-Copper Process for Flip Chip Technologies", Authors by Jamin Ling, Joseph Sanchez, Ralph Moyer, Mark Bachman, Dave Stepniak, Pete Elenius; 2002 IEEE, Electronic Components and Technology Conference.*
Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.
Edelstein, D.C., "Advantages of Copper Interconnects," Proceedings of the 12th International IEEE VLSI Multilevel Interconnection Conference (1995) pp. 301-307.
Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.
Gao, X. et al. "An improved electrostatic discharge protection structure for reducing triggering voltage and parasitic capacitance," Solid-State Electronics, 27 (2003), pp. 1105-1110.
Yeoh, A. et al. "Copper Die Bumps (First Level Interconnect) and Low-K Dielectrics in 65nm High Volume Manufacturing," Electronic Components and Technology Conference (2006) pp. 1611-1615.
Hu, C-K. et al. "Copper-Polyimide Wiring Technology for VLSI Circuits," Materials Research Society Symposium Proceedings VLSI V (1990) pp. 369-373.
Roesch, W. et al. "Cycling copper flip chip interconnects," Microelectronics Reliability, 44 (2004) pp. 1047-1054.
Lee, Y-H. et al. "Effect of ESD Layout on the Assembly Yield and Reliability," International Electron Devices Meeting (2006) pp. 1-4.
Yeoh, T-S. "ESD Effects on Power Supply Clamps," Proceedings of the 6th International Sympoisum on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.
Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar/BiCMOS Circuits and Technology Meeting (1999) pgs. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Technology Conference (2008) pp. 216-218.
Kurd, N. et al. "Next Generation Intel® Micro-architecture (Nehalem) Clocking Architecture," Symposium on VLSI Circuits Digest of Technical Papers (2008) pp. 62-63.
Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
MEGIC Corp. "MEGIC way to system solutions through bumping and redistribution," (Brochure) (Feb. 6, 2004) pp. 1-3.
Lin, M.S. "Post Passivation Technology™ —MEGIC® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.
Kawahara T., "SuperCSP™," IEEE Transactions on Advanced Packaging, May 2000, vol. 23, No. 2, pp. 215-219.
Pressel K., "System Integration—Trends from the International Technology Roadmap for Semiconductors ITRS," Infineon, Euripides Forum, Oct. 9, 2008, pp. 1-41.
Taiwan Search Report—TW096127428—TIPO—Sep. 15, 2014.

* cited by examiner

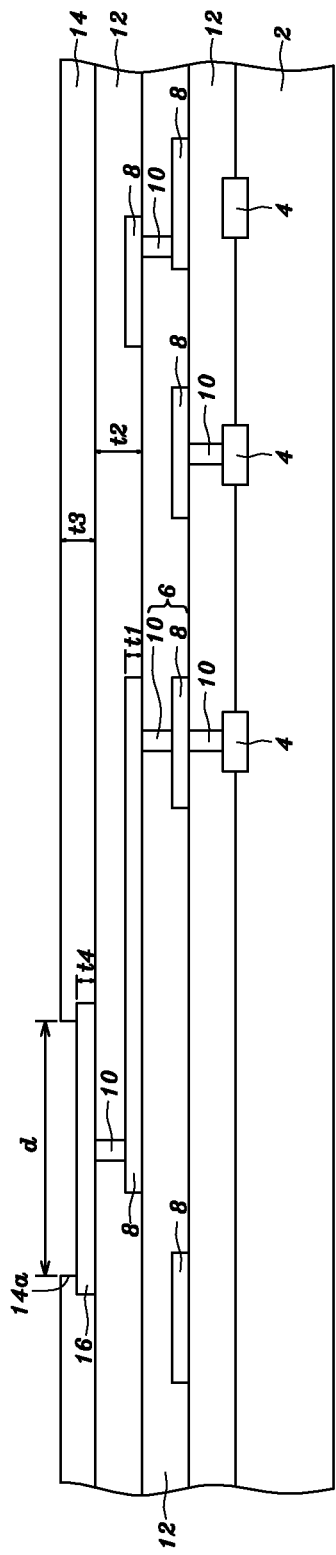
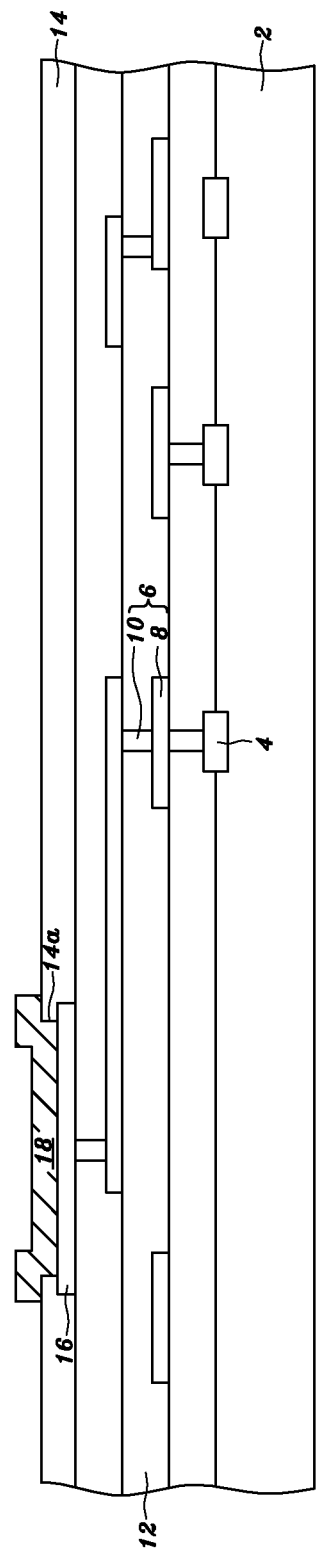
Fig. 1A
Fig. 1B

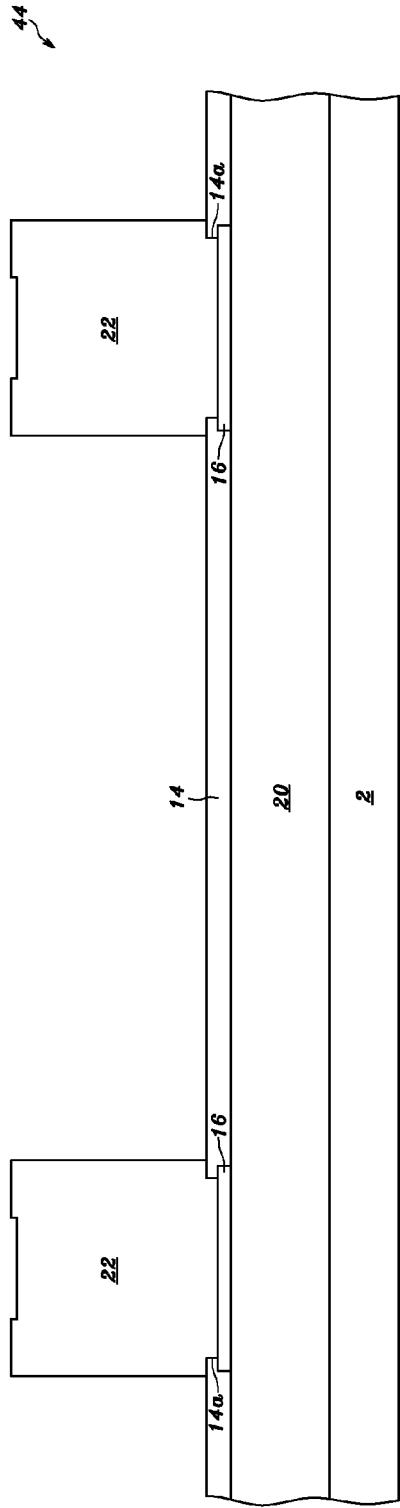
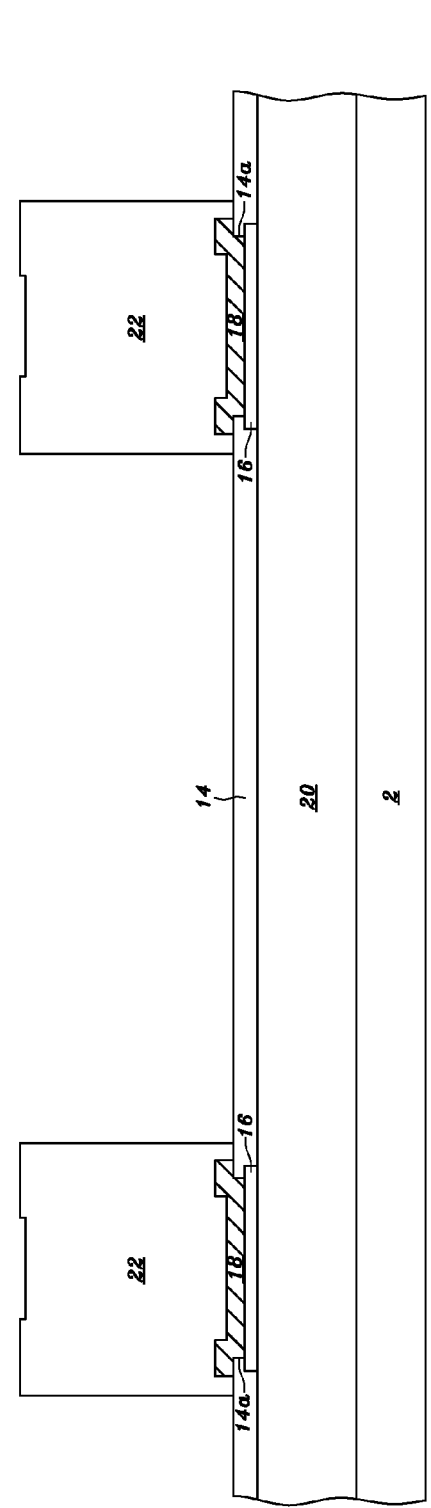

Fig. 2A-a

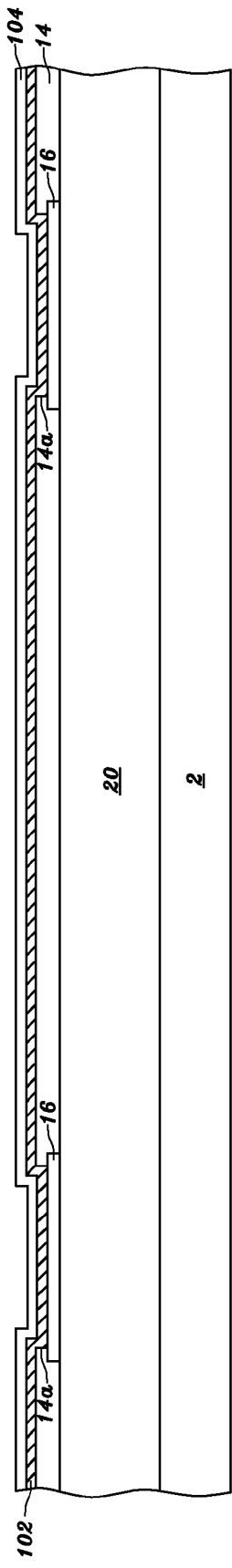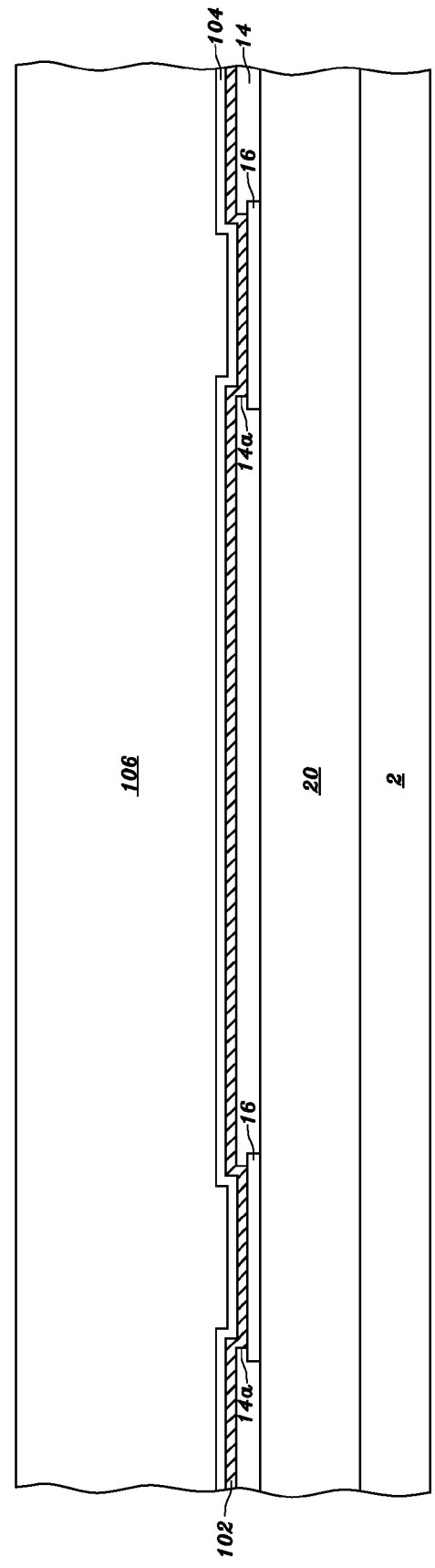
Fig. 2A-b
Fig. 2A-c

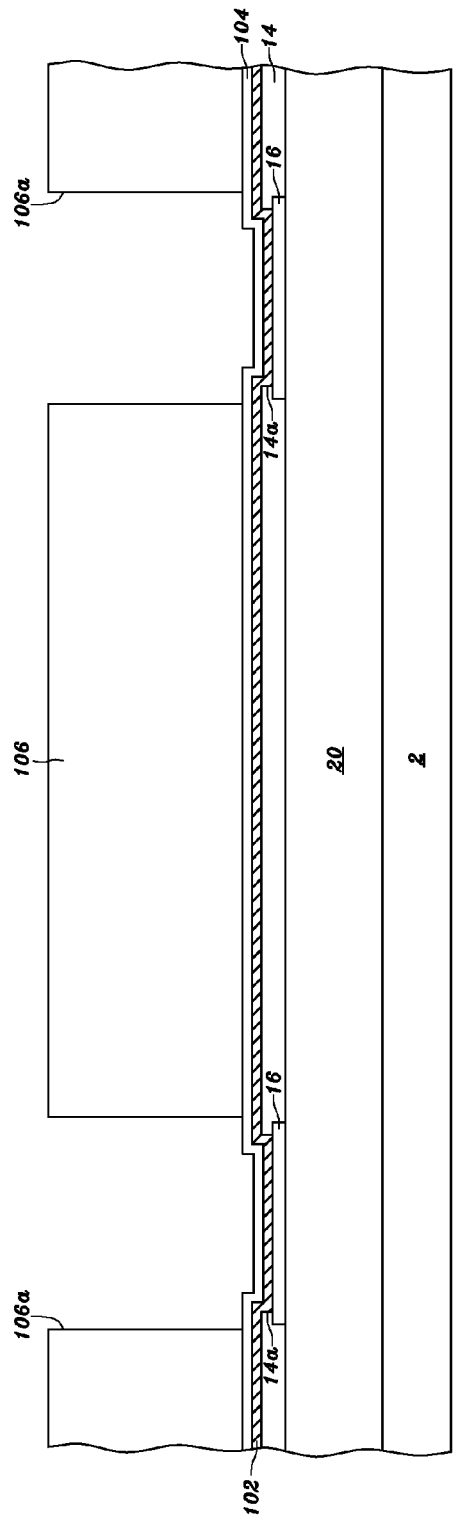
Fig. 2A-d
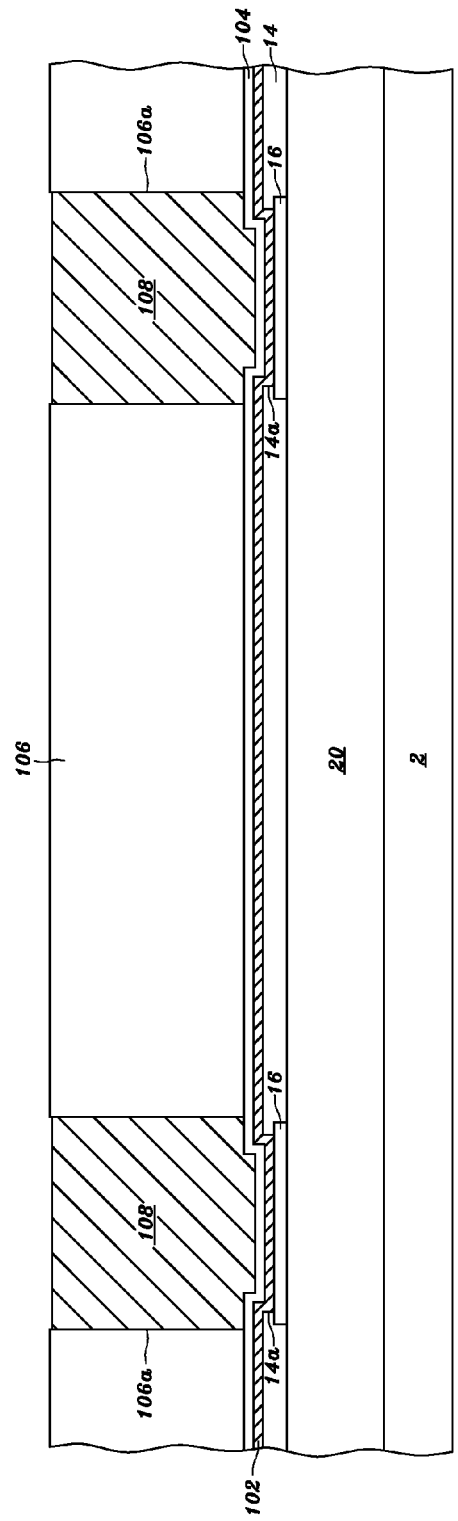
Fig. 2A-e

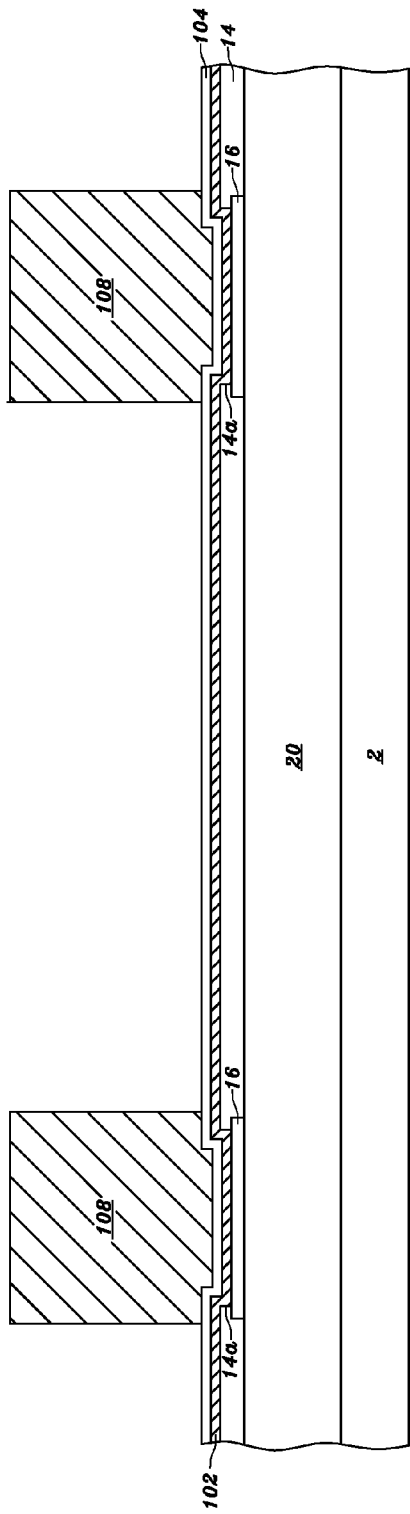
Fig. 2A-f
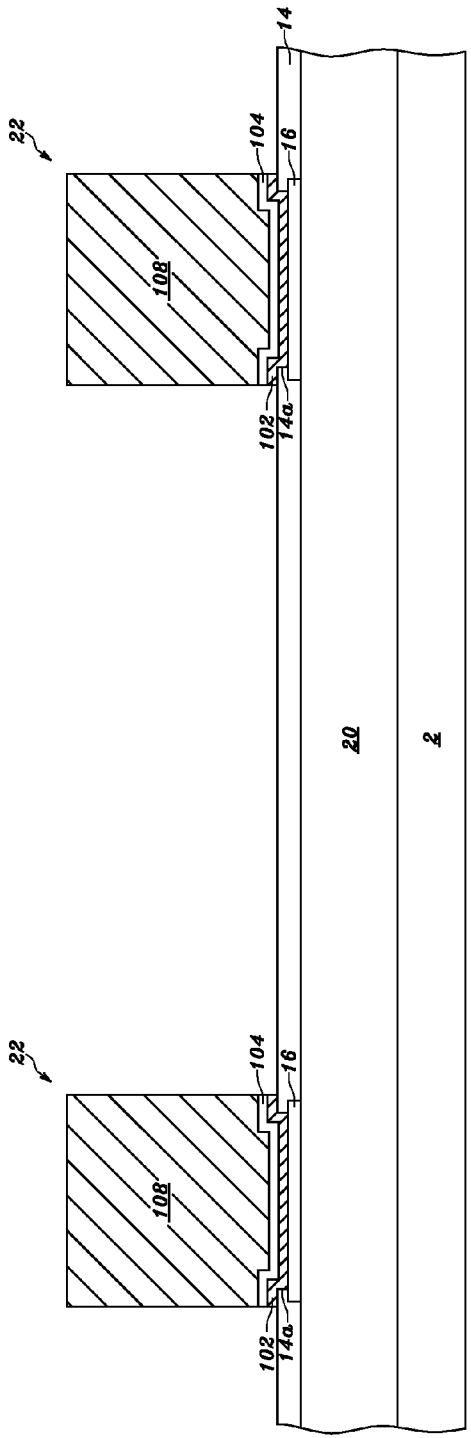
Fig. 2A-g

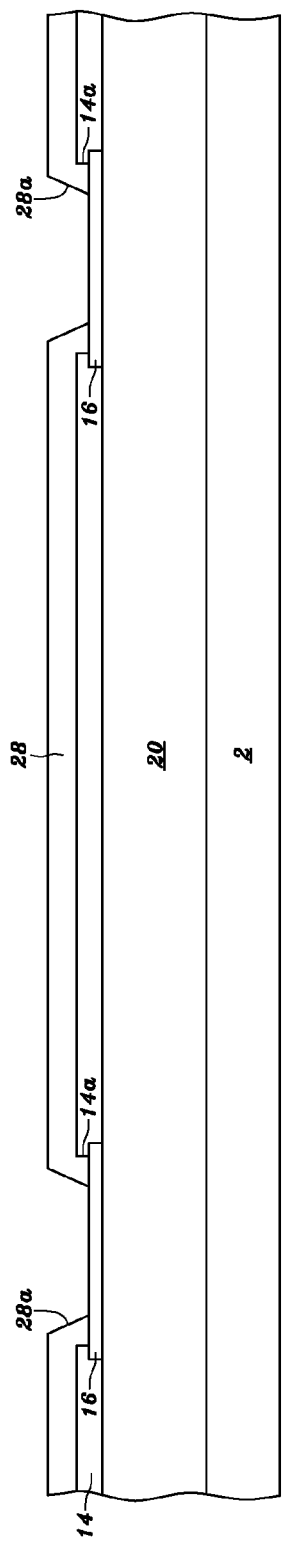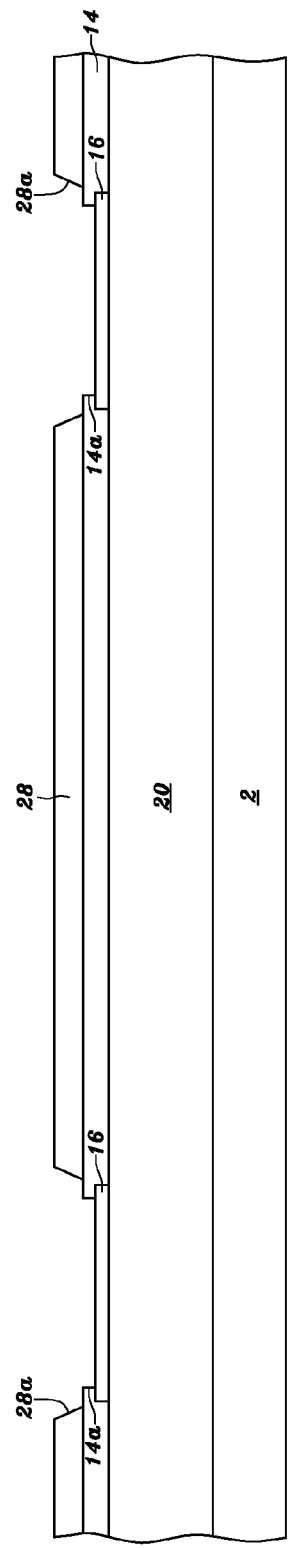

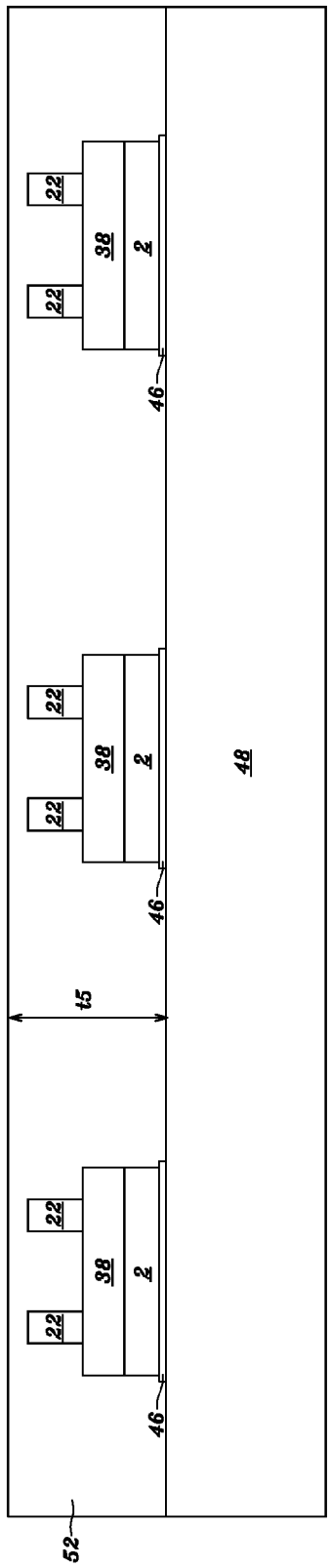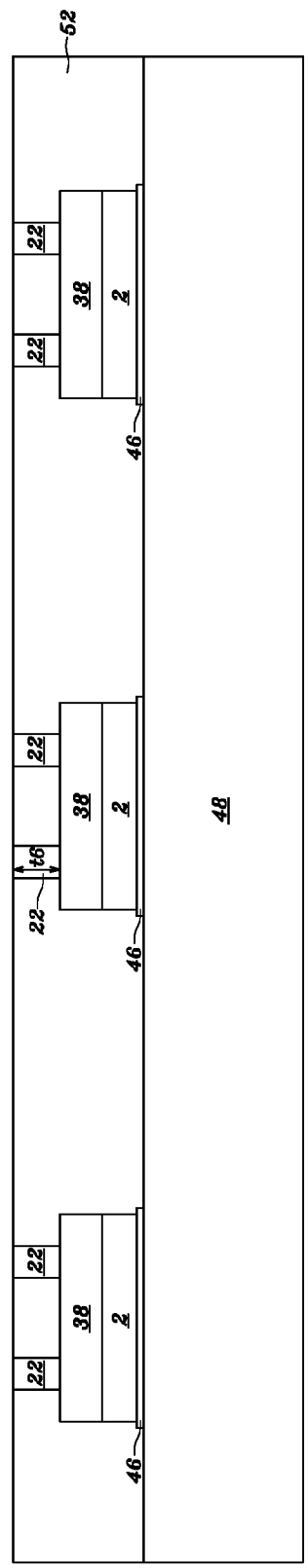

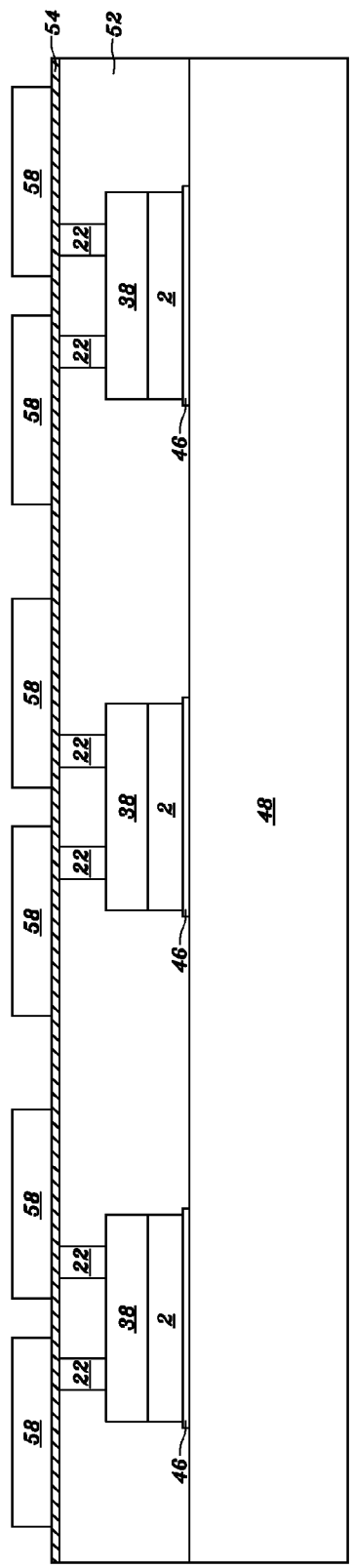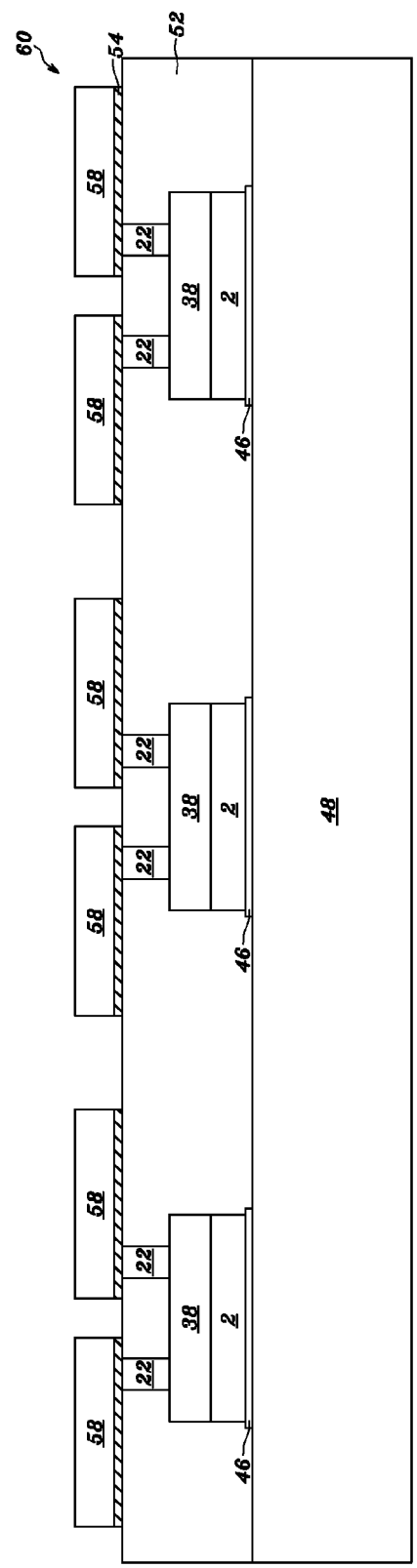

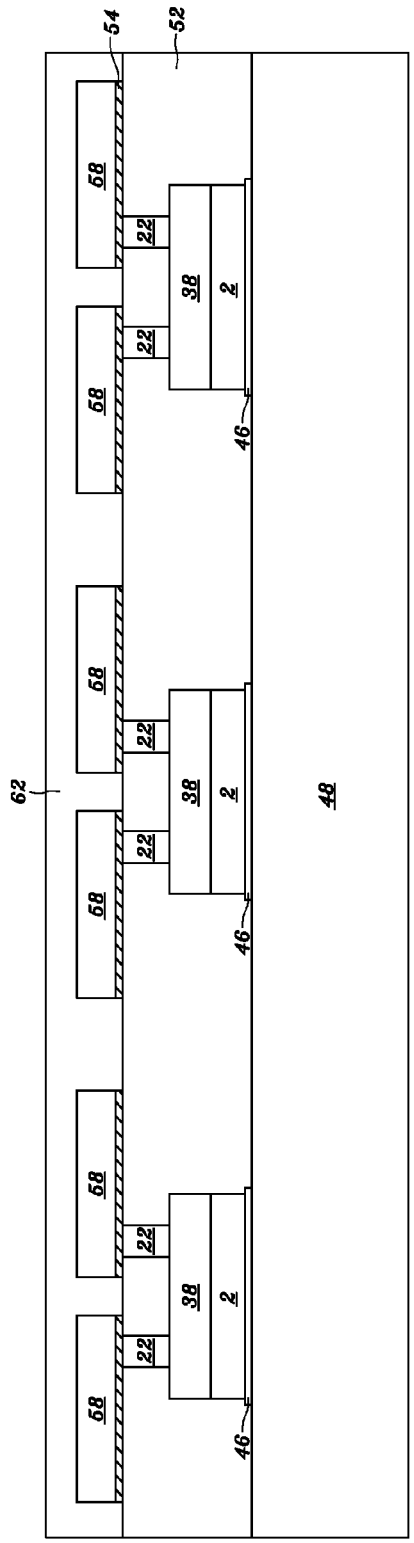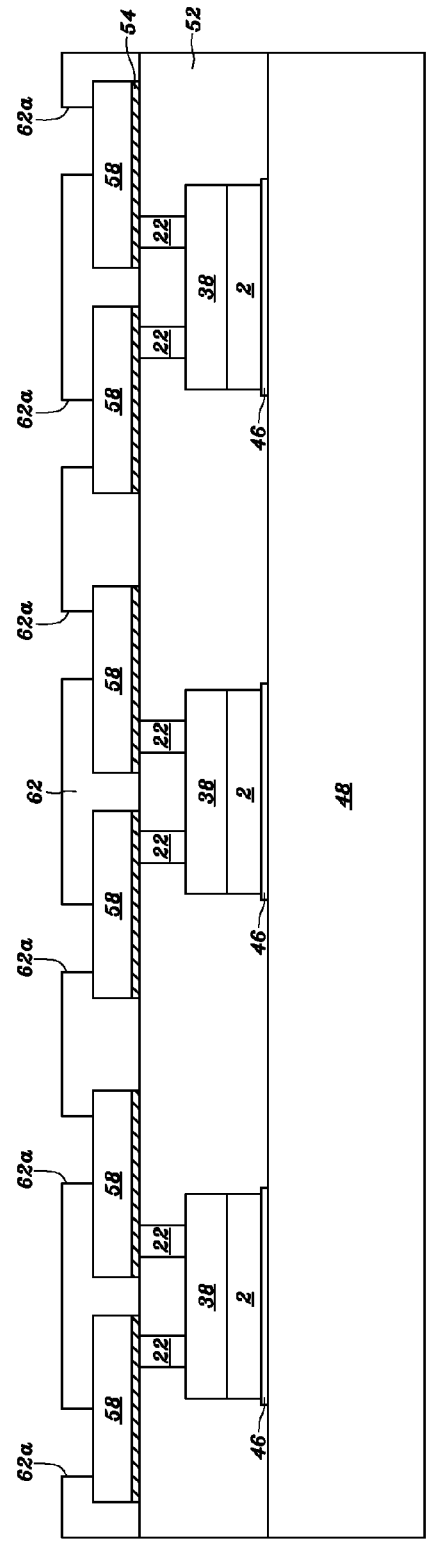

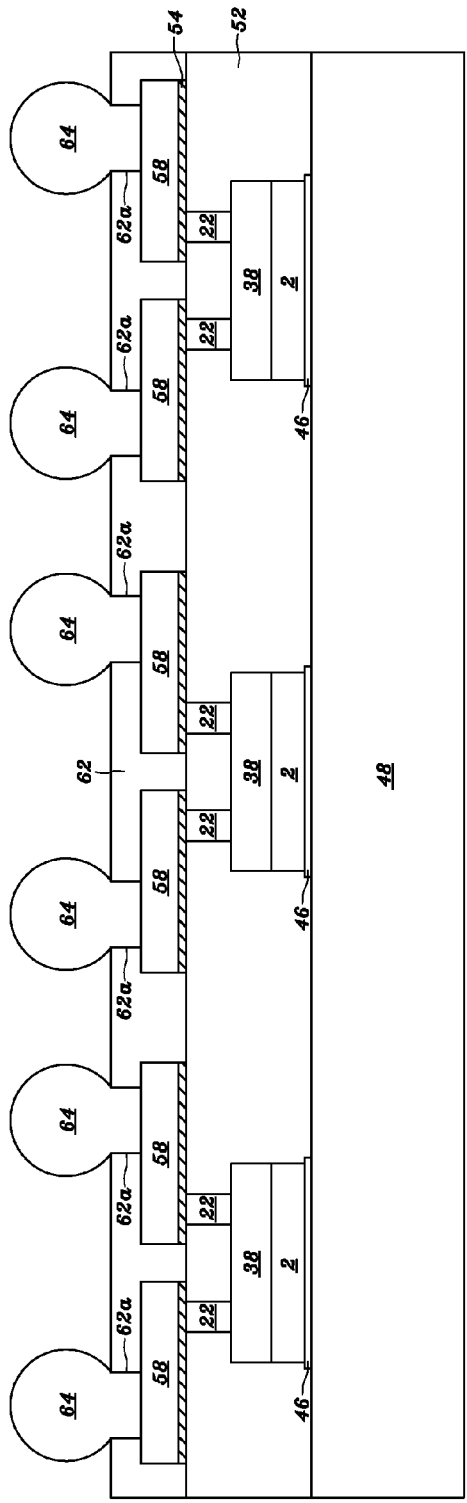
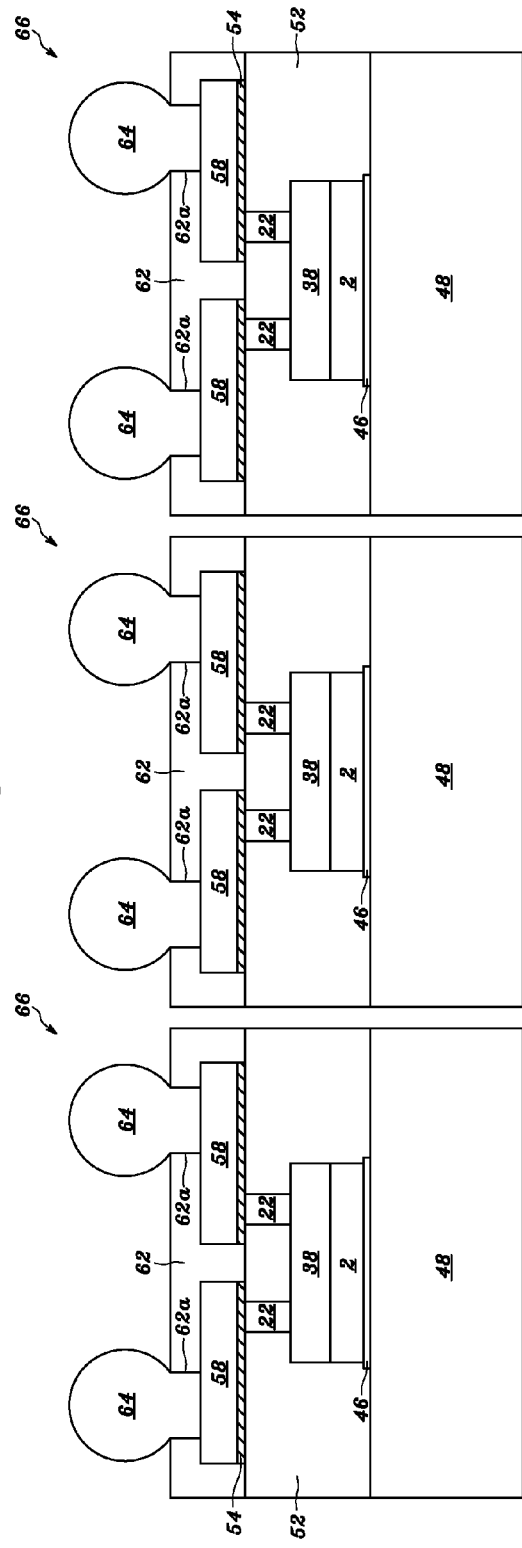
Fig. 6M
Fig. 6N

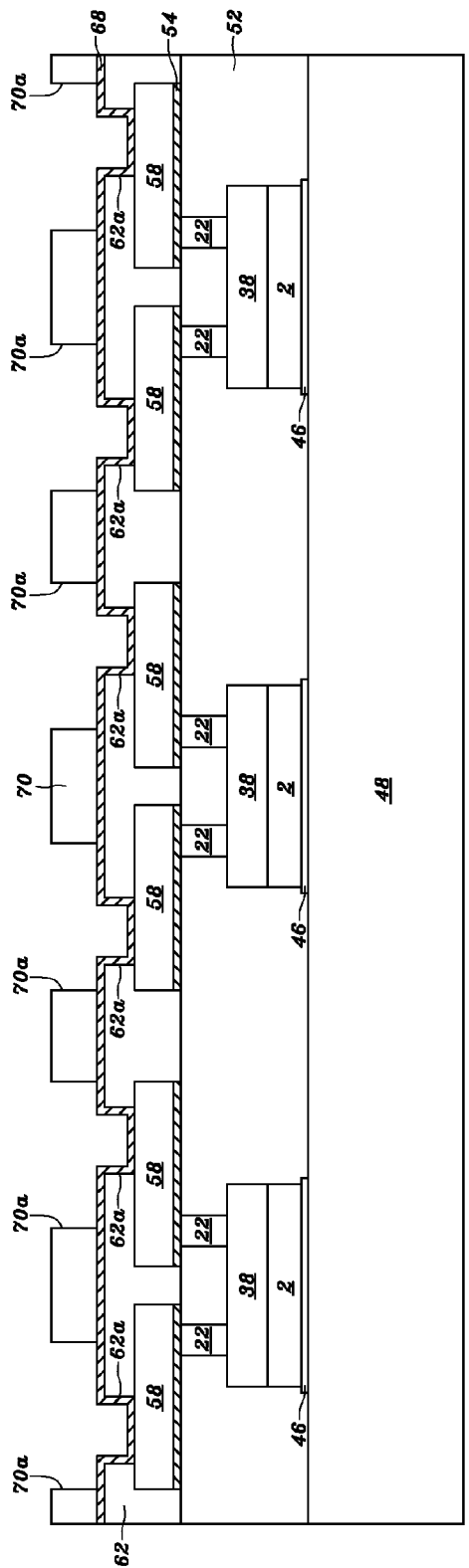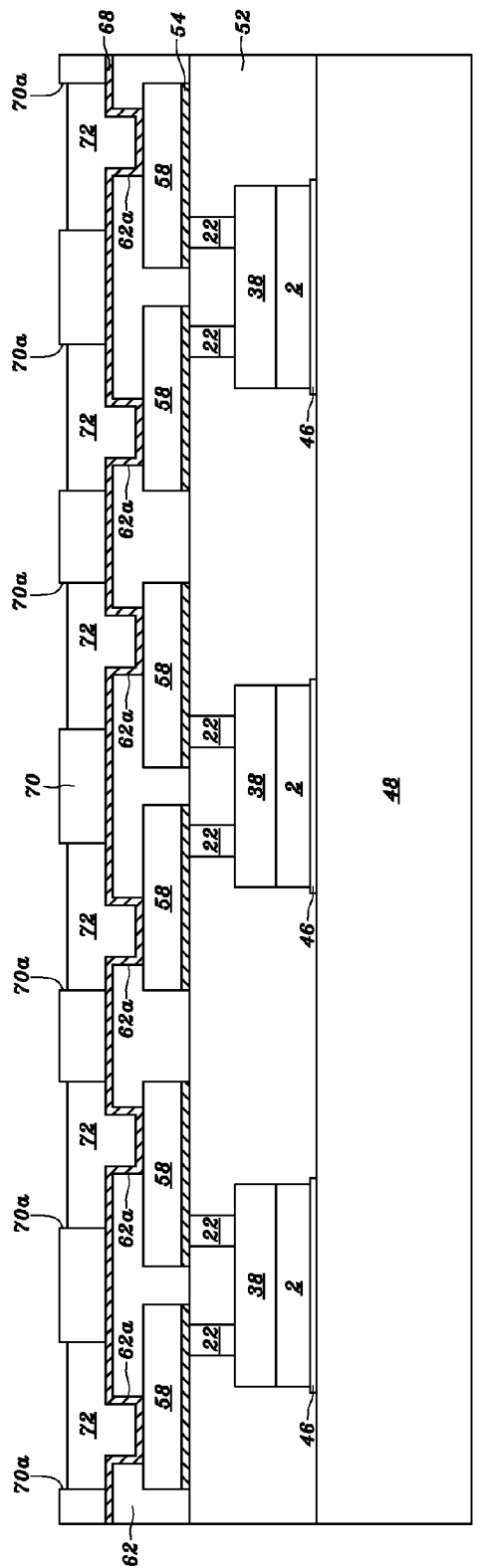

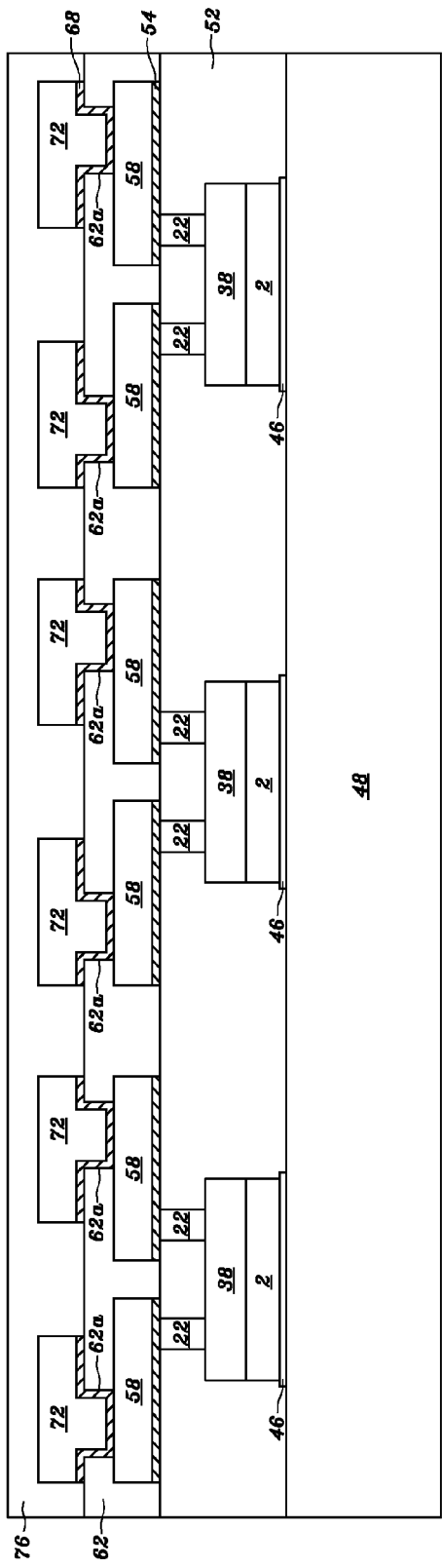
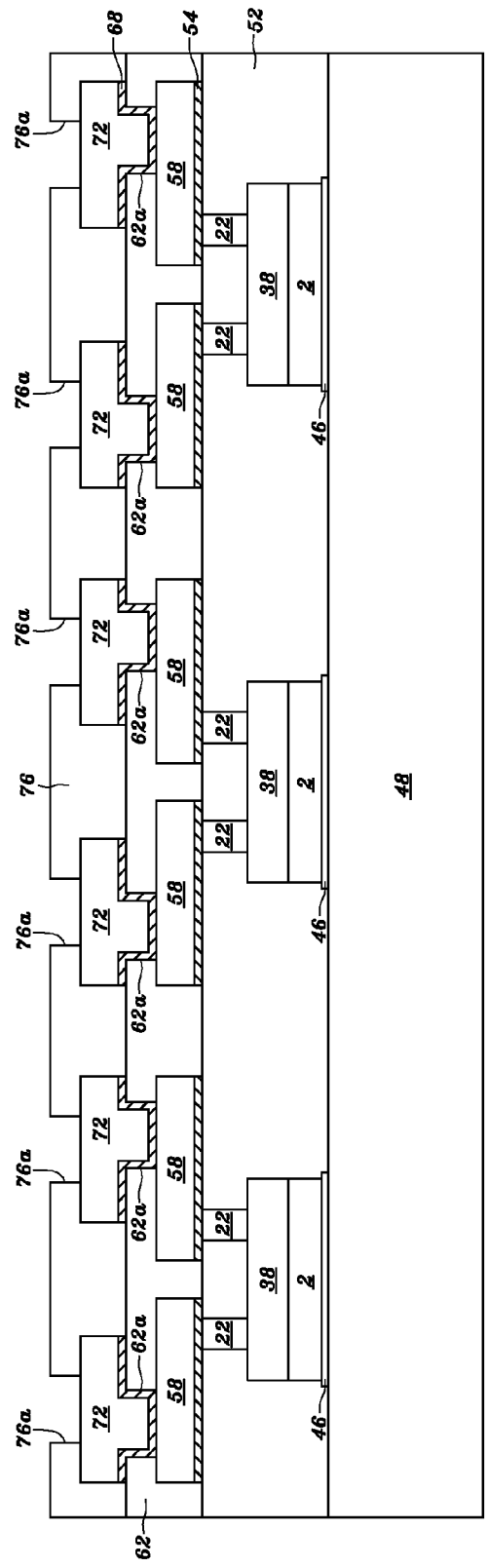
Fig. 6U
Fig. 6V

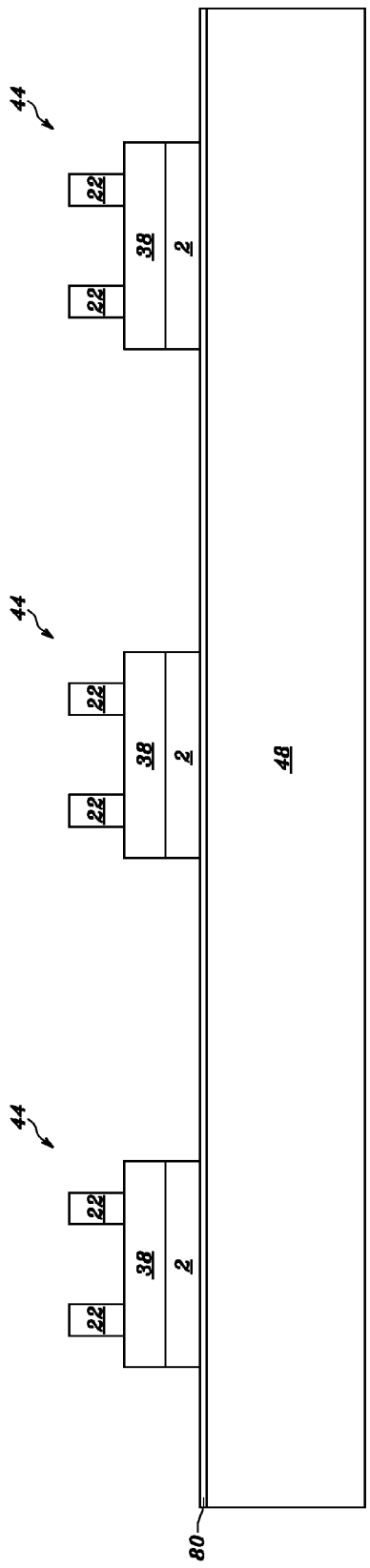
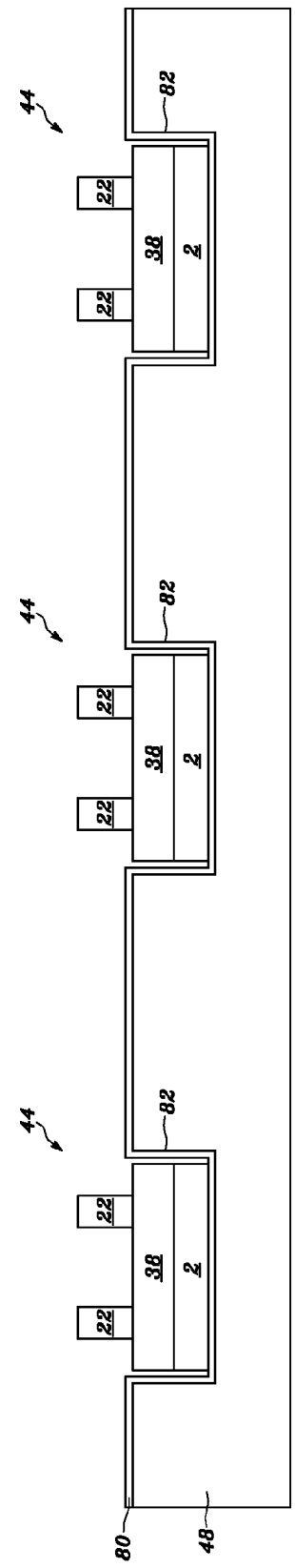

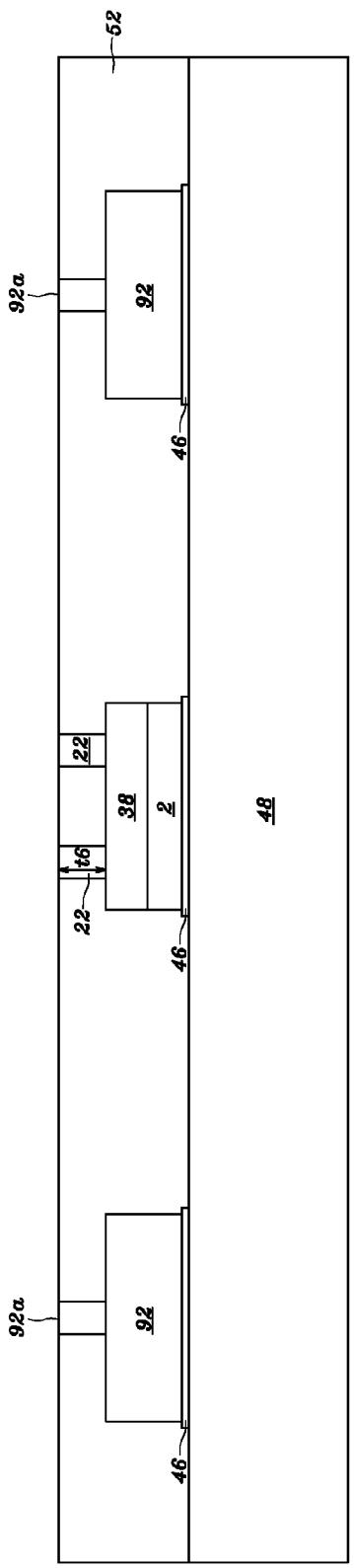
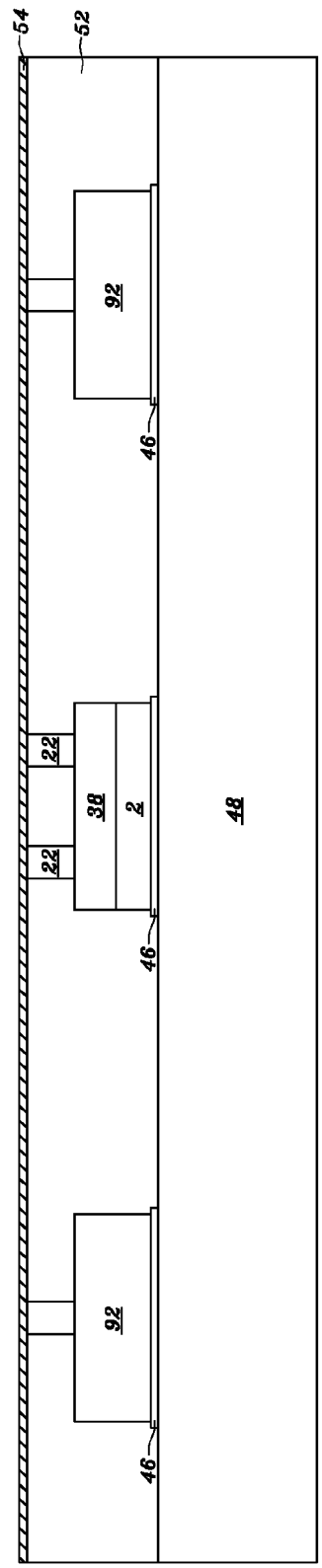
Fig. 8C
Fig. 8D

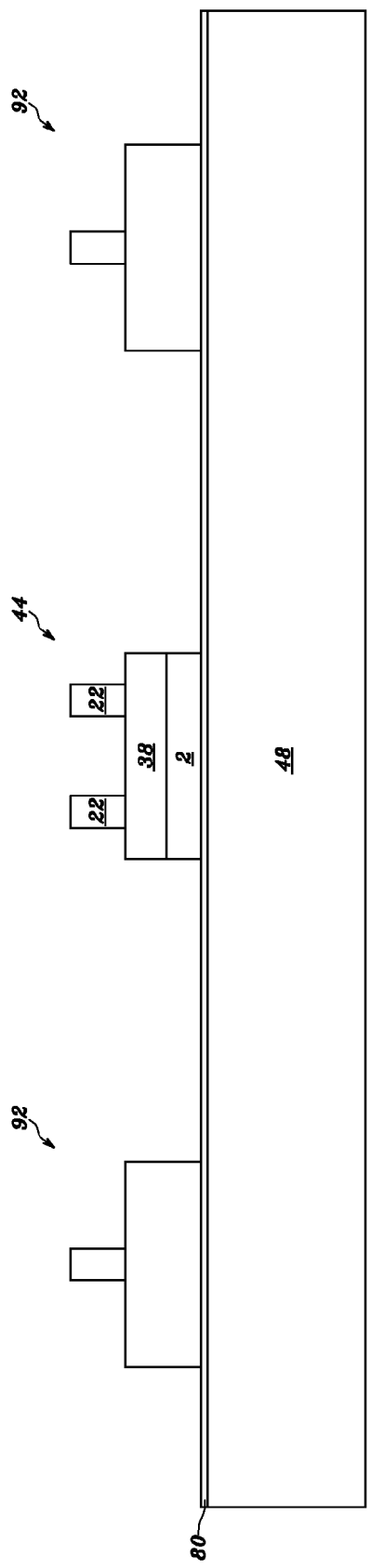
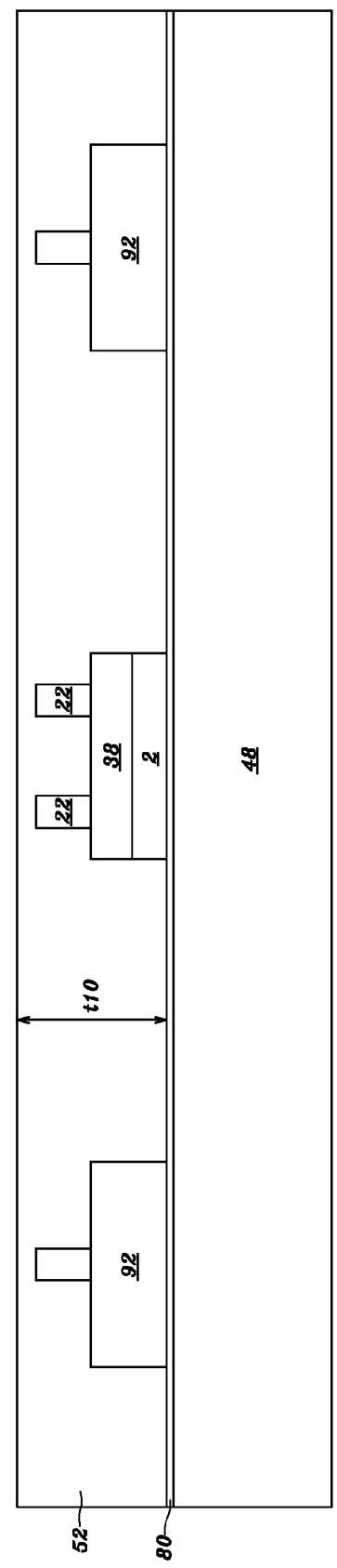
Fig. 9A
Fig. 9B

CHIP PACKAGE AND METHOD FOR FABRICATING THE SAME

This application is a continuation of application Ser. No. 11/836,816, filed on Aug. 10, 2007, now issued as U.S. Pat. No. 7,569,422, which claims priority to U.S. provisional application No. 60/822,085, filed on Aug. 11, 2006, which is herein incorporated by reference in its entirety.

BACKGROUND OF THE INVENTION

1. Field of the Invention

The invention relates to a chip package, and, more specifically, to a chip package

2. Brief Description of the Related Art

In the recent years, the development of advanced technology is on the cutting edge. As a result, high-technology electronics manufacturing industries launch more feature-packed and humanized electronic products. These new products that hit the showroom are lighter, thinner, and smaller in design. In the manufacturing of these electronic products, the key component has to be the integrated circuit (IC) chip inside any electronic product.

The operability, performance, and life of an IC chip are greatly affected by its circuit design, wafer manufacturing, and chip packaging. For this present invention, the focus will be on a chip packaging technique. Since the features and speed of IC chips are increasing rapidly, the need for increasing the conductivity of the circuitry is necessary so that the signal delay and attenuation of the dies to the external circuitry are reduced. A chip package that allows good thermal dissipation and protection of the IC chips with a small overall dimension of the package is also necessary for higher performance chips. These are the goals to be achieved in chip packaging.

There are a vast variety of existing chip package techniques for mounting a die on a substrate. For a tape automated bonding (TAB) technique, traces on a tape help to fan out the routing. For a flip-chip technique, solder balls act as an interface for a die to electrically connect to an external circuit. For a wirebonding technique, bonded wires act as an interface for a die to electrically connect to an external circuit.

U.S. Pat. Nos. 6,673,698 and 6,800,941 and U.S. Pub. No. 2003/0122244, 2003/0122246 and 2003/0122243 teach another technology for packaging a chip comprising mounting a semiconductor chip, after being cut from a semiconductor wafer, on a substrate, and then forming a circuit over the chip and across the edge of the chip to the peripheral region outside the upper space over the chip.

SUMMARY OF THE INVENTION

It is the objective of the invention to provide a chip package for packaging a fine-pitched chip due to a metal bump preformed on the fine-pitched chip.

It is the objective of the invention to provide a chip package with a good electrical performance.

In order to reach the above objectives, the present invention provides a chip package comprising: a substrate; a glue material, such as epoxy resin or polyimide (PI), on the substrate; a semiconductor chip on the glue material, wherein the semiconductor chip comprises a metal bump having a thickness of between 10 and 30 μm; a polymer material, such as epoxy based material, benzocyclobutane (BCB) or polyimide, over the substrate and on the semiconductor chip, uncovering a top surface of the metal bump; a patterned circuit layer over the polymer material and connected to the metal bump; and a tin-containing ball over the patterned circuit layer and connected to the patterned circuit layer.

In order to reach the above objectives, a method for fabricating chip package comprises the following steps: providing a semiconductor chip with a metal bump; adhering the semiconductor chip to a substrate; forming a polymer material on the substrate, on the semiconductor chip, and on the metal bump; polishing the polymer material; forming a patterned circuit layer over the polymer material and connected to the metal bump; and forming a tin-containing ball over the patterned circuit layer and connected to the patterned circuit layer.

To enable the objectives, technical contents, characteristics and accomplishments of the present invention, the embodiments of the present invention are to be described in detail in cooperation with the attached drawings below.

BRIEF DESCRIPTION OF THE DRAWINGS

FIGS. 1A through 1B are cross-sectional views schematically showing various structures according to the present invention.

FIGS. 2A through 2I are cross-sectional views showing a metal bump formed over a semiconductor substrate of a semiconductor wafer.

FIGS. 2A-a through 2A-g are cross-sectional views showing a process of forming a metal bump over a semiconductor wafer.

FIGS. 3A through 3G are cross-sectional views showing a metal bump formed over a semiconductor substrate of a semiconductor wafer.

FIGS. 7A through 7J are cross-sectional views showing a process according to one embodiment of the present invention.

FIGS. 8A through 8M are cross-sectional views showing a process according to one embodiment of the present invention.

FIGS. 9A through 9L are cross-sectional views showing a process according to one embodiment of the present invention.

DETAILED DESCRIPTION OF THE INVENTION

Figure 2C:
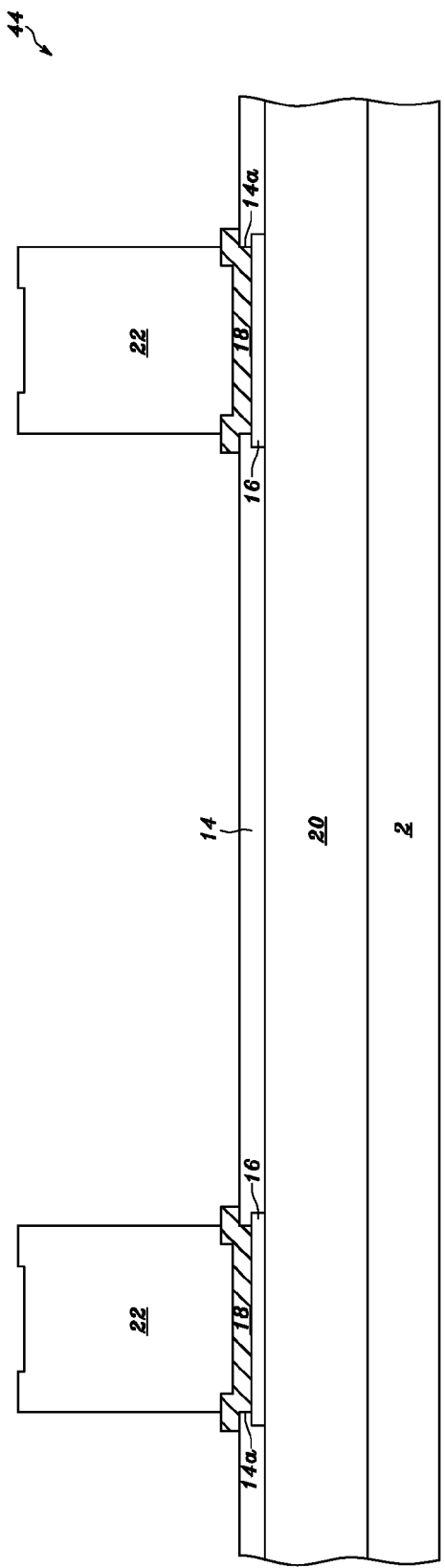
Figure 2C:
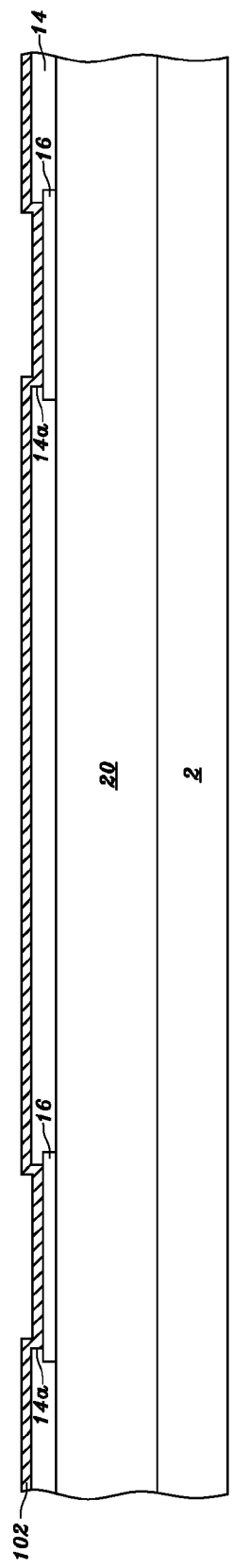

Referring to FIG. 1A, a semiconductor substrate or semiconductor blank wafer 2 may be a silicon substrate or silicon wafer, a GaAs substrate or GaAs wafer, or a SiGe substrate or SiGe wafer. Multiple semiconductor devices 4 are formed in or over the semiconductor substrate 2. The semiconductor device 4 may be a memory device, a logic device, a passive device, such as resistor, capacitor, inductor or filter, or an active device, such as p-channel MOS device, n-channel MOS device, CMOS (Complementary Metal Oxide Semiconductor), BJT (Bipolar Junction Transistor) or BiCMOS (Bipolar CMOS) device.

A circuit structure 6, fine line metal trace structure, is formed over the semiconductor substrate 2 and connect to the semiconductor device 4. The circuit structure 6 comprises multiple patterned metal layers 8 having a thickness t1 of less than 3 µm (such as between 0.2 and 2 µm) and multiple metal plugs 10. For example, the patterned metal layers 8 and the metal plugs 10 are principally made of copper, wherein the patterned metal layer 8 is a copper layer having a thickness of less than 3 µm (such as between 0.2 and 2 µm). Alternatively, the patterned metal layer 8 is principally made of aluminum or aluminum-alloy, and the metal plug 10 is principally made of tungsten, wherein the patterned metal layer 8 is an aluminum-containing layer having a thickness of less than 3 µm (such as between 0.2 and 2 µm).

One of the patterned metal layers 8 may be formed by a damascene process including sputtering an adhesion/barrier layer, such as tantalum or tantalum nitride, on an insulating layer, composed of Low-K oxide and oxynitride, and in an opening in the insulating layer, then sputtering a first copper layer on the adhesion/barrier layer, then electroplating a second copper layer on the first copper layer, then removing the first and second copper layers and the adhesion/barrier layer outside the opening in the insulating layer using a chemical mechanical polishing (CMP) process. Alternatively, one of the patterned metal layer 8 may be formed by a process including sputtering an aluminum-alloy layer, containing more than 90 wt % aluminum and less than 10 wt % copper, on an insulating layer, such as oxide, then patterning the aluminum-alloy layer using photolithography and etching processes.

Multiple dielectric layers 12 having a thickness t2 of less than 3 micrometers, such as between 0.3 and 3 µm, are located over the semiconductor substrate 2 and interposed respectively between the neighboring patterned metal layers 8, and the neighboring patterned metal layers 8 are interconnected through the metal plugs 10 inside the dielectric layer 12. The dielectric layer 12 is commonly formed by a chemical vapor deposition (CVD) process. The material of the dielectric layer 12 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, oxygen and silicon, SOG (Spin-On Glass), BPSG (borophosphosilicate glass), a polyarylene ether, PBO (Polybenzoxazole), or a material having a low dielectric constant (K) of between 1.5 and 3, for example.

A passivation layer 14 is formed over the circuit structure 6 and over the dielectric layers 12. The passivation layer 14 can protect the semiconductor devices 4 and the circuit structure 6 from being damaged by moisture and foreign ion contamination. In other words, mobile ions (such as sodium ion), transition metals (such as gold, silver and copper) and impurities can be prevented from penetrating through the passivation layer 14 to the semiconductor devices 4, such as transistors, polysilicon resistor elements and polysilicon-polysilicon capacitor elements, and to the circuit structure 6.

The passivation layer 14 is commonly made of silicon oxide (such as $SiO_2$), silicon oxynitride, silicon nitride (such as $Si_3N_4$), or PSG (phosphosilicate glass). The passivation layer 14 commonly has a thickness t3 of more than 0.3 µm, such as between 0.3 and 1.5 µm. In a preferred case, the silicon nitride layer in the passivation layer 14 has a thickness of more than 0.3 µm. Ten methods for depositing the passivation layer 14 are described as below.

In a first method, the passivation layer 14 is formed by depositing a silicon oxide layer with a thickness of between 0.2 and 1.2 µm using a CVD method and then depositing a silicon nitride layer with a thickness of 0.2 and 1.2 µm on the silicon oxide layer using a CVD method.

In a second method, the passivation layer 14 is formed by depositing a silicon oxide layer with a thickness of between 0.2 and 1.2 µm using a CVD method, next depositing a silicon oxynitride layer with a thickness of between 0.05 and 0.15 µm on the silicon oxide layer using a Plasma Enhanced CVD (PECVD) method, and then depositing a silicon nitride layer with a thickness of between 0.2 and 1.2 µm on the silicon oxynitride layer using a CVD method.

In a third method, the passivation layer 14 is formed by depositing a silicon oxynitride layer with a thickness of between 0.05 and 0.15 µm using a CVD method, next depositing a silicon oxide layer with a thickness of between 0.2 and 1.2 µm on the silicon oxynitride layer using a CVD method, and then depositing a silicon nitride layer with a thickness of between 0.2 and 1.2 µm on the silicon oxide layer using a CVD method.

In a fourth method, the passivation layer 14 is formed by depositing a first silicon oxide layer with a thickness of between 0.2 and 0.5 µm using a CVD method, next depositing a second silicon oxide layer with a thickness of between 0.5 and 1 µm on the first silicon oxide layer using a spin-coating method, next depositing a third silicon oxide layer with a thickness of between 0.2 and 0.5 µm on the second silicon oxide layer using a CVD method, and then depositing a silicon nitride layer with a thickness of 0.2 and 1.2 µm on the third silicon oxide using a CVD method.

In a fifth method, the passivation layer 14 is formed by depositing a silicon oxide layer with a thickness of between 0.5 and 2 µm using a High Density Plasma CVD (HDP-CVD) method and then depositing a silicon nitride layer with a thickness of 0.2 and 1.2 µm on the silicon oxide layer using a CVD method.

In a sixth method, the passivation layer 14 is formed by depositing an Undoped Silicate Glass (USG) layer with a thickness of between 0.2 and 3 µm, next depositing an insulating layer of TEOS, PSG or BPSG (borophosphosilicate glass) with a thickness of between 0.5 and 3 µm on the USG layer, and then depositing a silicon nitride layer with a thickness of 0.2 and 1.2 µm on the insulating layer using a CVD method.

In a seventh method, the passivation layer 14 is formed by optionally depositing a first silicon oxynitride layer with a thickness of between 0.05 and 0.15 µm using a CVD method, next depositing a silicon oxide layer with a thickness of between 0.2 and 1.2 µm on the first silicon oxynitride layer using a CVD method, next optionally depositing a second silicon oxynitride layer with a thickness of between 0.05 and 0.15 µm on the silicon oxide layer using a CVD method, next depositing a silicon nitride layer with a thickness of between 0.2 and 1.2 µm on the second silicon oxynitride layer or on the silicon oxide using a CVD method, next optionally depositing a third silicon oxynitride layer with a thickness of between 0.05 and 0.15 µm on the silicon nitride layer using a CVD method, and then depositing a silicon oxide layer with a thickness of between 0.2 and 1.2 µm on the third silicon oxynitride layer or on the silicon nitride layer using a CVD method.

In a eighth method, the passivation layer 14 is formed by depositing a first silicon oxide layer with a thickness of between 0.2 and 1.2 µm using a CVD method, next depositing a second silicon oxide layer with a thickness of between 0.5 and 1 µm on the first silicon oxide layer using a spin-coating method, next depositing a third silicon oxide layer with a thickness of between 0.2 and 1.2 µm on the second silicon oxide layer using a CVD method, next depositing a silicon nitride layer with a thickness of between 0.2 and 1.2 µm on the third silicon oxide layer using a CVD method, and then depositing a fourth silicon oxide layer with a thickness of between 0.2 and 1.2 µm on the silicon nitride layer using a CVD method.

In a ninth method, the passivation layer 14 is formed by depositing a first silicon oxide layer with a thickness of between 0.5 and 2 µm using a HDP-CVD method, next depositing a silicon nitride layer with a thickness of between 0.2 and 1.2 µm on the first silicon oxide layer using a CVD method, and then depositing a second silicon oxide layer with a thickness of between 0.5 and 2 µm on the silicon nitride using a HDP-CVD method.

In a tenth method, the passivation layer 14 is formed by depositing a first silicon nitride layer with a thickness of between 0.2 and 1.2 µm using a CVD method, next depositing a silicon oxide layer with a thickness of between 0.2 and 1.2 µm on the first silicon nitride layer using a CVD method, and then depositing a second silicon nitride layer with a thickness of between 0.2 and 1.2 µm on the silicon oxide layer using a CVD method.

An opening 14a in the passivation layer 14 exposes a pad 16 of the circuit structure 6 used to input or output signals or to be connected to a power source or a ground reference. The pad 16 may have a thickness t4 of between 0.4 and 3 µm or between 0.2 and 2 µm. For example, the pad 16 may be composed of a sputtered aluminum layer or a sputtered aluminum-copper-alloy layer with a thickness of between 0.2 and 2 µm. Alternatively, the pad 16 may include an electroplated copper layer with a thickness of between 0.2 and 2 µm, and a barrier layer, such as tantalum or tantalum nitride, on a bottom surface and side walls of the electroplated copper layer.

Therefore, the pad 16 can be an aluminum pad, principally made of sputtered aluminum with a thickness of between 0.2 and 2 µm. Alternatively, the pad 16 can be a copper pad, principally made of electroplated copper with a thickness of between 0.2 and 2 µm.

The opening 14a may have a transverse dimension d, from a top view, of between 0.5 and 20 µm or between 20 and 200 µm. The shape of the opening 14a from a top view may be a circle, and the diameter of the circle-shaped opening 14a may be between 0.5 and 20 µm or between 20 and 200 µm. Alternatively, the shape of the opening 14a from a top view may be a square, and the width of the square-shaped opening 14a may be between 0.5 and 20 µm or between 20 and 200 µm. Alternatively, the shape of the opening 14a from a top view may be a polygon, such as hexagon or octagon, and the polygon-shaped opening 14a may have a width of between 0.5 and 20 µm or between 20 and 200 µm. Alternatively, the shape of the opening 14a from a top view may be a rectangle, and the rectangle-shaped opening 14a may have a shorter width of between 0.5 and 20 µm or between 20 and 200 µm. Further, there may be some of the semiconductor devices 4 under the pad 16 exposed by the opening 14a. Alternatively, there may be no active devices under the pad 16 exposed by the opening 14a.

Referring to FIG. 1B, a metal cap 18 having a thickness of between 0.4 and 5 µm can be optionally formed on the pad 16 exposed by the opening 14a in the passivation layer 14 to prevent the pad 16 from being oxidized or contaminated. The material of the metal cap 18 may include aluminum, an aluminum-copper alloy, an Al—Si—Cu alloy or gold. For example, when the pad 16 is a copper pad, the metal cap 18 including aluminum is used to protect the copper pad 16 from being oxidized. The metal cap 18 may comprise a barrier layer having a thickness of between 0.01 and 0.5 µm on the pad 16. The barrier layer may be made of titanium, titanium nitride, titanium-tungsten alloy, tantalum, tantalum nitride, chromium or nickel.

For example, the metal cap 18 may include a tantalum-containing layer, such as tantalum layer or tantalum-nitride layer, having a thickness of between 0.01 and 0.5 µm on the pad 16, principally made of electroplated copper, exposed by the opening 14a, and an aluminum-containing layer, such as aluminum layer or aluminum-alloy layer, having a thickness of between 0.4 and 3 µm on the tantalum-containing layer. Alternatively, the metal cap 18 may include a titanium-containing layer, such as titanium layer or titanium-tungsten-alloy layer, having a thickness of between 0.01 and 0.7 µm, and preferably of between 0.03 and 0.35 µm, on the pad 16, principally made of electroplated copper, exposed by the opening 14a, a sputtered gold layer having a thickness of between 0.03 and 1 µm, and preferably of between 0.05 and 0.2 µm, on the titanium-containing layer, and an electroplated gold layer having a thickness of between 1 and 5 µm on the sputtered gold layer. Alternatively, the metal cap 18 may be a gold layer having a thickness of between 0.4 and 5 µm on the pad 16, principally made of electroplated copper, exposed by the opening 14a. Alternatively, the metal cap 18 may include a nickel layer having a thickness of between 0.3 and 2 µm on the pad 16, principally made of electroplated copper, exposed by the opening 14a, and a gold layer having a thickness of between 0.4 and 3 µm on the nickel layer.

The semiconductor substrate 2, the circuit structure 6, the dielectric layer 12, the passivation layer 14 and the pad 16 are described in the above paragraphs. Below, the scheme 20 between the semiconductor substrate 2 and the passivation layer 14 may be any one of the structures shown in FIGS. 1A and 1B between the semiconductor substrate 2 and the passivation layer 14; the scheme 20 represents the combination of the semiconductor devices 4, the circuit structure 6 (including the metal layers 8 and the metal plugs 10) and the dielectric layers 12 in FIG. 1A and FIG. 1B.

Referring to FIG. 2A, a metal bump 22 having a thickness of between 5 and 150 µm, and preferably of between 20 and 50 µm, can be form on the pad 16, such as aluminum pad or copper pad, exposed by the opening 14a in the passivation layer 14 shown in FIG. 1A.

Referring to FIGS. 2B and 2C, a metal bump 22 having a thickness of between 5 and 150 µm, and preferably of between 20 and 50 µm, can be formed on the metal cap 18 shown in FIG. 1B, wherein the metal cap 18 is formed on the pad 16, such as copper pad, exposed by the opening 14a in the passivation layer 14. In FIG. 2B, the metal bump 22 may cover the entire top surface of the metal cap 18 and a sidewall of the metal cap 18. Alternatively, in FIG. 2C, the metal bump 22 may uncover a peripheral region of the top surface of the metal cap 18 close to an edge of the metal cap 18 and a sidewall of the metal cap 18.

A method for forming the metal bump 22 is described as below. The following method is an example to form the metal bump 22 on the pad 16 shown in FIG. 2A. Alternatively, the following method can be applied to forming the metal bump 22 on the metal cap 18, as shown in FIGS. 2B and 2C.

Referring to FIG. 2A-a, an adhesion/barrier layer 102 having a thickness of between 0.01 and 0.7 µm, and preferably of between 0.03 and 0.35 µm, can be sputtered on the passivation layer 14 and on the pad 16, such as aluminum pad or copper pad, exposed by opening 14a. The material of the adhesion/barrier layer 102 may include titanium, a titanium-tungsten alloy, titanium nitride, chromium, tantalum nitride, or a composite of the abovementioned materials. Alternatively, the adhesion/barrier layer 102 can be formed by an evaporation process.

For example, the adhesion/barrier layer 102 may be formed by sputtering a titanium layer with a thickness of between 0.01 and 0.7 μm, and preferably of between 0.03 and 0.35 μm, on the passivation layer 14 and on the pad 16, principally made of aluminum, exposed by opening 14a. Alternatively, the adhesion/barrier layer 102 may be formed by sputtering a titanium-tungsten-alloy layer with a thickness of between 0.01 and 0.7 μm, and preferably of between 0.03 and 0.35 μm, on the passivation layer 14 and on the pad 16, principally made of aluminum, exposed by opening 14a. Alternatively, the adhesion/barrier layer 102 may be formed by sputtering a titanium-nitride layer with a thickness of between 0.01 and 0.7 μm, and preferably of between 0.03 and 0.35 μm, on the passivation layer 14 and on the pad 16, principally made of aluminum, exposed by opening 14a. Alternatively, the adhesion/barrier layer 102 may be formed by sputtering a chromium layer with a thickness of between 0.01 and 0.7 μm, and preferably of between 0.03 and 0.35 μm, on the passivation layer 14 and on the pad 16, principally made of aluminum, exposed by opening 14a. Alternatively, the adhesion/barrier layer 102 may be formed by sputtering a tantalum-nitride layer with a thickness of between 0.01 and 0.7 μm, and preferably of between 0.03 and 0.35 μm, on the passivation layer 14 and on the pad 16, principally made of aluminum, exposed by opening 14a.

Referring to FIG. 2A-b, a seed layer 104 having a thickness of between 0.03 and 1 μm, and preferably of between 0.05 and 0.5 μm, can be sputtered on the adhesion/barrier layer 102. Alternatively, the seed layer 104 can be formed by a vapor deposition method, an electroless plating method or a PVD (Physical Vapor Deposition) method. The seed layer 104 is beneficial to electroplating a metal layer thereon. Thus, the material of the seed layer 104 varies with the material of the electroplated metal layer formed on the seed layer 104. When a gold layer is to be electroplated on the seed layer 104, gold is a preferable material to the seed layer 104. When a copper layer is to be electroplated on the seed layer 104, copper is a preferable material to the seed layer 104. When a silver layer is to be electroplated on the seed layer 104, silver is a preferable material to the seed layer 104.

For example, when the adhesion/barrier layer 102 is formed by sputtering a titanium layer with a thickness of between 0.01 and 0.7 μm, and preferably of between 0.03 and 0.35 μm, the seed layer 104 can be formed by sputtering a gold layer with a thickness of between 0.03 and 1 μm, and preferably of between 0.05 and 0.5 μm, on the titanium layer. When the adhesion/barrier layer 102 is formed by sputtering a titanium-tungsten-alloy layer with a thickness of between 0.01 and 0.7 μm, and preferably of between 0.03 and 0.35 μm, the seed layer 104 can be formed by sputtering a gold layer with a thickness of between 0.03 and 1 μm, and preferably of between 0.05 and 0.5 μm, on the titanium-tungsten-alloy layer. When the adhesion/barrier layer 102 is formed by sputtering a titanium-nitride layer with a thickness of between 0.01 and 0.7 μm, and preferably of between 0.03 and 0.35 μm, the seed layer 104 can be formed by sputtering a gold layer with a thickness of between 0.03 and 1 μm, and preferably of between 0.05 and 0.5 μm, on the titanium-nitride layer. When the adhesion/barrier layer 102 is formed by sputtering a chromium layer with a thickness of between 0.01 and 0.7 μm, and preferably of between 0.03 and 0.35 μm, the seed layer 104 can be formed by sputtering a gold layer with a thickness of between 0.03 and 1 μm, and preferably of between 0.05 and 0.5 μm, on the chromium layer. When the adhesion/barrier layer 102 is formed by sputtering a tantalum-nitride layer with a thickness of between 0.01 and 0.7 μm, and preferably of between 0.03 and 0.35 μm, the seed layer 104 can be formed by sputtering a gold layer with a thickness of between 0.03 and 1 μm, and preferably of between 0.05 and 0.5 μm, on the tantalum-nitride layer.

For example, when the adhesion/barrier layer 102 is formed by sputtering a titanium layer with a thickness of between 0.01 and 0.7 μm, and preferably of between 0.03 and 0.35 μm, the seed layer 104 can be formed by sputtering a copper layer with a thickness of between 0.03 and 1 μm, and preferably of between 0.05 and 0.5 μm, on the titanium layer. When the adhesion/barrier layer 102 is formed by sputtering a titanium-tungsten-alloy layer with a thickness of between 0.01 and 0.7 μm, and preferably of between 0.03 and 0.35 μm, the seed layer 104 can be formed by sputtering a copper layer with a thickness of between 0.03 and 1 μm, and preferably of between 0.05 and 0.5 μm, on the titanium-tungsten-alloy layer. When the adhesion/barrier layer 102 is formed by sputtering a titanium-nitride layer with a thickness of between 0.01 and 0.7 μm, and preferably of between 0.03 and 0.35 μm, the seed layer 104 can be formed by sputtering a copper layer with a thickness of between 0.03 and 1 μm, and preferably of between 0.05 and 0.5 μm, on the titanium-nitride layer. When the adhesion/barrier layer 102 is formed by sputtering a chromium layer with a thickness of between 0.01 and 0.7 μm, and preferably of between 0.03 and 0.35 μm, the seed layer 104 can be formed by sputtering a copper layer with a thickness of between 0.03 and 1 μm, and preferably of between 0.05 and 0.5 μm, on the chromium layer. When the adhesion/barrier layer 102 is formed by sputtering a tantalum-nitride layer with a thickness of between 0.01 and 0.7 μm, and preferably of between 0.03 and 0.35 μm, the seed layer 104 can be formed by sputtering a copper layer with a thickness of between 0.03 and 1 μm, and preferably of between 0.05 and 0.5 μm, on the tantalum-nitride layer.

For example, when the adhesion/barrier layer 102 is formed by sputtering a titanium layer with a thickness of between 0.01 and 0.7 μm, and preferably of between 0.03 and 0.35 μm, the seed layer 104 can be formed by sputtering a silver layer with a thickness of between 0.03 and 1 μm, and preferably of between 0.05 and 0.5 μm, on the titanium layer. When the adhesion/barrier layer 102 is formed by sputtering a titanium-tungsten-alloy layer with a thickness of between 0.01 and 0.7 μm, and preferably of between 0.03 and 0.35 μm, the seed layer 104 can be formed by sputtering a silver layer with a thickness of between 0.03 and 1 μm, and preferably of between 0.05 and 0.5 μm, on the titanium-tungsten-alloy layer. When the adhesion/barrier layer 102 is formed by sputtering a titanium-nitride layer with a thickness of between 0.01 and 0.7 μm, and preferably of between 0.03 and 0.35 μm, the seed layer 104 can be formed by sputtering a silver layer with a thickness of between 0.03 and 1 μm, and preferably of between 0.05 and 0.5 μm, on the titanium-nitride layer. When the adhesion/barrier layer 102 is formed by sputtering a chromium layer with a thickness of between 0.01 and 0.7 μm, and preferably of between 0.03 and 0.35 μm, the seed layer 104 can be formed by sputtering a silver layer with a thickness of between 0.03 and 1 μm, and preferably of between 0.05 and 0.5 μm, on the chromium layer. When the adhesion/barrier layer 102 is formed by sputtering a tantalum-nitride layer with a thickness of between 0.01 and 0.7 μm, and preferably of between 0.03 and 0.35 μm, the seed layer 104 can be formed by sputtering a silver layer with a thickness of between 0.03 and 1 μm, and preferably of between 0.05 and 0.5 μm, on the tantalum-nitride layer.

Referring to FIG. 2A-c, a photoresist layer 106, such as positive-type photoresist layer, having a thickness of between 5 and 150 µm, and preferably of between 20 and 50 µm, is spin-on coated on the seed layer 104. Referring to FIG. 2A-d, the photoresist layer 106 is patterned with the processes of exposure, development, etc., to form an opening 106a in the photoresist layer 106 exposing the seed layer 104 over the pad 16. A 1× stepper or 1× contact aligner can be used to expose the photoresist layer 106 during the process of exposure.

For example, the photoresist layer 106 can be formed by spin-on coating a positive-type photosensitive polymer layer having a thickness of between 5 and 150 µm, and preferably of between 20 and 50 µm, on the seed layer 104, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 104 with an $O_2$ plasma or a plasma containing fluorine of below 200 PPM and oxygen, such that the photoresist layer 106 can be patterned with an opening 106a in the photoresist layer 106 exposing the seed layer 104 over the pad 16.

Referring to FIG. 2A-e, a metal layer 108 having a thickness of between 5 and 150 µm, and preferably of between 20 and 50 µm, is electroplated on the seed layer 104 exposed by the opening 106a. The material of the metal layer 108 may include gold, copper, silver or nickel.

For example, the metal layer 108 may be formed by electroplating a gold layer with a thickness of between 5 and 150 µm, and preferably of between 20 and 50 µm, on the seed layer 104, made of gold, exposed by the opening 106a. Alternatively, the metal layer 108 may be formed by electroplating a copper layer with a thickness of between 5 and 150 µm, and preferably of between 20 and 50 µm, on the seed layer 104, made of copper, exposed by the opening 106a. Alternatively, the metal layer 108 may be formed by electroplating a silver layer with a thickness of between 5 and 150 µm, and preferably of between 20 and 50 µm, on the seed layer 104, made of silver, exposed by the opening 106a. Alternatively, the metal layer 108 may be formed by electroplating a copper layer with a thickness of between 5 and 150 µm, and preferably of between 20 and 50 µm, on the seed layer 104, made of copper, exposed by the opening 106a, and then electroplating a nickel layer with a thickness of between 1 and 10 µm on the copper layer in the opening 106a, wherein the thickness of the copper layer plus the nickel layer is between 5 and 150 µm, and preferably of between 20 and 50 µm. Alternatively, the metal layer 108 may be formed by electroplating a copper layer with a thickness of between 5 and 150 µm, and preferably of between 20 and 50 µm, on the seed layer 104, made of copper, exposed by the opening 106a, then electroplating a nickel layer with a thickness of between 1 and 10 µm on the copper layer in the opening 106a, and then electroplating a gold layer with a thickness of between 1 and 10 µm on the nickel layer in the opening 106a, wherein the thickness of the copper layer, the nickel layer and the gold layer is between 5 and 150 µm, and preferably of between 20 and 50 µm.

Referring to FIG. 2A-f, after the metal layer 108 is formed, most of the photoresist layer 106 can be removed using an organic solution with amide. However, some residuals from the photoresist layer 106 could remain on the metal layer 108 and on the seed layer 104. Thereafter, the residuals can be removed from the metal layer 108 and from the seed layer 104 with a plasma, such as $O_2$ plasma or plasma containing fluorine of below 200 PPM and oxygen.

Referring to FIG. 2A-g, the seed layer 104 and the adhesion/barrier layer 102 not under the metal layer 108 are subsequently removed with a dry etching method or a wet etching method. As to the wet etching method, when the adhesion/barrier layer 102 is a titanium-tungsten-alloy layer, it can be etched with a solution containing hydrogen peroxide; when the adhesion/barrier layer 102 is a titanium layer, it can be etched with a solution containing hydrogen fluoride; when the seed layer 104 is a gold layer, it can be etched with an iodine-containing solution, such as solution containing potassium iodide; when the seed layer 104 is a copper layer, it can be etched with a solution containing $NH_4OH$. As to the dry etching method, when the adhesion/barrier layer 102 is a titanium layer or a titanium-tungsten-alloy layer, it can be etched with a chlorine-containing plasma etching process or with an RIE process; when the seed layer 104 is a gold layer, it can be removed with an ion milling process or with an Ar sputtering etching process. Generally, the dry etching method to etch the seed layer 104 and the adhesion/barrier layer 102 not under the metal layer 108 may include a chemical plasma etching process, a sputtering etching process, such as argon sputter process, or a chemical vapor etching process.

Thereby, in the present invention, the metal bump 22 can be formed on the pad 16 exposed by the opening 14a. The metal bump 22 can be formed of the adhesion/barrier layer 102, the seed layer 104 on the adhesion/barrier layer 102 and the electroplated metal layer 108 on the seed layer 104. The material of metal bump 22 may comprise titanium, titanium-tungsten alloy, titanium nitride, chromium, tantalum nitride, gold, copper, silver or nickel. Based on the above teaching, the metal bump 22 may include the following fashions.

For example, the metal bump 22 may be formed of a titanium-containing layer, such as titanium layer, titanium-tungsten-alloy layer or titanium-nitride layer, having a thickness of between 0.01 and 0.7 µm, and preferably of between 0.03 and 0.35 µm, on the pad 16, principally made of copper, typically called a copper pad, exposed by the opening 14a, a sputtered seed layer, made of gold, having a thickness of between 0.03 and 1 µm, and preferably of between 0.05 and 0.5 µm, on the titanium-containing layer, and an electroplated gold layer having a thickness of between 5 and 150 µm, and preferably of between 20 and 50 µm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 µm, and preferably of between 0.03 and 0.35 µm, on the pad 16, principally made of copper, typically called a copper pad, exposed by the opening 14a, a sputtered seed layer, made of copper, having a thickness of between 0.03 and 1 µm, and preferably of between 0.05 and 0.5 µm, on the titanium-containing layer, and an electroplated copper layer having a thickness of between 5 and 150 µm, and preferably of between 20 and 50 µm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 µm, and preferably of between 0.03 and 0.35 µm, on the pad 16, principally made of copper, typically called a copper pad, exposed by the opening 14a, a sputtered seed layer, made of silver, having a thickness of between 0.03 and 1 µm, and preferably of between 0.05 and 0.5 µm, on the titanium-containing layer, and an electroplated silver layer having a thickness of between 5 and 150 µm, and preferably of between 20 and 50 µm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 μm, and preferably of between 0.03 and 0.35 μm, on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the titanium-containing layer, an electroplated copper layer having a thickness of between 5 and 150 μm, and preferably of between 20 and 50 μm, on the sputtered seed layer, and an electroplated nickel layer having a thickness of between 1 and 10 μm on the electroplated copper layer, wherein the thickness of the electroplated copper layer plus the electroplated nickel layer is between 5 and 150 μm, and preferably of between 20 and 50 μm. Alternatively, the metal bump 22 may be formed of a titanium-containing layer, such as titanium layer, titanium-tungsten-alloy layer or titanium-nitride layer, having a thickness of between 0.01 and 0.7 μm, and preferably of between 0.03 and 0.35 μm, on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the titanium-containing layer, an electroplated copper layer having a thickness of between 5 and 150 μm, and preferably of between 20 and 50 μm, on the sputtered seed layer, an electroplated nickel layer having a thickness of between 1 and 10 μm on the electroplated copper layer, and an electroplated gold layer having a thickness of between 1 and 10 μm on the electroplated nickel layer, wherein the thickness of the electroplated copper layer, the electroplated nickel layer and the electroplated gold layer is between 5 and 150 μm, and preferably of between 20 and 50 μm.

For example, the metal bump 22 may be formed of a tantalum-nitride layer having a thickness of between 0.01 and 0.7 μm, and preferably of between 0.03 and 0.35 μm, on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the tantalum-nitride layer, and an electroplated copper layer having a thickness of between 5 and 150 μm, and preferably of between 20 and 50 μm, on the sputtered seed layer. Alternatively, the metal bump 22 may be formed of a tantalum-nitride layer having a thickness of between 0.01 and 0.7 μm, and preferably of between 0.03 and 0.35 μm, on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the tantalum-nitride layer, an electroplated copper layer having a thickness of between 5 and 150 μm, and preferably of between 20 and 50 μm, on the sputtered seed layer, and an electroplated nickel layer having a thickness of between 1 and 10 μm on the electroplated copper layer, wherein the thickness of the electroplated copper layer plus the electroplated nickel layer is between 5 and 150 μm, and preferably of between 20 and 50 μm. Alternatively, the metal bump 22 may be formed of a tantalum-nitride layer having a thickness of between 0.01 and 0.7 μm, and preferably of between 0.03 and 0.35 μm, on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the tantalum-nitride layer, an electroplated copper layer having a thickness of between 5 and 150 μm, and preferably of between 20 and 50 μm, on the sputtered seed layer, an electroplated nickel layer having a thickness of between 1 and 10 μm on the electroplated copper layer, and an electroplated gold layer having a thickness of between 1 and 10 μm on the electroplated nickel layer, wherein the thickness of the electroplated copper layer, the electroplated nickel layer and the electroplated gold layer is between 5 and 150 μm, and preferably of between 20 and 50 μm.

For example, the metal bump 22 may be formed of a chromium layer having a thickness of between 0.01 and 0.7 μm, and preferably of between 0.03 and 0.35 μm, on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the chromium layer, and an electroplated copper layer having a thickness of between 5 and 150 μm, and preferably of between 20 and 50 μm, on the sputtered seed layer. Alternatively, the metal bump 22 may be formed of a chromium layer having a thickness of between 0.01 and 0.7 μm, and preferably of between 0.03 and 0.35 μm, on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the chromium layer, an electroplated copper layer having a thickness of between 5 and 150 μm, and preferably of between 20 and 50 μm, on the sputtered seed layer, and an electroplated nickel layer having a thickness of between 1 and 10 μm on the electroplated copper layer, wherein the thickness of the electroplated copper layer plus the electroplated nickel layer is between 5 and 150 μm, and preferably of between 20 and 50 μm. Alternatively, the metal bump 22 may be formed of a chromium layer having a thickness of between 0.01 and 0.7 μm, and preferably of between 0.03 and 0.35 μm, on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the chromium layer, an electroplated copper layer having a thickness of between 5 and 150 μm, and preferably of between 20 and 50 μm, on the sputtered seed layer, an electroplated nickel layer having a thickness of between 1 and 10 μm on the electroplated copper layer, and an electroplated gold layer having a thickness of between 1 and 10 μm on the electroplated nickel layer, wherein the thickness of the electroplated copper layer, the electroplated nickel layer and the electroplated gold layer is between 5 and 150 μm, and preferably of between 20 and 50 μm.

For example, the metal bump 22 may be formed of a titanium-containing layer, such as titanium layer, titanium-tungsten-alloy layer or titanium-nitride layer, having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of gold, having a thickness of between 0.03 and 1 μm, and preferably of between 0.05 and 0.5 μm, on the titanium-containing layer, and an electroplated gold layer having a thickness of between 5 and 150 μm, and preferably of between 20 and 50 μm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the titanium-containing layer, and an electroplated copper layer having a thickness of between 5 and 150 μm, and preferably of between 20 and 50 μm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of silver, having a thickness of between 0.03 and 1 μm, and preferably of between 0.05 and 0.5 μm, on the titanium-containing layer, and an electroplated silver layer having a thickness of between 5 and 150 μm, and preferably of between 20 and 50 μm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the titanium-containing layer, an electroplated copper layer having a thickness of between 5 and 150 μm, and preferably of between 20 and 50 μm, on the sputtered seed layer, and an electroplated nickel layer having a thickness of between 1 and 10 μm on the electroplated copper layer, wherein the thickness of the electroplated copper layer plus the electroplated nickel layer is between 5 and 150 μm, and preferably of between 20 and 50 μm. Alternatively, the metal bump 22 may be formed of a titanium-containing layer, such as titanium layer, titanium-tungsten-alloy layer or titanium-nitride layer, having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the titanium-containing layer, an electroplated copper layer having a thickness of between 5 and 150 μm, and preferably of between 20 and 50 μm, on the sputtered seed layer, an electroplated nickel layer having a thickness of between 1 and 10 μm on the electroplated copper layer, and an electroplated gold layer having a thickness of between 1 and 10 μm on the electroplated nickel layer, wherein the thickness of the electroplated copper layer, the electroplated nickel layer and the electroplated gold layer is between 5 and 150 μm, and preferably of between 20 and 50 μm.

For example, the metal bump 22 may be formed of a tantalum-nitride layer having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the tantalum-nitride layer, and an electroplated copper layer having a thickness of between 5 and 150 μm, and preferably of between 20 and 50 μm, on the sputtered seed layer. Alternatively, the metal bump 22 may be formed of a tantalum-nitride layer having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the tantalum-nitride layer, an electroplated copper layer having a thickness of between 5 and 150 μm, and preferably of between 20 and 50 μm, on the sputtered seed layer, and an electroplated nickel layer having a thickness of between 1 and 10 μm, and preferably of between 20 and 50 μm, on the electroplated copper layer, wherein the thickness of the electroplated copper layer plus the electroplated nickel layer is between 5 and 150 μm, and preferably of between 20 and 50 μm. Alternatively, the metal bump 22 may be formed of a tantalum-nitride layer having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the tantalum-nitride layer, an electroplated copper layer having a thickness of between 5 and 150 μm, and preferably of between 20 and 50 μm, on the sputtered seed layer, an electroplated nickel layer having a thickness of between 1 and 10 μm on the electroplated copper layer, and an electroplated gold layer having a thickness of between 1 and 10 μm on the electroplated nickel layer, wherein the thickness of the electroplated copper layer, the electroplated nickel layer and the electroplated gold layer is between 5 and 150 μm, and preferably of between 20 and 50 μm.

For example, the metal bump 22 may be formed of a chromium layer having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the chromium layer, and an electroplated copper layer having a thickness of between 5 and 150 μm, and preferably of between 20 and 50 μm, on the sputtered seed layer. Alternatively, the metal bump 22 may be formed of a chromium layer having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the chromium layer, an electroplated copper layer having a thickness of between 5 and 150 μm, and preferably of between 20 and 50 μm, on the sputtered seed layer, and an electroplated nickel layer having a thickness of between 1 and 10 μm on the electroplated copper layer, wherein the thickness of the electroplated copper layer plus the electroplated nickel layer is between 5 and 150 μm, and preferably of between 20 and 50 μm. Alternatively, the metal bump 22 may be formed of a chromium layer having a thickness of between 0.01 and 0.7 μm, and preferably of between 0.03 and 0.35 μm, on the pad 16, principally made of aluminum, typically called an aluminum pad, exposed by the opening 14a, a sputtered seed layer, made of copper, having a thickness of between 0.03 and 1 μm, and preferably of between 0.05 and 0.5 μm, on the chromium layer, an electroplated copper layer having a thickness of between 5 and 150 μm, and preferably of between 20 and 50 μm, on the sputtered seed layer, an electroplated nickel layer having a thickness of between 1 and 10 μm on the electroplated copper layer, and an electroplated gold layer having a thickness of between 1 and 10 μm on the electroplated nickel layer, wherein the thickness of the electroplated copper layer, the electroplated nickel layer and the electroplated gold layer is between 5 and 150 μm, and preferably of between 20 and 50 μm.

For example, the metal bump 22 may be formed of a titanium-containing layer, such as titanium layer, titanium-tungsten-alloy layer or titanium-nitride layer, having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of gold, having a thickness of between 0.03 and 1 µm, and preferably of between 0.05 and 0.5 µm, on the titanium-containing layer, and an electroplated gold layer having a thickness of between 5 and 150 µm, and preferably of between 20 and 50 µm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 µm, and preferably of between 0.05 and 0.5 µm, on the titanium-containing layer, and an electroplated copper layer having a thickness of between 5 and 150 µm, and preferably of between 20 and 50 µm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of silver, having a thickness of between 0.03 and 1 µm, and preferably of between 0.05 and 0.5 µm, on the titanium-containing layer, and an electroplated silver layer having a thickness of between 5 and 150 µm, and preferably of between 20 and 50 µm, on the sputtered seed layer. Alternatively, the metal bump 22 may be formed of a titanium-containing layer, such as titanium layer, titanium-tungsten-alloy layer or titanium-nitride layer, having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 µm, and preferably of between 0.05 and 0.5 µm, on the titanium-containing layer, an electroplated copper layer having a thickness of between 5 and 150 µm, and preferably of between 20 and 50 µm, on the sputtered seed layer, and an electroplated nickel layer having a thickness of between 1 and 10 µm on the electroplated copper layer, wherein the thickness of the electroplated copper layer plus the electroplated nickel layer is between 5 and 150 µm, and preferably of between 20 and 50 µm. Alternatively, the metal bump 22 may be formed of a titanium-containing layer, such as titanium layer, titanium-tungsten-alloy layer or titanium-nitride layer, having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 µm, and preferably of between 0.05 and 0.5 µm, on the titanium-containing layer, an electroplated copper layer having a thickness of between 5 and 150 µm, and preferably of between 20 and 50 µm, on the sputtered seed layer, an electroplated nickel layer having a thickness of between 1 and 10 µm on the electroplated copper layer, and an electroplated gold layer having a thickness of between 1 and 10 µm on the electroplated nickel layer, wherein the thickness of the electroplated copper layer, the electroplated nickel layer and the electroplated gold layer is between 5 and 150 µm, and preferably of between 20 and 50 µm.

For example, the metal bump 22 may be formed of a tantalum-nitride layer having a thickness of between 0.01 and 0.7 microns, and preferably of between 0.03 and 0.35 microns, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 microns, and preferably of between 0.05 and 0.5 microns, on the tantalum-nitride layer, and an electroplated copper layer having a thickness of between 5 and 150 µm, and preferably of between 20 and 50 µm, on the sputtered seed layer. Alternatively, the metal bump 22 may be formed of a tantalum-nitride layer having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 µm, and preferably of between 0.05 and 0.5 µm, on the tantalum-nitride layer, an electroplated copper layer having a thickness of between 5 and 150 µm, and preferably of between 20 and 50 µm, on the sputtered seed layer, and an electroplated nickel layer having a thickness of between 1 and 10 µm on the electroplated copper layer, wherein the thickness of the electroplated copper layer plus the electroplated nickel layer is between 5 and 150 µm, and preferably of between 20 and 50 µm. Alternatively, the metal bump 22 may be formed of a tantalum-nitride layer having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 µm, and preferably of between 0.05 and 0.5 µm, on the tantalum-nitride layer, an electroplated copper layer having a thickness of between 5 and 150 µm, and preferably of between 20 and 50 µm, on the sputtered seed layer, an electroplated nickel layer having a thickness of between 1 and 10 µm on the electroplated copper layer, and an electroplated gold layer having a thickness of between 1 and 10 µm on the electroplated nickel layer, wherein the thickness of the electroplated copper layer, the electroplated nickel layer and the electroplated gold layer is between 5 and 150 µm, and preferably of between 20 and 50 µm.

For example, the metal bump 22 may be formed of a chromium layer having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 µm, and preferably of between 0.05 and 0.5 µm, on the chromium layer, and an electroplated copper layer having a thickness of between 5 and 150 µm, and preferably of between 20 and 50 µm, on the sputtered seed layer. Alternatively, the metal bump 22 may be formed of a chromium layer having a thickness of between 0.01 and 0.7 µm, and preferably of between 0.03 and 0.35 µm, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the chromium layer, an electroplated copper layer having a thickness of between 5 and 150 μm, and preferably of between 20 and 50 μm, on the sputtered seed layer, and an electroplated nickel layer having a thickness of between 1 and 10 μm on the electroplated copper layer, wherein the thickness of the electroplated copper layer plus the electroplated nickel layer is between 5 and 150 μm, and preferably of between 20 and 50 μm. Alternatively, the metal bump 22 may be formed of a chromium layer having a thickness of between 0.01 and 0.7 μm, and preferably of between 0.03 and 0.35 μm, on the aluminum-containing layer (such as aluminum or aluminum-alloy) of the metal cap 18 on the pad 16, principally made of copper, typically called a copper pad, exposed by the opening 14a, a sputtered seed layer, made of copper, having a thickness of between 0.03 and 1 μm, and preferably of between 0.05 and 0.5 μm, on the chromium layer, an electroplated copper layer having a thickness of between 5 and 150 μm, and preferably of between 20 and 50 μm, on the sputtered seed layer, an electroplated nickel layer having a thickness of between 1 and 10 μm on the electroplated copper layer, and an electroplated gold layer having a thickness of between 1 and 10 μm on the electroplated nickel layer, wherein the thickness of the electroplated copper layer, the electroplated nickel layer and the electroplated gold layer is between 5 and 150 μm, and preferably of between 20 and 50 μm.

Figure 2D:
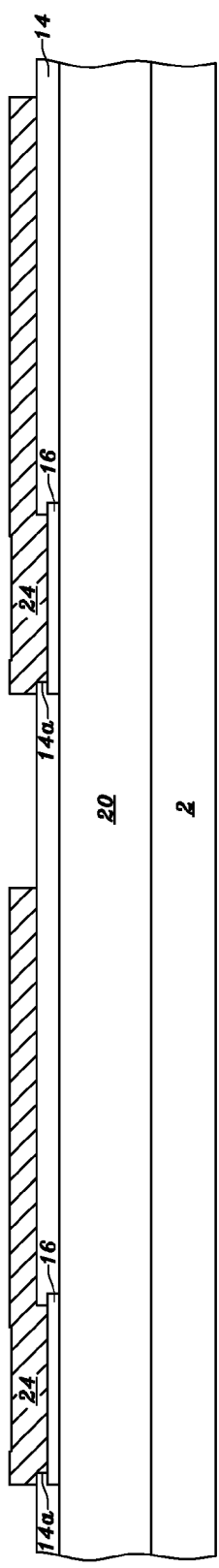

Referring to FIG. 2D, a metal trace 24 can be formed on the passivation layer 14 and connected to the pad 16, such as aluminum pad or copper pad, through the opening 14a. The material of the metal trace 24 may include copper, nickel or gold. For example, the metal trace 24 may comprise a gold layer with a thickness of between 2 and 15 μm on the passivation layer 14 and on the pad 16, such as aluminum pad or copper pad, exposed by the opening 14a. Alternatively, the metal trace 24 may comprise a copper layer with a thickness of between 2 and 15 μm on the passivation layer 14 and on the pad 16, such as aluminum pad or copper pad, exposed by the opening 14a. Alternatively, the metal trace 24 may comprise a copper layer having a thickness of between 1 and 20 μm on the passivation layer 14 and on the pad 16, such as aluminum pad or copper pad, exposed by the opening 14a, a nickel layer having a thickness of between 0.5 and 5 μm directly on the copper layer, and a gold layer having a thickness of between 0.01 and 5 μm directly on the nickel layer.

Figure 2E:
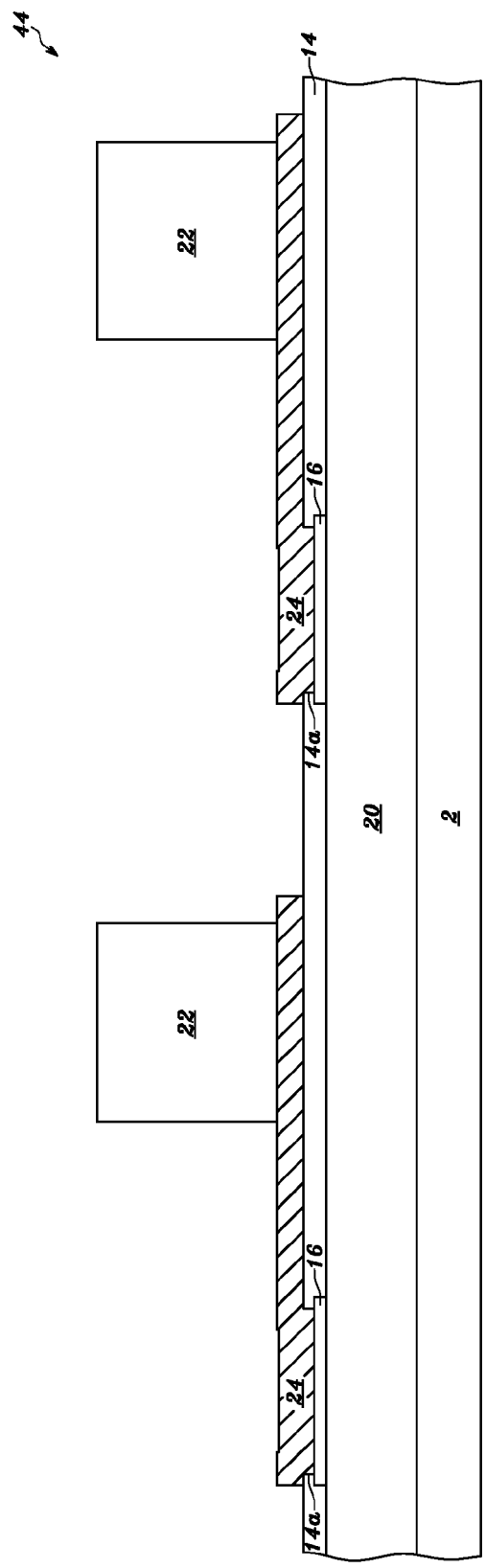

Next, referring to FIG. 2E, the metal bump 22 having a thickness of between 5 and 150 μm, and preferably of between 20 and 50 μm, is formed on the metal trace 24. From a top perspective view, the position of the metal bump 22 may be different from that of the pad 16, to which the metal trace 24 is connected. In this embodiment, the above-mentioned adhesion/barrier layer 102 and seed layer 104 of the metal bump 22 shown in FIG. 2A-g may be saved when the metal bump 22 shown in FIG. 2E is formed on the metal trace 24; that is, the above-mentioned electroplated metal layer 108 of the metal bump 22 shown in FIG. 2A-g may be formed directly on the metal trace 24 when the metal bump 22 shown in FIG. 2E is formed on the metal trace 24. In a case, the metal trace 24 and metal bump 22, as shown in FIG. 2E, may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, and on the passivation layer 14, then sputtering a seed layer, such as gold, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first gold layer, for the metal trace 24, having a thickness of between 1 and 20 microns, and preferably of between 2 and 15 microns, on the seed layer exposed by the opening in the first photoresist layer, then forming a second photoresist layer on the first gold layer and on the first photoresist layer, an opening in the second photoresist layer with a bump pattern exposing the first gold layer, then electroplating a second gold layer, for the metal bump 22, having a thickness of between 5 and 150 microns, and preferably of between 20 and 50 microns, on the first gold layer exposed by the opening in the second photoresist layer, then removing the second and first photoresist layers, then removing the seed layer not under the first gold layer, and then removing the adhesion/barrier layer not under the first gold layer.

Alternatively, the metal trace 24 and metal bump 22 shown in FIG. 2E may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, and on the passivation layer 14, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 24, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then removing the second and first photoresist layers, then removing the seed layer not under the first copper layer, and then removing the adhesion/barrier layer not under the first copper layer.

Alternatively, the metal trace 24 and metal bump 22 shown in FIG. 2E may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, and on the passivation layer 14, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 24, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then electroplating a nickel layer, for the metal bump 22, having a thickness of between 1 and 10 microns, on the second copper layer in the opening in the second photoresist layer, then removing the second and first photoresist layers, then removing the seed layer not under the first copper layer, and then removing the adhesion/barrier layer not under the first copper layer.

Alternatively, the metal trace 24 and metal bump 22 shown in FIG. 2E may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, and on the passivation layer 14, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 24, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then electroplating a nickel layer, for the metal bump 22, having a thickness of between 1 and 10 microns, on the second copper layer in the opening in the second photoresist layer, then electroplating a gold layer, for the metal bump 22, having a thickness of between 1 and 10 microns, on the nickel layer in the opening in the second photoresist layer, then removing the second and first photoresist layers, then removing the seed layer not under the first copper layer, and then removing the adhesion/barrier layer not under the first copper layer.

Thereby, referring to FIG. 2E, the metal bump 22 may include an electroplated gold layer having a thickness of between 5 and 150 μm, and preferably of between 20 and 50 μm, directly on a gold layer of the metal trace 24. Alternatively, the metal bump 22 may be formed of an electroplated copper layer having a thickness of between 5 and 150 μm, and preferably of between 20 and 50 μm, directly on a copper layer of the metal trace 24. Alternatively, after the metal trace 24 and the metal bump 22 are formed, a polymer layer, such as a photosensitive polyimide layer having a thickness of between 5 and 30 μm, can be spin-on coated on the metal trace 24, on the metal bump 22 and on the passivation layer 14, next the polymer layer is exposed using 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, next the exposed polymer is developed to uncover the metal bump 22, next the polymer layer is curred at a peak temperature of between 250 and 400° C. for a time of between 30 and 200 minutes, or at a temperature of more than 400° C. for a time of less than 30 minutes, in a nitrogen ambient or in an oxygen-free ambient, wherein the cured polymer layer, such as polyimide, may have a thickness of between 3 and 25 microns, and next the residual polymeric material or other contaminants on the metal bump 22 with an $O_2$ plasma or a plasma containing fluorine of below 200 PPM and oxygen. Alternatively, a polymer layer, such as benzocyclobutane (BCB), may be formed to cover the metal trace 24 and the passivation layer 14, but to uncover the metal bump 22.

Figure 2F:
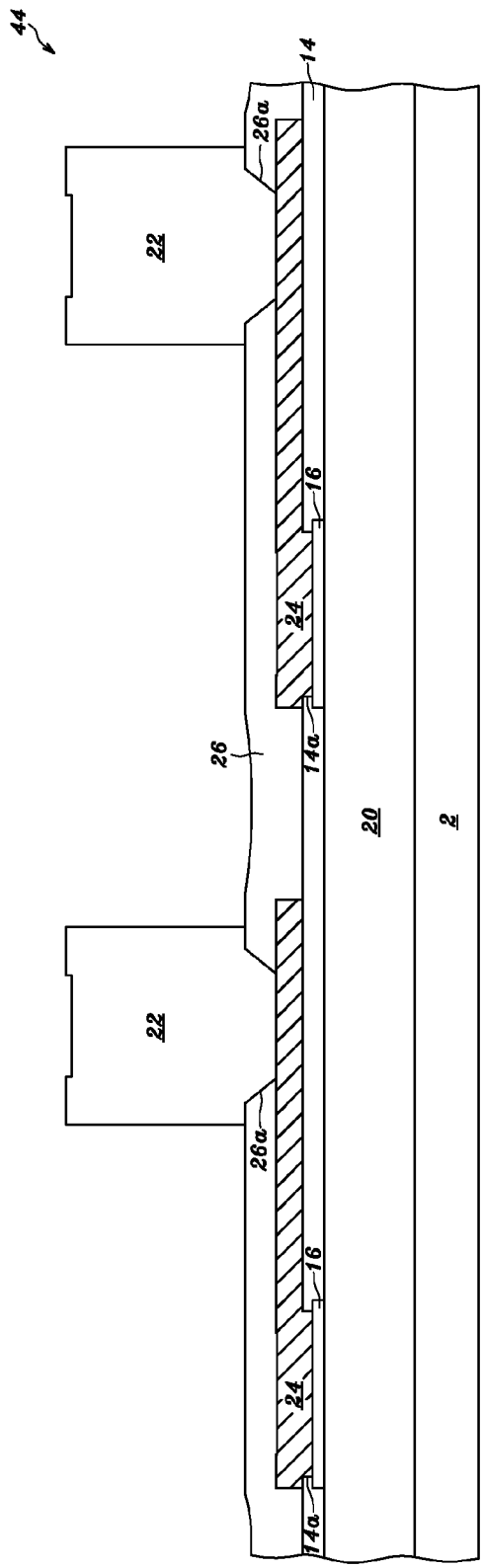

Alternatively, referring to FIG. 2F, a metal trace 24 may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 14a, and on the passivation layer 14, then sputtering a seed layer, such as gold, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a gold layer having a thickness of between 1 and 20 microns, and preferably of between 2 and 15 microns, on the seed layer exposed by the opening in the photoresist layer, then removing the photoresist layers, then removing the seed layer not under the electroplated gold layer, and then removing the adhesion/barrier layer not under the electroplated gold layer. Alternatively, the metal trace 24 may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 14a, and on the passivation layer 14, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then removing the photoresist layers, then removing the seed layer not under the electroplated copper layer, and then removing the adhesion/barrier layer not under the electroplated copper layer. Alternatively, the metal trace 24 may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 14a, and on the passivation layer 14, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then electroplating a nickel layer having a thickness of between 1 and 10 microns on the electroplated copper layer in the opening in the photoresist layer, then removing the photoresist layers, then removing the seed layer not under the electroplated copper layer, and then removing the adhesion/barrier layer not under the electroplated copper layer. Alternatively, the metal trace 24 may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 14*a*, and on the passivation layer 14, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then electroplating a nickel layer having a thickness of between 1 and 10 microns on the electroplated copper layer in the opening in the photoresist layer, then electroplating a gold layer having a thickness of between 0.01 and 3 microns on the electroplated nickel layer in the opening in the photoresist layer, then removing the photoresist layers, then removing the seed layer not under the electroplated copper layer, and then removing the adhesion/barrier layer not under the electroplated copper layer.

Referring to FIG. 2F, after the metal trace 24 is formed, a polymer layer 26 can be formed on the metal trace 24 and on the passivation layer 14, an opening 26*a* in the polymer layer 26 exposing a pad of the metal trace 24. From a top perspective view, the position of the pad exposed by the opening 26*a* may be different from that of the pad 16 to which the metal trace 24 is connected. The polymer layer 26 can be formed by spin-on coating a positive-type photosensitive polyimide layer having a thickness of between 3 and 50 μm, and preferably of between 6 and 24 μm, on the passivation layer 14 and on the metal trace 24, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the pad of the metal trace 24, then curing or heating the developed polyimide layer at a peak temperature of between 250 and 400° C. for a time of between 30 and 200 minutes, or at a temperature of more than 400° C. for a time of less than 30 minutes, in a nitrogen ambient or in an oxygen-free ambient, the cured polyimide layer having a thickness of between 3 and 26 μm, and preferably between 3 and 15 μm, and then removing the residual polymeric material or other contaminants on the pad of the metal trace 24 exposed by the opening in the cured polyimide layer with an $O_2$ plasma or a plasma containing fluorine of below 200 PPM and oxygen, such that the polyimide layer can be patterned with at least one opening 26*a* in the polyimide layer exposing at least one pad of the metal trace 24. Next, the metal bump 22 having a thickness of between 5 and 150 μm, and preferably of between 20 and 50 μm, is formed on the metal trace 24 exposed by the opening 26*a*. The method for forming the metal bump 22 on the pad exposed by the opening 26*a* can be referred to the above description, as illustrated in FIGS. 2A-a through 2A-g, of forming the metal bump 22 on the pad 16 exposed by the opening 14*a*. The metal bump 22 shown in FIG. 2F can be formed by sputtering the adhesion/barrier layer 102 on the pad exposed by the opening 26*a* and on the polymer layer 26, followed by the steps shown in FIGS. 2A-b through 2A-g.

Alternatively, the material of the polymer layer 26 may include benzocyclobutane (BCB), polyurethane, epoxy resin, a parylene-based polymer, a solder-mask material, an elastomer, or a porous dielectric material. The polymer layer 26 has a thickness of between 3 and 25 μm. For example, the polymer layer 26 may be a benzocyclobutane (BCB) layer having a thickness of between 3 and 25 μm on the passivation layer 14 and on the metal trace 24. Alternatively, the polymer layer 26 may be an epoxy resin layer having a thickness of between 3 and 25 μm on the passivation layer 14 and on the metal trace 24. The polymer layer 26 can be formed by a spin-on coating process, a lamination process or a screen-printing process.

Figure 2G:
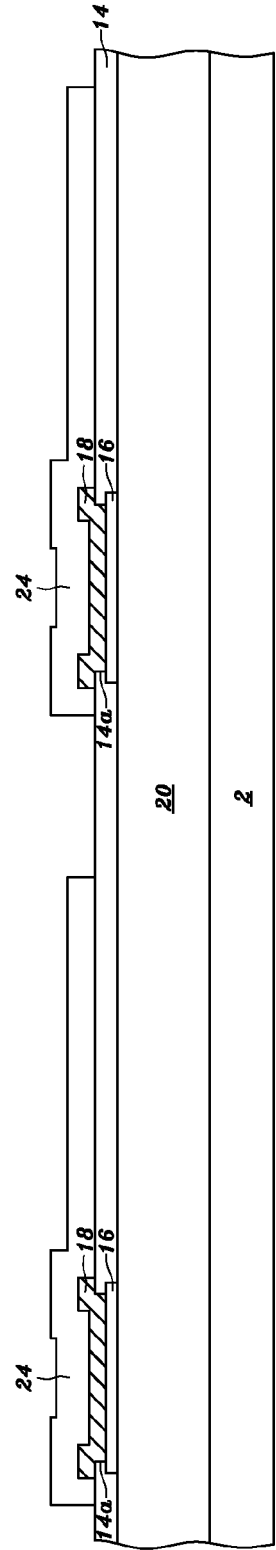

Referring to FIG. 2G, the metal trace 24 can be formed on the passivation layer 14 and on the aluminum-containing layer of the metal cap 18 on the pad 16, principally made of copper, exposed by the opening 14*a*. The material of the metal trace 24 may include copper, nickel or gold. For example, the metal trace 24 may comprise a gold layer with a thickness of between 2 and 15 μm on the passivation layer 14 and on the aluminum-containing layer of the metal cap 18 on the pad 16, principally made of copper, exposed by the opening 14*a*. Alternatively, the metal trace 24 may comprise a copper layer with a thickness of between 2 and 15 μm on the passivation layer 14 and on the aluminum-containing layer of the metal cap 18 on the pad 16, principally made of copper, exposed by the opening 14*a*. Alternatively, the metal trace 24 may comprise a copper layer having a thickness of between 1 and 20 μm on the passivation layer 14 and on the aluminum-containing layer of the metal cap 18 on the pad 16, principally made of copper, exposed by the opening 14*a*, a nickel layer having a thickness of between 0.5 and 5 μm directly on the copper layer, and a gold layer having a thickness of between 0.01 and 5 μm directly on the nickel layer.

Figure 2H:
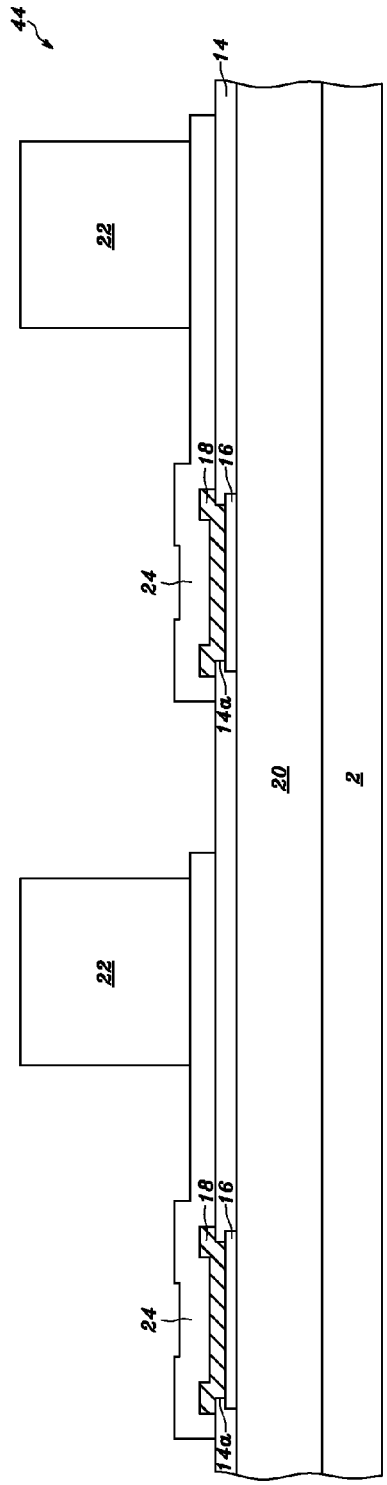

Next, referring to FIG. 2H, the metal bump 22 having a thickness of between 5 and 150 μm, and preferably of between 20 and 50 μm, is formed on the metal trace 24. From a top perspective view, the position of the metal bump 22 may be different from that of the metal cap 18 to which the metal trace 24 is connected. In this embodiment, the above-mentioned adhesion/barrier layer 102 and seed layer 104 of the metal bump 22 shown in FIG. 2A-g may be saved when the metal bump 22 shown in FIG. 2H is formed on the metal trace 24; that is, the above-mentioned electroplated metal layer 108 of the metal bump 22 shown in FIG. 2A-g may be formed directly on the metal trace 24 when the metal bump 22 shown in FIG. 2H is formed on the metal trace 24. In a case, the metal trace 24 and metal bump 22, shown in FIG. 2H, may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 14*a*, and on the passivation layer 14, then sputtering a seed layer, such as gold, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first gold layer, for the metal trace 24, having a thickness of between 1 and 20 microns, and preferably of between 2 and 15 microns, on the seed layer exposed by the opening in the first photoresist layer, then forming a second photoresist layer on the first gold layer and on the first photoresist layer, an opening in the second photoresist layer with a bump pattern exposing the first gold layer, then electroplating a second gold layer, for the metal bump 22, having a thickness of between 5 and 150 microns, and preferably of between 20 and 50 microns, on the first gold layer exposed by the opening in the second photoresist layer, then removing the second and first photoresist layers, then removing the seed layer not under the first gold layer, and then removing the adhesion/barrier layer not under the first gold layer.

Alternatively, the metal trace 24 and metal bump 22 shown in FIG. 2H may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 14a, and on the passivation layer 14, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 24, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then removing the second and first photoresist layers, then removing the seed layer not under the first copper layer, and then removing the adhesion/barrier layer not under the first copper layer.

Alternatively, the metal trace 24 and metal bump 22 shown in FIG. 2H may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 14a, and on the passivation layer 14, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 24, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then electroplating a nickel layer, for the metal bump 22, having a thickness of between 1 and 10 microns, on the second copper layer in the opening in the second photoresist layer, then removing the second and first photoresist layers, then removing the seed layer not under the first copper layer, and then removing the adhesion/barrier layer not under the first copper layer.

Alternatively, the metal trace 24 and metal bump 22 shown in FIG. 2H may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 14a, and on the passivation layer 14, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 24, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then electroplating a nickel layer, for the metal bump 22, having a thickness of between 1 and 10 microns, on the second copper layer in the opening in the second photoresist layer, then electroplating a gold layer, for the metal bump 22, having a thickness of between 1 and 10 microns, on the nickel layer in the opening in the second photoresist layer, then removing the second and first photoresist layers, then removing the seed layer not under the first copper layer, and then removing the adhesion/barrier layer not under the first copper layer.

Thereby, referring to FIG. 2H, the metal bump 22 may include an electroplated gold layer having a thickness of between 5 and 150 μm, and preferably of between 20 and 50 μm, on a gold layer of the metal trace 24. Alternatively, the metal bump 22 may be formed of an electroplated copper layer having a thickness of between 5 and 150 μm, and preferably of between 20 and 50 μm, on a copper layer of the metal trace 24. Alternatively, after the metal trace 24 and the metal bump 22 are formed, a polymer layer, such as a photosensitive polyimide layer having a thickness of between 5 and 30 μm, can be spin-on coated on the metal trace 24, on the metal bump 22 and on the passivation layer 14, next the polymer layer is exposed using 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, next the exposed polymer is developed to uncover the metal bump 22, next the polymer layer is curred at a peak temperature of between 250 and 400° C. for a time of between 30 and 200 minutes, or at a temperature of more than 400° C. for a time of less than 30 minutes, in a nitrogen ambient or in an oxygen-free ambient, wherein the cured polymer layer, such as polyimide, may have a thickness of between 3 and 25 microns, and next the residual polymeric material or other contaminants on the metal bump 22 with an $O_2$ plasma or a plasma containing fluorine of below 200 PPM and oxygen. Alternatively, a polymer layer, such as benzocyclobutane (BCB), may be formed to cover the metal trace 24 and the passivation layer 14, but to uncover the metal bump 22.

Figure 2I:
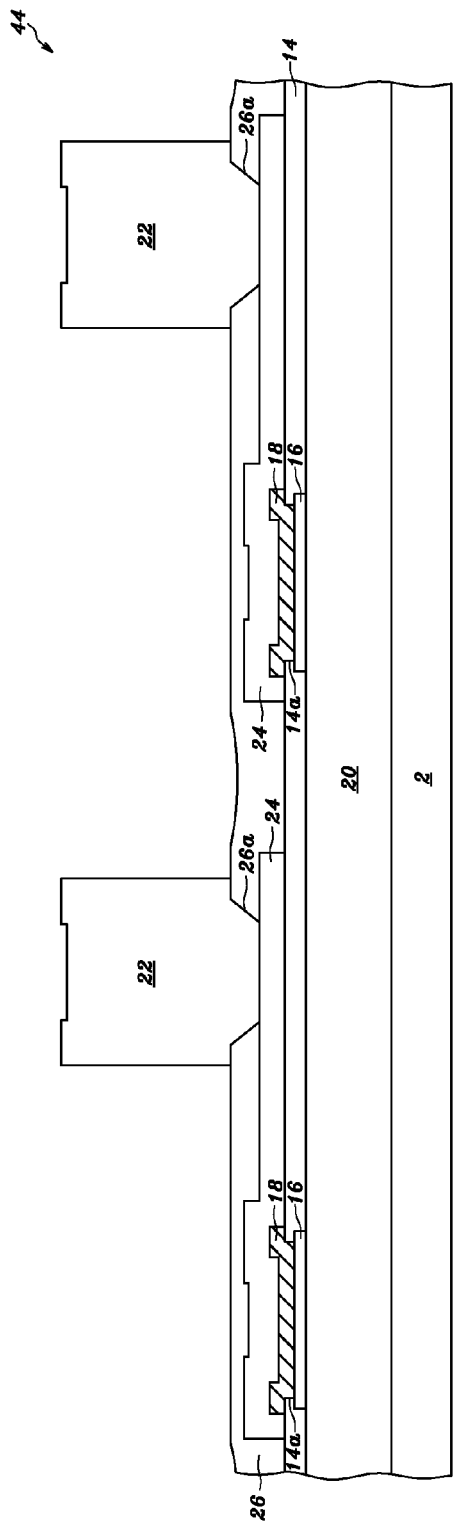

Alternatively, referring to FIG. 2I, a metal trace 24 may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 14a, and on the passivation layer 14, then sputtering a seed layer, such as gold, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a gold layer having a thickness of between 1 and 20 microns, and preferably of between 2 and 15 microns, on the seed layer exposed by the opening in the photoresist layer, then removing the photoresist layers, then removing the seed layer not under the electroplated gold layer, and then removing the adhesion/barrier layer not under the electroplated gold layer. Alternatively, the metal trace 24 may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 14a, and on the passivation layer 14, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then removing the photoresist layers, then removing the seed layer not under the electroplated copper layer, and then removing the adhesion/barrier layer not under the electroplated copper layer. Alternatively, the metal trace 24 may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 14a, and on the passivation layer 14, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then electroplating a nickel layer having a thickness of between 1 and 10 microns on the electroplated copper layer in the opening in the photoresist layer, then removing the photoresist layers, then removing the seed layer not under the electroplated copper layer, and then removing the adhesion/barrier layer not under the electroplated copper layer. Alternatively, the metal trace 24 may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 14a, and on the passivation layer 14, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then electroplating a nickel layer having a thickness of between 1 and 10 microns on the electroplated copper layer in the opening in the photoresist layer, then electroplating a gold layer having a thickness of between 0.01 and 3 microns on the electroplated nickel layer in the opening in the photoresist layer, then removing the photoresist layers, then removing the seed layer not under the electroplated copper layer, and then removing the adhesion/barrier layer not under the electroplated copper layer.

Referring to FIG. 2I, after the metal trace 24 is formed, a polymer layer 26 can be formed on the metal trace 24 and on the passivation layer 14, an opening 26a in the polymer layer 26 exposing a pad of the metal trace 24. From a top perspective view, the position of the pad exposed by the opening 26a may be different from that of the metal cap 18 to which the metal trace 24 is connected. The polymer layer 26 can be formed by spin-on coating a positive-type photosensitive polyimide layer having a thickness of between 3 and 50 µm, and preferably of between 6 and 24 µm, on the passivation layer 14 and on the metal trace 24, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the pad of the metal trace 24, then curing or heating the developed polyimide layer at a peak temperature of between 250 and 400° C. for a time of between 30 and 200 minutes, or at a temperature of more than 400° C. for a time of less than 30 minutes, in a nitrogen ambient or in an oxygen-free ambient, the cured polyimide layer having a thickness of between 3 and 26 µm, and preferably between 3 and 15 µm, and then removing the residual polymeric material or other contaminants on the pad of the metal trace 24 exposed by the opening in the cured polyimide layer with an $O_2$ plasma or a plasma containing fluorine of below 200 PPM and oxygen, such that the polyimide layer can be patterned with at least one opening 26a in the polyimide layer exposing at least one pad of the metal trace 24. Next, the metal bump 22 having a thickness of between 5 and 150 µm, and preferably of between 20 and 50 µm, is formed on the metal trace 24 exposed by the opening 26a. The method for forming the metal bump 22 on the pad exposed by the opening 26a can be referred to the above description, as illustrated in FIGS. 2A-a through 2A-g, of forming the metal bump 22 on the pad 16 exposed by the opening 14a. The metal bump 22 shown in FIG. 2I can be formed by sputtering the adhesion/barrier layer 102 on the pad exposed by the opening 26a and on the polymer layer 26, followed by the steps shown in FIGS. 2A-b through 2A-g.

Referring to FIGS. 3A and 3B, a polymer layer 28 can be formed on the passivation layer 14, and at least one opening 28a is formed in the polymer layer 28 by patterning the polymer layer 28 to expose at least one pad 16, such as aluminum pad or copper pad. The pad 16 may include a center portion exposed by an opening 28a and a peripheral portion covered with the polymer layer 28, as shown in FIG. 3A. Alternatively, the opening 28a may expose the entire upper surface of the pad 16 exposed by the opening 14*a* in the passivation layer 14 and further may expose the upper surface of the passivation layer 14 near the pad 16, as shown in FIG. 3B. The polymer layer 28 can be formed by spin-on coating a positive-type photosensitive polyimide layer having a thickness of between 3 and 50 µm, and preferably of between 6 and 24 µm, on the passivation layer 14 and on the pad 16, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the pad 16, then curing or heating the developed polyimide layer at a peak temperature of between 250 and 400° C. for a time of between 30 and 200 minutes, or at a temperature of more than 400° C. for a time of less than 30 minutes, in a nitrogen ambient or in an oxygen-free ambient, the cured polyimide layer having a thickness of between 3 and 26 µm, and preferably between 3 and 15 µm, and then removing the residual polymeric material or other contaminants on the pad 16 exposed by the opening in the cured polyimide layer with an $O_2$ plasma or a plasma containing fluorine of below 200 PPM and oxygen, such that the polyimide layer can be patterned with at least one opening 28*a* in the polyimide layer exposing at least one pad 16.

Alternatively, the material of the polymer layer 28 may include benzocyclobutane (BCB), polyurethane, epoxy resin, a parylene-based polymer, a solder-mask material, an elastomer, or a porous dielectric material. The polymer layer 28 has a thickness of between 3 and 25 µm. For example, the polymer layer 28 may be a benzocyclobutane (BCB) layer having a thickness of between 3 and 25 µm on the passivation layer 14. Alternatively, the polymer layer 28 may be an epoxy resin layer having a thickness of between 3 and 25 µm on the passivation layer 14. The polymer layer 28 can be formed by a spin-on coating process, a lamination process or a screen-printing process.

Figure 3C:
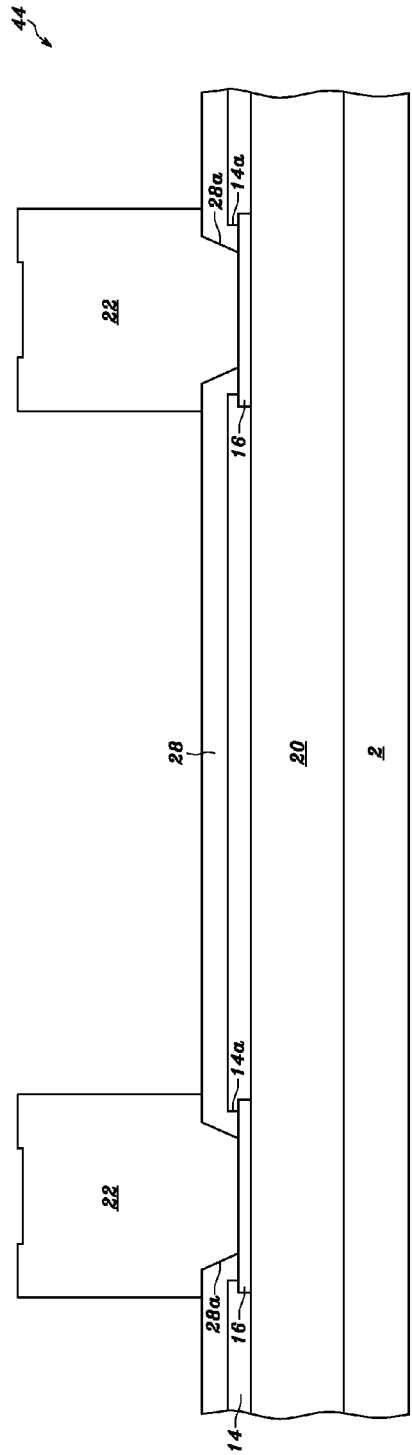
Figure 3D:
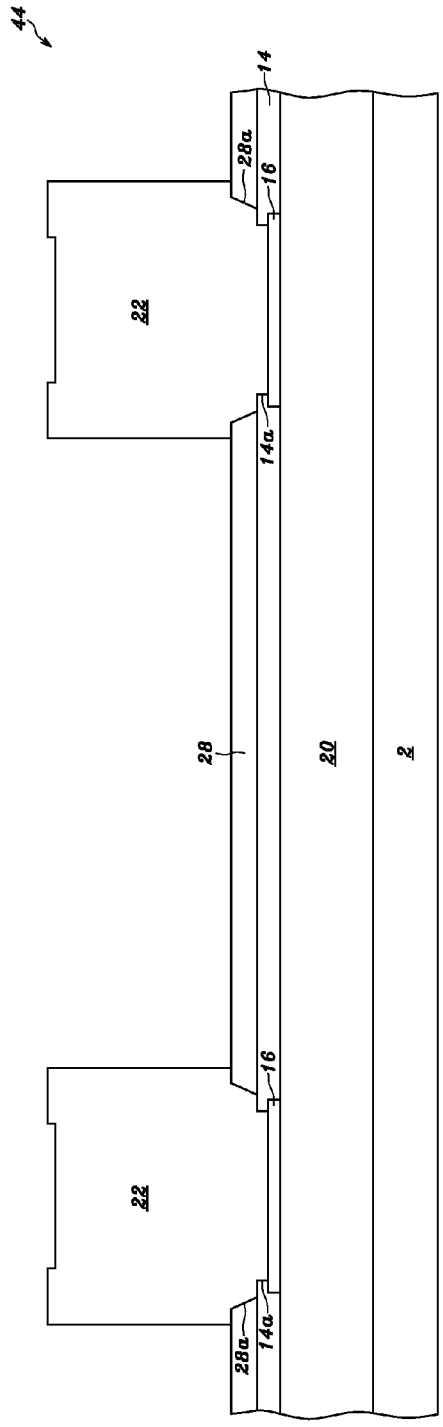

Referring to FIGS. 3C and 3D, the metal bump 22 having a thickness of between 5 and 150 µm, and preferably of between 20 and 50 µm, is formed on the pad 16, such as aluminum pad or copper pad, exposed by the opening 28. The method of forming the metal bump 22 on the pad 16 exposed by the opening 28*a* can be referred to the above description concerning FIGS. 2A-a through 2A-g of forming the metal bump 22 on the pad 16 exposed by the opening 14*a*. The metal bump 22 shown in FIGS. 3C and 3D can be formed by sputtering the adhesion/barrier layer 102 on the pad 16 exposed by the opening 28*a* and on the polymer layer 28, followed by the steps shown in FIGS. 2A-b through 2A-g.

Figure 3E:
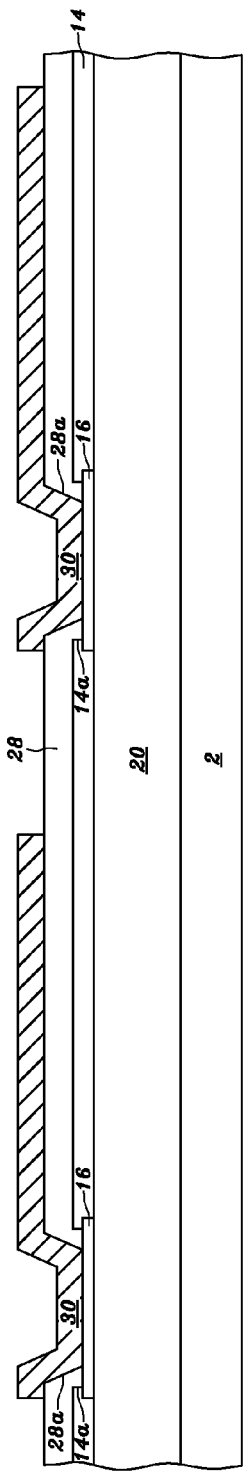

Referring to FIG. 3E, a metal trace 30 can be formed on the polymer layer 28 and on the pad 16, such as aluminum pad or copper pad, exposed by the opening 28*a*. For example, the metal trace 30 may comprise a gold layer with a thickness of between 2 and 15 µm on the polymer layer 28 and on the pad 16, such as aluminum pad or copper pad, exposed by the opening 28*a*. Alternatively, the metal trace 30 may comprise a copper layer with a thickness of between 2 and 15 µm on the polymer layer 28 and on the pad 16, such as aluminum pad or copper pad, exposed by the opening 28*a*. Alternatively, the metal trace 30 may comprise a copper layer having a thickness of between 1 and 20 µm on the polymer layer 28 and on the pad 16, such as aluminum pad or copper pad, exposed by the opening 28*a*, a nickel layer having a thickness of between 0.5 and 5 µm on the copper layer, and a gold layer having a thickness of between 0.01 and 5 µm on the nickel layer.

Figure 3F:
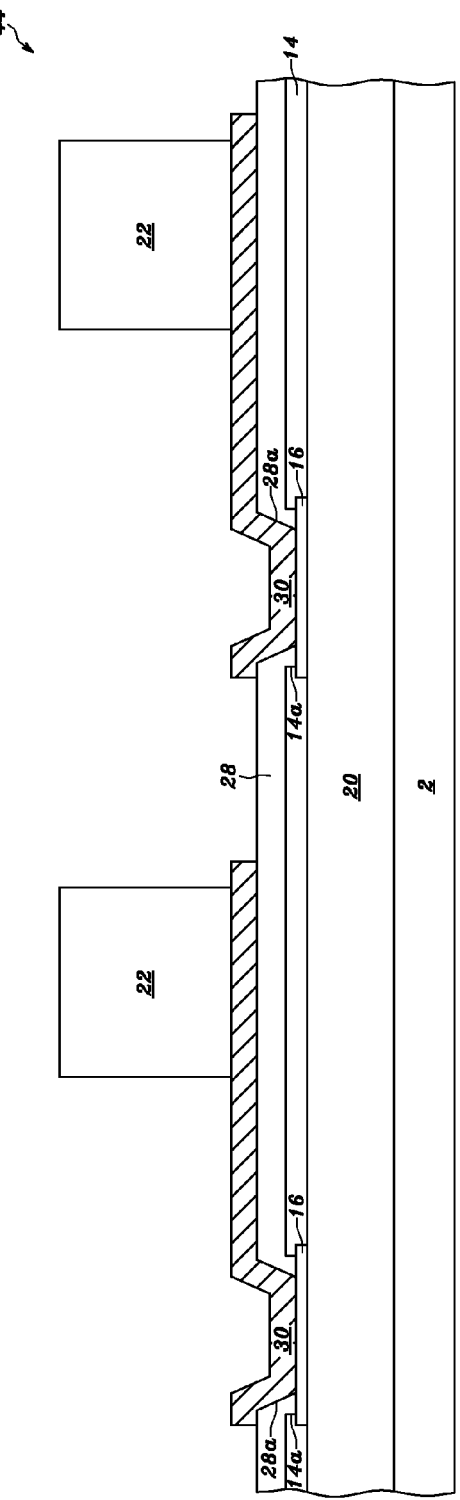

Next, referring to FIG. 3F, the metal bump 22 having a thickness of between 5 and 150 µm, and preferably of between 20 and 50 µm, is formed on the metal trace 30. From a top perspective view, the position of the metal bump 22 may be different from that of the pad 16 to which the metal trace 30 is connected. In this embodiment, the above-mentioned adhesion/barrier layer 102 and seed layer 104 of the metal bump 22 shown in FIG. 2A-g may be saved when the metal bump 22 shown in FIG. 3F is formed on the metal trace 30; that is, the above-mentioned electroplated metal layer 108 of the metal bump 22 shown in FIG. 2A-g may be formed directly on the metal trace 30 when the metal bump 22 shown in FIG. 3F is formed on the metal trace 30. In a case, the metal trace 30 and metal bump 22, shown in FIG. 3F, may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 28*a*, and on the polymer layer 28, then sputtering a seed layer, such as gold, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first gold layer, for the metal trace 30, having a thickness of between 1 and 20 microns, and preferably of between 2 and 15 microns, on the seed layer exposed by the opening in the first photoresist layer, then forming a second photoresist layer on the first gold layer and on the first photoresist layer, an opening in the second photoresist layer with a bump pattern exposing the first gold layer, then electroplating a second gold layer, for the metal bump 22, having a thickness of between 5 and 150 microns, and preferably of between 20 and 50 microns, on the first gold layer exposed by the opening in the second photoresist layer, then removing the second and first photoresist layers, then removing the seed layer not under the first gold layer, and then removing the adhesion/barrier layer not under the first gold layer.

Alternatively, the metal trace 30 and metal bump 22 shown in FIG. 3F may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 28*a*, and on the polymer layer 28, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 30, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then removing the second and first photoresist layers, then removing the seed layer not under the first copper layer, and then removing the adhesion/barrier layer not under the first copper layer.

Alternatively, the metal trace 30 and metal bump 22 shown in FIG. 3F may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 30, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then electroplating a nickel layer, for the metal bump 22, having a thickness of between 1 and 10 microns, on the second copper layer in the opening in the second photoresist layer, then removing the second and first photoresist layers, then removing the seed layer not under the first copper layer, and then removing the adhesion/barrier layer not under the first copper layer.

Alternatively, the metal trace 30 and metal bump 22 shown in FIG. 3F may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 30, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then electroplating a nickel layer, for the metal bump 22, having a thickness of between 1 and 10 microns, on the second copper layer in the opening in the second photoresist layer, then electroplating a gold layer, for the metal bump 22, having a thickness of between 1 and 10 microns, on the nickel layer in the opening in the second photoresist layer, then removing the second and first photoresist layers, then removing the seed layer not under the first copper layer, and then removing the adhesion/barrier layer not under the first copper layer.

Thereby, referring to FIG. 3F, the metal bump 22 may include an electroplated gold layer having a thickness of between 5 and 150 µm, and preferably of between 20 and 50 µm, directly on a gold layer of the metal trace 30. Alternatively, the metal bump 22 may be formed of an electroplated copper layer having a thickness of between 5 and 150 µm, and preferably of between 20 and 50 µm, directly on a copper layer of the metal trace 30. Alternatively, after the metal trace 30 and the metal bump 22 are formed, a polymer layer, such as a photosensitive polyimide layer having a thickness of between 5 and 30 µm, can be spin-on coated on the metal trace 30, on the metal bump 22 and on the polymer layer 28, next the polymer layer is exposed using 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, next the exposed polymer is developed to uncover the metal bump 22, next the polymer layer is curred at a peak temperature of between 250 and 400° C. for a time of between 30 and 200 minutes, or at a temperature of more than 400° C. for a time of less than 30 minutes, in a nitrogen ambient or in an oxygen-free ambient, wherein the cured polymer layer, such as polyimide, may have a thickness of between 3 and 25 microns, and next the residual polymeric material or other contaminants on the metal bump 22 with an $O_2$ plasma or a plasma containing fluorine of below 200 PPM and oxygen. Alternatively, a polymer layer, such as benzocyclobutane (BCB), may be formed to cover the metal trace 30 and the polymer layer 28, but to uncover the metal bump 22.

Figure 3G:
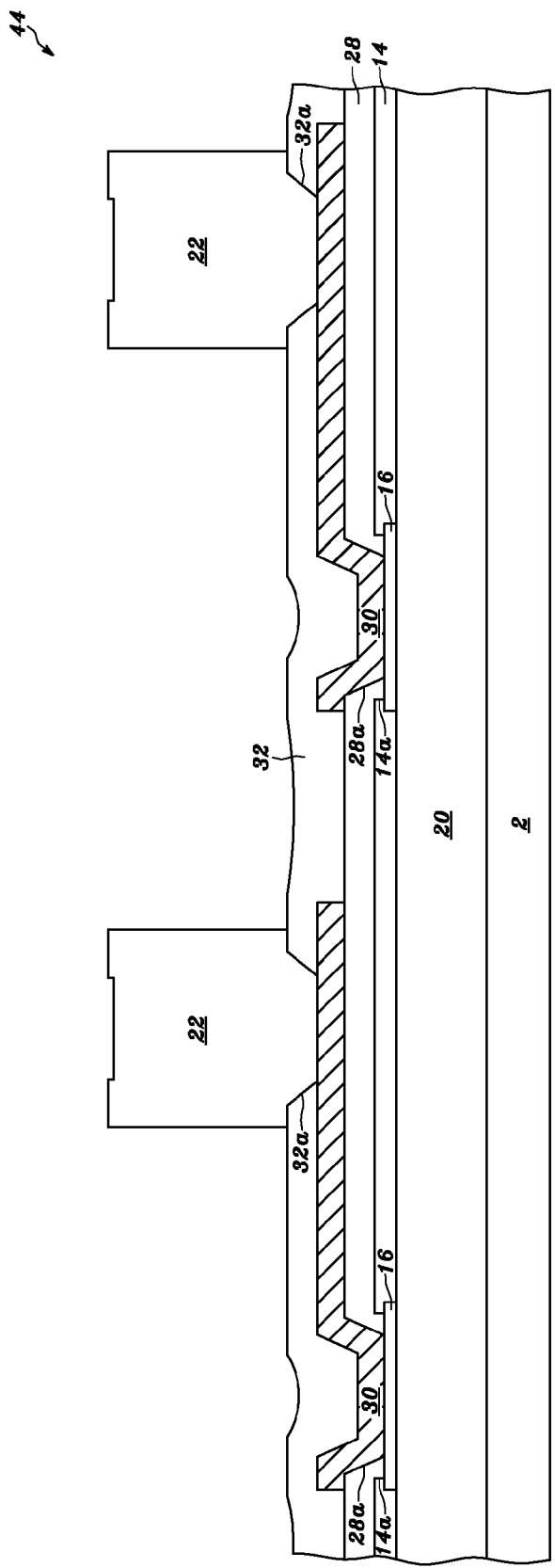

Alternatively, referring to FIG. 3G, a metal trace 30 may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 28a, and on the polymer layer 28, then sputtering a seed layer, such as gold, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a gold layer having a thickness of between 1 and 20 microns, and preferably of between 2 and 15 microns, on the seed layer exposed by the opening in the photoresist layer, then removing the photoresist layers, then removing the seed layer not under the electroplated gold layer, and then removing the adhesion/barrier layer not under the electroplated gold layer. Alternatively, the metal trace 30 may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then removing the photoresist layers, then removing the seed layer not under the electroplated copper layer, and then removing the adhesion/barrier layer not under the electroplated copper layer. Alternatively, the metal trace 30 may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then electroplating a nickel layer having a thickness of between 1 and 10 microns on the electroplated copper layer in the opening in the photoresist layer, then removing the photoresist layers, then removing the seed layer not under the electroplated copper layer, and then removing the adhesion/barrier layer not under the electroplated copper layer. Alternatively, the metal trace 30 may be formed by sputtering a titanium-containing layer, such as titanium layer or titanium-tungsten-alloy layer, having a thickness of between 0.01 and 0.7 microns, and preferably of between 0.03 and 0.35 microns, on the pad 16, principally made of sputtered aluminum or electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then electroplating a nickel layer having a thickness of between 1 and 10 microns on the electroplated copper layer in the opening in the photoresist layer, then electroplating a gold layer having a thickness of between 0.01 and 3 microns on the electroplated nickel layer in the opening in the photoresist layer, then removing the photoresist layers, then removing the seed layer not under the electroplated copper layer, and then removing the adhesion/barrier layer not under the electroplated copper layer.

Referring to FIG. 3G, after the metal trace 30 is formed, a polymer layer 32 can be formed on the metal trace 30 and on the polymer layer 28, an opening 32a in the polymer layer 32 exposing a pad of the metal trace 30. From a top perspective view, the position of the pad exposed by the opening 32a may be different from that of the pad 16 to which the metal trace 30 is connected. The polymer layer 32 can be formed by spin-on coating a positive-type photosensitive polyimide layer having a thickness of between 3 and 50 µm, and preferably of between 6 and 24 µm, on the polymer layer 28 and on the metal trace 30, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the pad of the metal trace 30, then curing or heating the developed polyimide layer at a peak temperature of between 250 and 400° C. for a time of between 30 and 200 minutes, or at a temperature of more than 400° C. for a time of less than 30 minutes, in a nitrogen ambient or in an oxygen-free ambient, the cured polyimide layer having a thickness of between 3 and 26 µm, and preferably between 3 and 15 µm, and then removing the residual polymeric material or other contaminants on the pad of the metal trace 30 exposed by the opening in the cured polyimide layer with an $O_2$ plasma or a plasma containing fluorine of below 200 PPM and oxygen, such that the polyimide layer can be patterned with at least one opening 32a in the polyimide layer exposing at least one pad of the metal trace 30. Next, the metal bump 22 having a thickness of between 5 and 150 µm, and preferably of between 20 and 50 µm, is formed on the metal trace 30 exposed by the opening 32a. The method for forming the metal bump 22 on the pad exposed by the opening 32a can be referred to the above description, as illustrated in FIGS. 2A-a through 2A-g, of forming the metal bump 22 on the pad 16 exposed by the opening 14a. The metal bump 22 can be formed by sputtering the adhesion/barrier layer 102 on the pad exposed by the opening 32a and on the polymer layer 32, followed by the steps shown in FIGS. 2A-b through 2A-g.

Alternatively, the material of the polymer layer 32 may include benzocyclobutane (BCB), polyurethane, epoxy resin, a parylene-based polymer, a solder-mask material, an elastomer, or a porous dielectric material. The polymer layer 32 has a thickness of between 3 and 25 µm. For example, the polymer layer 32 may be a benzocyclobutane (BCB) layer having a thickness of between 3 and 25 µm on the polymer layer 28 and on the metal trace 30. Alternatively, the polymer layer 32 may be an epoxy resin layer having a thickness of between 3 and 25 µm on the polymer layer 28 and on the metal trace 30. The polymer layer 32 can be formed by a spin-on coating process, a lamination process or a screen-printing process.

Alternatively, the opening 28a in the polymer layer 28 shown in FIGS. 3C-3G may expose the entire top surface of the pad 16 exposed by the opening 14a in the passivation layer 14 and the top surface of the passivation layer 14 close to the pad 16, as shown in FIG. 3B.

Figure 4A:
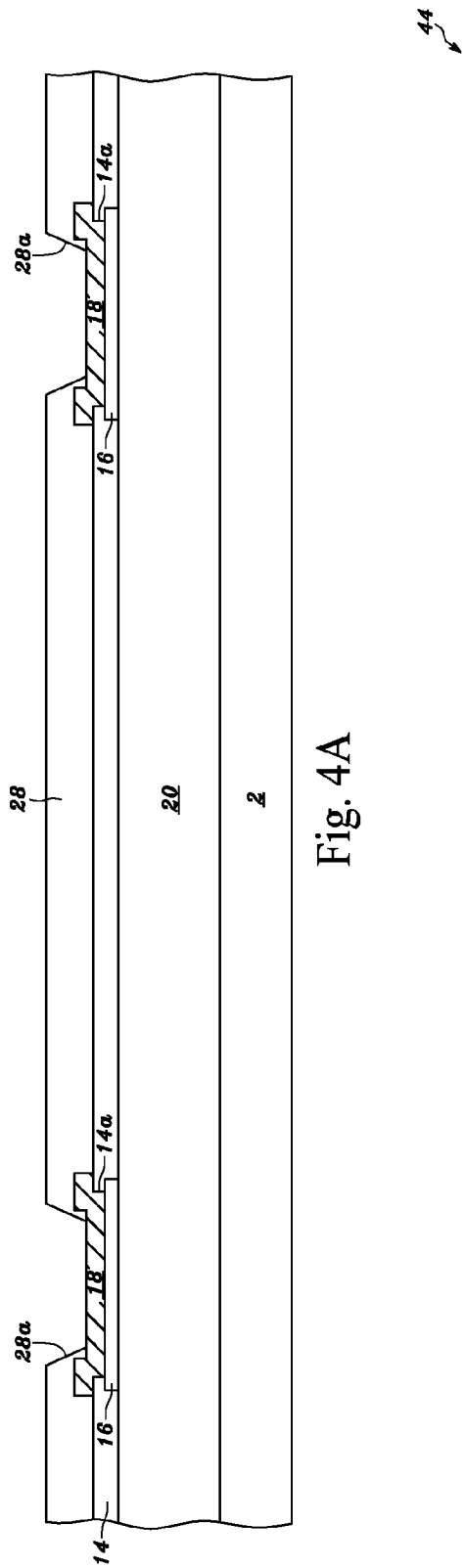
FIGS. 4A through 4E are cross-sectional views showing a metal bump formed over a semiconductor substrate of a semiconductor wafer.

Referring to FIG. 4A, the polymer layer 28 can be formed on the passivation layer 14, an opening 28a in the polymer layer 28 exposing the aluminum-containing layer of the metal cap 18 on the pad 16, principally made of copper, exposed by the opening 14a. The method of forming the polymer layer 28 shown in FIGS. 4A-4E on the metal cap 18 and on the passivation layer 14 can be referred to the method of forming the polymer layer 28 shown in FIGS. 3A-3G on the passivation layer 14. The polymer layer 28 can be formed by spin-on coating a positive-type photosensitive polyimide layer having a thickness of between 3 and 50 µm, and preferably of between 6 and 24 µm, on the passivation layer 14 and on the aluminum-containing layer of the metal cap 18 on the pad 16, principally made of electroplated copper, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the aluminum-containing layer of the metal cap 18, then curing or heating the developed polyimide layer at a peak temperature of between 250 and 400° C. for a time of between 30 and 200 minutes, or at a temperature of more than 400° C. for a time of less than 30 minutes, in a nitrogen ambient or in an oxygen-free ambient, the cured polyimide layer having a thickness of between 3 and 26 μm, and preferably between 3 and 15 μm, and then removing the residual polymeric material or other contaminants on the aluminum-containing layer of the metal cap 18 exposed by the opening in the cured polyimide layer with an $O_2$ plasma or a plasma containing fluorine of below 200 PPM and oxygen, such that the polyimide layer can be patterned with at least one opening 28a in the polyimide layer exposing the aluminum-containing layer of at least one metal cap 18.

Figure 4B:
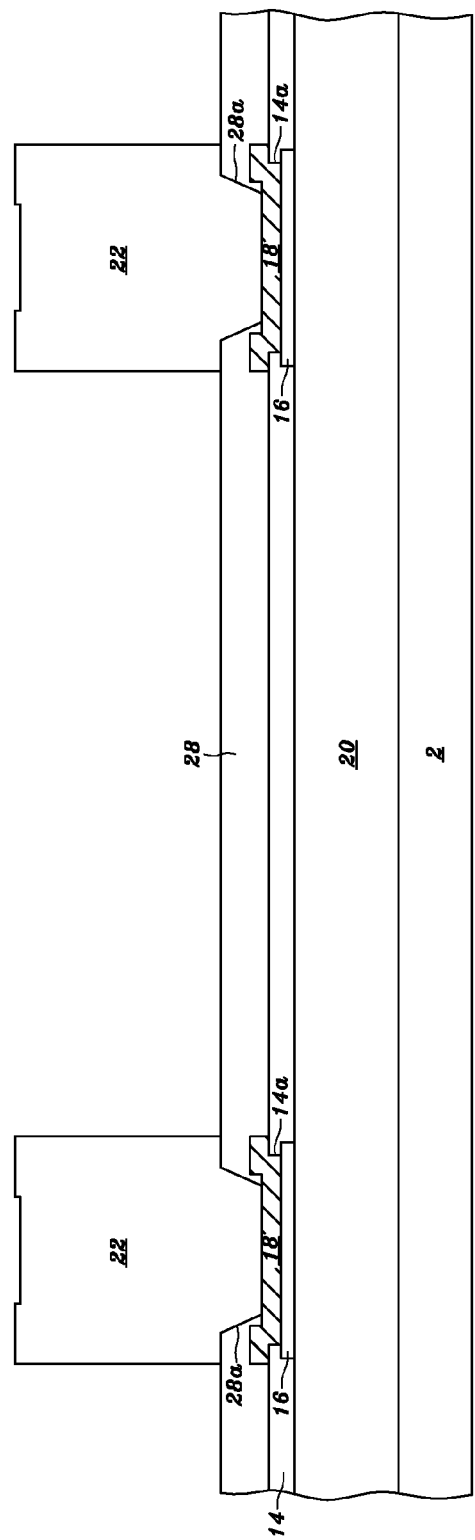

Referring to FIG. 4B, after the polymer layer 28 is formed, the metal bump 22 having a thickness of between 5 and 150 μm, and preferably of between 20 and 50 μm, is formed on the aluminum-containing layer of the metal cap 18 on the pad 16, principally made of copper, exposed by the opening 14a. The method for forming the metal bump 22 on the aluminum-containing layer of the metal cap 18 exposed by the opening 28a can be referred to the above description, as illustrated in FIGS. 2A-a through 2A-g, of forming the metal bump 22 on the pad 16 exposed by the opening 14a. The metal bump 22 shown in FIG. 4B can be formed by sputtering the adhesion/barrier layer 102 on the aluminum-containing layer of the metal cap 18 exposed by the opening 28a and on the polymer layer 32, followed by the steps shown in FIGS. 2A-b through 2A-g.

Figure 4C:
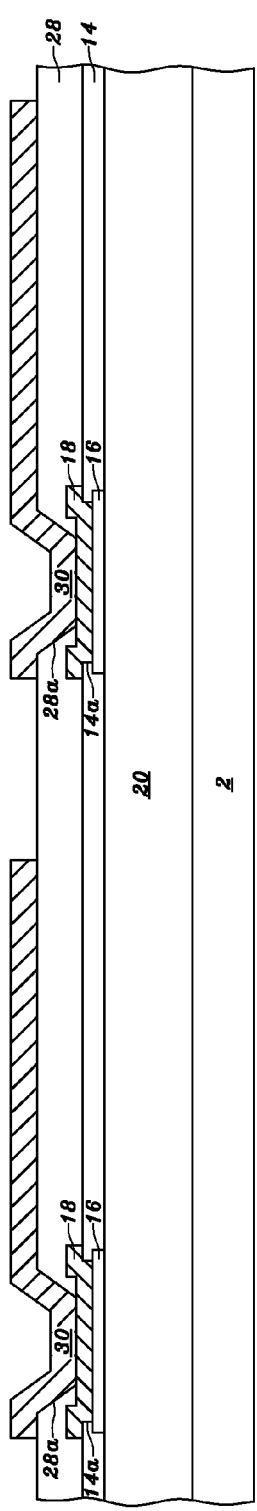

Referring to FIG. 4C, a metal trace 30 can be formed on the polymer layer 28 and on the aluminum-containing layer of the metal cap 18 exposed by the opening 28a. For example, the metal trace 30 may comprise a gold layer with a thickness of between 2 and 15 μm on the polymer layer 28 and on the aluminum-containing layer of the metal cap 18 exposed by the opening 28a. Alternatively, the metal trace 30 may comprise a copper layer with a thickness of between 2 and 15 μm on the polymer layer 28 and on the aluminum-containing layer of the metal cap 18 exposed by the opening 28a. Alternatively, the metal trace 30 may comprise a copper layer having a thickness of between 1 and 20 μm on the polymer layer 28 and on the aluminum-containing layer of the metal cap 18 exposed by the opening 28a, a nickel layer having a thickness of between 0.5 and 5 μm on the copper layer, and a gold layer having a thickness of between 0.01 and 5 μm on the nickel layer.

Figure 4D:
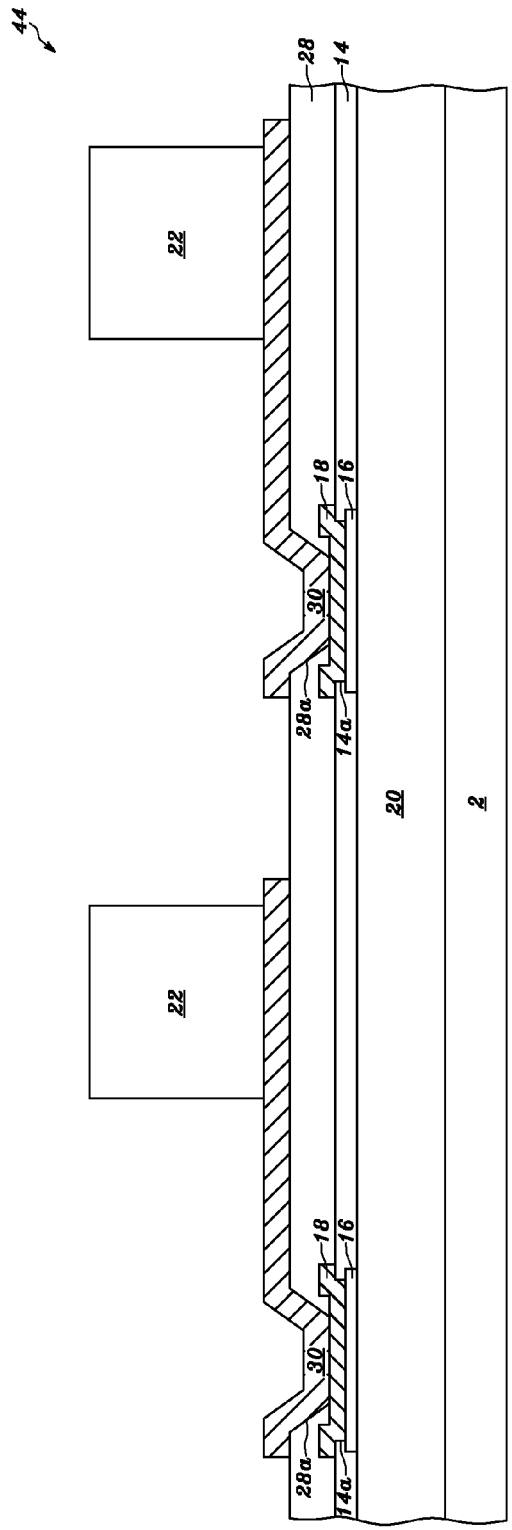

Next, referring to FIG. 4D, the metal bump 22 having a thickness of between 5 and 150 μm, and preferably of between 20 and 50 μm, is formed on the metal trace 30. From a top perspective view, the position of the metal bump 22 may be different from that of the metal cap 18 to which the metal trace 30 is connected. In this embodiment, the above-mentioned adhesion/barrier layer 102 and seed layer 104 of the metal bump 22 shown in FIG. 2A-g may be saved when the metal bump 22 shown in FIG. 4D is formed on the metal trace 30; that is, the above-mentioned electroplated metal layer 108 of the metal bump 22 shown in FIG. 2A-g may be formed directly on the metal trace 30 when the metal bump 22 shown in FIG. 4D is formed on the metal trace 30. In a case, the metal trace 30 and metal bump 22, shown in FIG. 4D, may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 28a, and on the polymer layer 28, then sputtering a seed layer, such as gold, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first gold layer, for the metal trace 30, having a thickness of between 1 and 20 microns, and preferably of between 2 and 15 microns, on the seed layer exposed by the opening in the first photoresist layer, then forming a second photoresist layer on the first gold layer and on the first photoresist layer, an opening in the second photoresist layer with a bump pattern exposing the first gold layer, then electroplating a second gold layer, for the metal bump 22, having a thickness of between 5 and 150 microns, and preferably of between 20 and 50 microns, on the first gold layer exposed by the opening in the second photoresist layer, then removing the second and first photoresist layers, then removing the seed layer not under the first gold layer, and then removing the adhesion/barrier layer not under the first gold layer.

Alternatively, the metal trace 30 and metal bump 22 shown in FIG. 4D may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 30, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then removing the second and first photoresist layers, then removing the seed layer not under the first copper layer, and then removing the adhesion/barrier layer not under the first copper layer.

Alternatively, the metal trace 30 and metal bump 22 shown in FIG. 4D may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 30, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then electroplating a nickel layer, for the metal bump 22, having a thickness of between 1 and 10 microns, on the second copper layer in the opening in the second photoresist layer, then removing the second and first photoresist layers, then removing the seed layer not under the first copper layer, and then removing the adhesion/barrier layer not under the first copper layer.

Alternatively, the metal trace 30 and metal bump 22 shown in FIG. 4D may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a first photoresist layer on the seed layer, an opening in the first photoresist layer with a trace pattern exposing the seed layer, then electroplating a first copper layer, for the metal trace 30, having a thickness of between 1 and 20 microns, and preferably of between 2 and 15 microns, on the seed layer exposed by the opening in the first photoresist layer, then forming a second photoresist layer on the first copper layer and on the first photoresist layer, an opening in the second photoresist layer with a bump pattern exposing the first copper layer, then electroplating a second copper layer, for the metal bump 22, having a thickness of between 5 and 150 microns, and preferably of between 20 and 50 microns, on the first copper layer exposed by the opening in the second photoresist layer, then electroplating a nickel layer, for the metal bump 22, having a thickness of between 1 and 10 microns, on the second copper layer in the opening in the second photoresist layer, then electroplating a gold layer, for the metal bump 22, having a thickness of between 1 and 10 microns, on the nickel layer in the opening in the second photoresist layer, then removing the second and first photoresist layers, then removing the seed layer not under the first copper layer, and then removing the adhesion/barrier layer not under the first copper layer.

Thereby, referring to FIG. 4D, the metal bump 22 may include an electroplated gold layer having a thickness of between 5 and 150 µm, and preferably of between 20 and 50 µm, directly on a gold layer of the metal trace 30. Alternatively, the metal bump 22 may be formed of an electroplated copper layer having a thickness of between 5 and 150 µm, and preferably of between 20 and 50 µm, directly on a copper layer of the metal trace 30. Alternatively, after the metal trace 30 and the metal bump 22 are formed, a polymer layer, such as a photosensitive polyimide layer having a thickness of between 5 and 30 µm, can be spin-on coated on the metal trace 30, on the metal bump 22 and on the polymer layer 28, next the polymer layer is exposed using 1× stepper with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, next the exposed polymer is developed to uncover the metal bump 22, next the polymer layer is curred at a peak temperature of between 250 and 400° C. for a time of between 30 and 200 minutes, or at a temperature of more than 400° C. for a time of less than 30 minutes, in a nitrogen ambient or in an oxygen-free ambient, wherein the cured polymer layer, such as polyimide, may have a thickness of between 3 and 25 microns, and next the residual polymeric material or other contaminants on the metal bump 22 with an $O_2$ plasma or a plasma containing fluorine of below 200 PPM and oxygen. Alternatively, a polymer layer, such as benzocyclobutane (BCB), may be formed to cover the metal trace 30 and the polymer layer 28, but to uncover the metal bump 22.

Figure 4E:
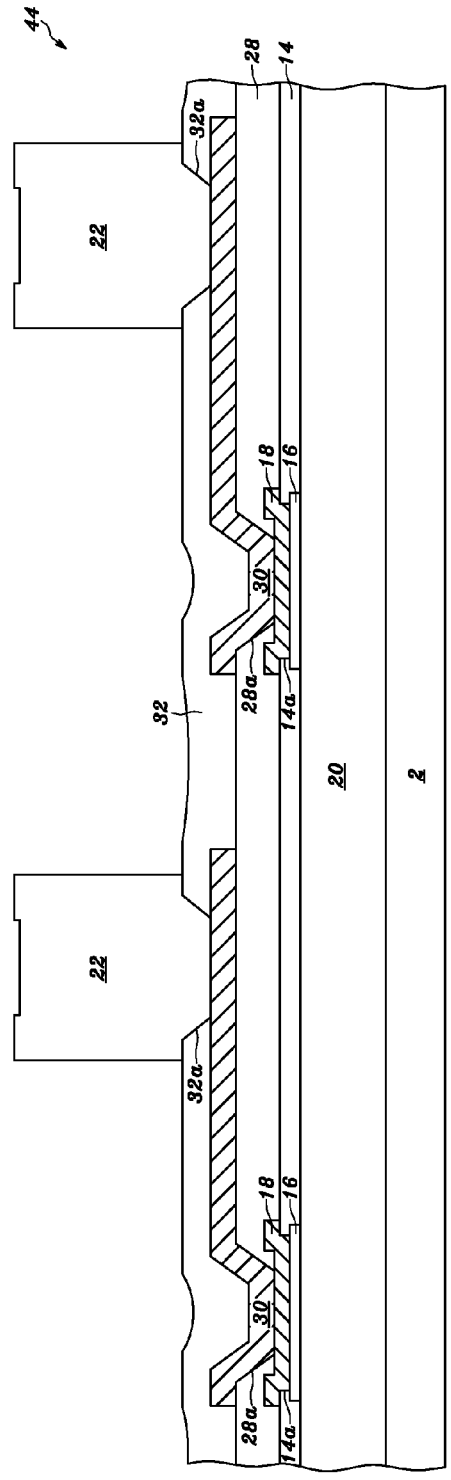

Alternatively, referring to FIG. 4E, a metal trace 30 may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 28a, and on the polymer layer 28, then sputtering a seed layer, such as gold, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a gold layer having a thickness of between 1 and 20 microns, and preferably of between 2 and 15 microns, on the seed layer exposed by the opening in the photoresist layer, then removing the photoresist layers, then removing the seed layer not under the electroplated gold layer, and then removing the adhesion/barrier layer not under the electroplated gold layer. Alternatively, the metal trace 30 may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then removing the photoresist layers, then removing the seed layer not under the electroplated copper layer, and then removing the adhesion/barrier layer not under the electroplated copper layer. Alternatively, the metal trace 30 may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then electroplating a nickel layer having a thickness of between 1 and 10 microns on the electroplated copper layer in the opening in the photoresist layer, then removing the photoresist layers, then removing the seed layer not under the electroplated copper layer, and then removing the adhesion/barrier layer not under the electroplated copper layer. Alternatively, the metal trace 30 may be formed by sputtering a titanium-containing layer, such as titanium layer or titanium-tungsten-alloy layer, having a thickness of between 0.01 and 0.7 microns, and preferably of between 0.03 and 0.35 microns, on the aluminum-containing layer of the metal cap 18 on the pad 16, principally made of electroplated copper, exposed by the opening 28a, and on the polymer layer 28, then sputtering a seed layer, such as copper, having a thickness of between 0.03 and 1 microns, and preferably of between 0.05 and 0.5 microns, on the adhesion/barrier layer, then forming a photoresist layer on the seed layer, an opening in the photoresist layer with a trace pattern exposing the seed layer, then electroplating a copper layer having a thickness of between 1 and 20 microns, and preferably of between 2 and 15 microns, on the seed layer exposed by the opening in the photoresist layer, then electroplating a nickel layer having a thickness of between 1 and 10 microns on the electroplated copper layer in the opening in the photoresist layer, then electroplating a gold layer having a thickness of between 0.01 and 3 microns on the electroplated nickel layer in the opening in the photoresist layer, then removing the photoresist layers, then removing the seed layer not under the electroplated copper layer, and then removing the adhesion/barrier layer not under the electroplated copper layer.

Referring to FIG. 4E, after the metal trace 30 is formed, a polymer layer 32 can be formed on the metal trace 30 and on the polymer layer 28, an opening 32a in the polymer layer 32 exposing a pad of the metal trace 30. From a top perspective view, the position of the pad exposed by the opening 32a may be different from that of the metal cap 18 to which the metal trace 30 is connected. The polymer layer 32 can be formed by spin-on coating a positive-type photosensitive polyimide layer having a thickness of between 3 and 50 μm, and preferably of between 6 and 24 μm, on the polymer layer 28 and on the metal trace 30, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer, an opening in the developed polyimide layer exposing the pad of the metal trace 30, then curing or heating the developed polyimide layer at a peak temperature of between 250 and 400° C. for a time of between 30 and 200 minutes, or at a temperature of more than 400° C. for a time of less than 30 minutes, in a nitrogen ambient or in an oxygen-free ambient, the cured polyimide layer having a thickness of between 3 and 26 μm, and preferably between 3 and 15 μm, and then removing the residual polymeric material or other contaminants on the pad of the metal trace 30 exposed by the opening in the cured polyimide layer with an $O_2$ plasma or a plasma containing fluorine of below 200 PPM and oxygen, such that the polyimide layer can be patterned with at least one opening 32a in the polyimide layer exposing at least one pad of the metal trace 30. Next, the metal bump 22 having a thickness of between 5 and 150 μm, and preferably of between 20 and 50 μm, is formed on the metal trace 30 exposed by the opening 32a. The method for forming the metal bump 22 on the pad exposed by the opening 32a can be referred to the above description, as illustrated in FIGS. 2A-a through 2A-g, of forming the metal bump 22 on the pad 16 exposed by the opening 14a. The metal bump 22 shown in FIG. 4E can be formed by sputtering the adhesion/barrier layer 102 on the pad exposed by the opening 32a and on the polymer layer 32, followed by the steps shown in FIGS. 2A-b through 2A-g.

In the present invention, alternatively, multiple polymer layers can be formed over the passivation layer 14, and multiple metal traces are on the polymer layers, respectively. The metal bump 22 is formed on the top metal trace. These metal traces is connected to each other, and the bottom metal trace is connected to at least one pad 16 exposed by at least one opening or connected to at least one metal cap 18.

Figure 5:
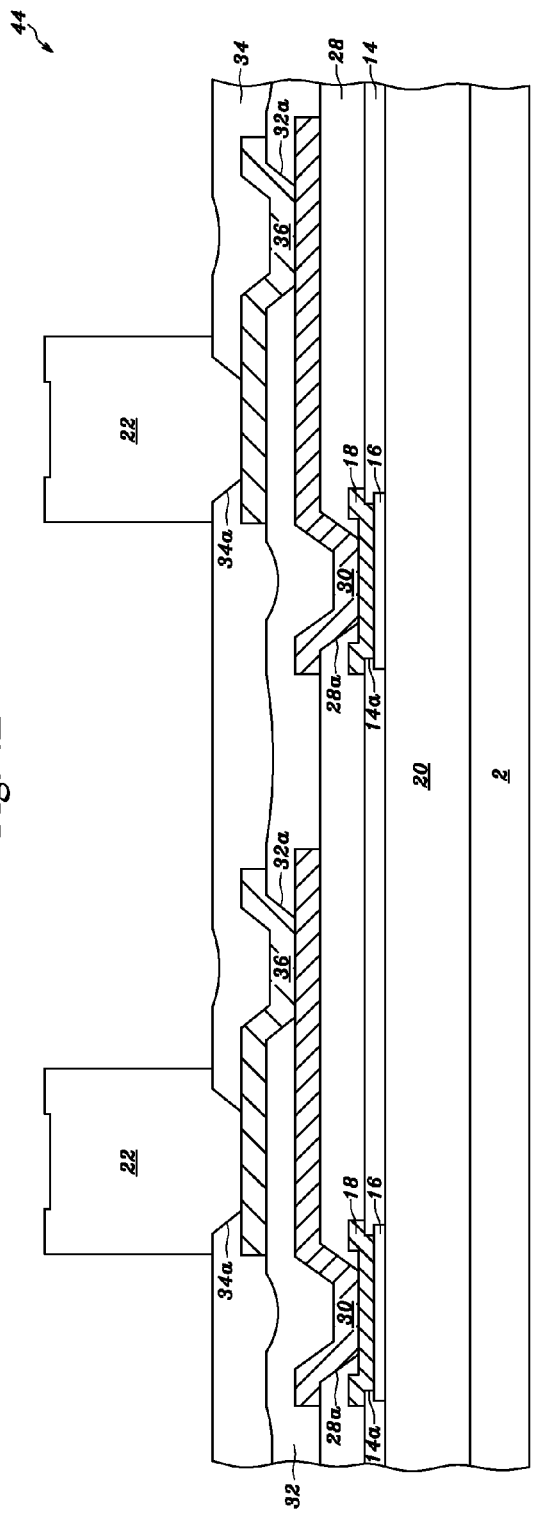
FIG. 5 is cross-sectional view showing a metal bump formed over a semiconductor substrate of a semiconductor wafer.

Referring to FIG. 5, a polymer layer 28, a bottommost polymer layer over the passivation layer 14, is formed on the passivation layer 14, an opening 28a in the polymer layer 28 exposing the aluminum-containing layer of the metal cap 18. The method of forming the polymer layer 28 shown in FIG. 5 on the passivation layer 12 and the structure thereof can be referred to the method of forming the polymer layer 28 shown in FIG. 4A or 4B on the passivation layer 12 and the structure thereof.

Next, referring to FIG. 5, a metal trace 30 is formed on the aluminum-containing layer of the metal cap 18 exposed by the opening 28a and on the polymer layer 28. The method of forming the metal trace 30 shown in FIG. 5 on the polymer layer 28 and the structure of thereof can be referred to that of forming the metal trace 30 shown in FIG. 4E on the polymer layer 28. Next, referring to FIG. 5, a polymer layer 32 is formed on the metal trace 30 and on the polymer layer 28, an opening 32a in the polymer layer 32 exposing the metal trace 30. From a top perspective view, the position of the metal trace 30 exposed by the opening 32a may be different from that of the metal cap 18 to which the metal trace 30 is connected. The method of forming the polymer layer 32 shown in FIG. 5 on the metal trace 30 and on the polymer layer 28 and the structure thereof can be referred to the method of forming the polymer layer 32 shown in FIG. 4A or 4B on the metal trace 30 and on the polymer layer 28 and the structure thereof.

Next, referring to FIG. 5, a metal trace 36 is formed on the metal trace 30 exposed by the opening 32a and on the polymer layer 32. The method of forming the metal trace 36 shown in FIG. 5 on the polymer layer 32 and the structure of thereof can be referred to that of forming the metal trace 30 shown in FIG. 4E on the polymer layer 28.

Next, referring to FIG. 5, a polymer layer 34, a topmost polymer layer over the passivation layer 14, is formed on the metal trace 36 and on the polymer layer 32, an opening 34a in the polymer layer 34 exposing a pad of the metal trace 36. From a top perspective view, the position of the pad of the metal trace 36 exposed by the opening 34a may be different from that of the metal cap 18. The method of forming the polymer layer 34 shown in FIG. 5 on the metal trace 36 and on the polymer layer 32 and the structure thereof can be referred to the method of forming the polymer layer 32 shown in FIG. 4A or 4B on the metal trace 30 and on the polymer layer 28 and the structure thereof.

Next, referring to FIG. 5, a metal bump 22 is formed on the pad of the metal trace 36 exposed by the opening 34a. The method of forming the metal bump 22 shown in FIG. 5 on the pad of the metal trace 36 and the structure thereof can be referred to the method of forming the metal bump 32 shown in FIG. 4E on a pad of the metal trace 30 exposed by the opening 32a and the structure thereof.

The material of the metal trace 36 may include gold, copper or nickel. For example, the metal trace 36 may comprise a gold layer with a thickness of between 2 and 15 μm on the metal trace 30 exposed by the opening 32a and on the polymer layer 32. Alternatively, the metal trace 36 may comprise a copper layer with a thickness of between 2 and 15 μm on the metal trace 30 exposed by the opening 32a and on the polymer layer 32. Alternatively, the metal trace 36 may comprise a copper layer having a thickness of between 1 and 20 μm on the metal trace 30 exposed by the opening 32a and on the polymer layer 32, a nickel layer having a thickness of between 0.5 and 5 μm on the copper layer, and a gold layer having a thickness of between 0.01 and 5 μm on the nickel layer.

The material of the polymer layer 34 may include benzocyclobutane (BCB), polyimide (PI), polyurethane, epoxy resin, a parylene-based polymer, a solder-mask material, an elastomer, or a porous dielectric material. The polymer layer 34 has a thickness of between 3 and 25 μm. For example, the polymer layer 34 may be a polyimide (PI) layer having a thickness of between 3 and 25 μm on the metal trace 36 and on the polymer layer 32. Alternatively, the polymer layer 34 may be a benzocyclobutane (BCB) layer having a thickness of between 3 and 25 μm on the metal trace 36 and on the polymer layer 32. Alternatively, the polymer layer 34 may be an epoxy resin layer having a thickness of between 3 and 25 μm on the metal trace 36 and on the polymer layer 32. The polymer layer 34 can be formed by a spin-on coating process, a lamination process or a screen-printing process.

After the metal bumps 22 are formed over the semiconductor wafer, as shown in FIGS. 2A-2C, 2E, 2F, 2H, 2I, 3C, 3D, 3F, 3G, 4B, 4D, 4E and 5, the semiconductor wafer can be separated into multiple individual semiconductor chips 44, integrated circuit chips, by a laser cutting process or by a mechanical cutting process. These semiconductor chips 44 can be packaged using the following steps as shown in FIGS. 6A-6Y, 7A-7J, 8A-8M and 9A-9L.

Below, referring to FIGS. 6A-6Y, 7A-7J, 8A-8M and 9A-9L, the scheme 38 over the semiconductor substrate 2 except for the metal bump 22 may be any one of the structures shown in FIGS. 2A-2C, FIGS. 2E-2F, FIGS. 2H-2I, FIGS. 3C-3D, FIGS. 3F-3G, FIG. 4B, FIGS. 4D-4E and FIG. 5 over the semiconductor substrate 2 except for the metal bump 22; the scheme 38 represents the combination of the scheme 20, the passivation layer 14, the opening 14a and the pad 16 in FIG. 2A, or the scheme 38 represents the combination of the scheme 20, the passivation layer 14, the opening 14a, the pad 16 and the metal cap 18 in FIG. 2B and FIG. 2C, or the scheme 38 represents the combination of the scheme 20, the passivation layer 14, the opening 14a, the pad 16 and the metal trace 24 in FIG. 2E, or the scheme 38 represents the combination of the scheme 20, the passivation layer 14, the opening 14a, the pad 16, the metal trace 24, the polymer layer 26 and the opening 26a in FIG. 2F, or the scheme 38 represents the combination of the scheme 20, the passivation layer 14, the opening 14a, the pad 16, the metal cap 18 and the metal trace 24 in FIG. 2H, or the scheme 38 represents the combination of the scheme 20, the passivation layer 14, the opening 14a, the pad 16, the metal cap 18, the metal trace 24, the polymer layer 26 and the opening 26a in FIG. 2I, or the scheme 38 represents the combination of the scheme 20, the passivation layer 14, the opening 14a, the pad 16, the polymer layer 28 and the opening 28a in FIG. 3C and FIG. 3D, or the scheme 38 represents the combination of the scheme 20, the passivation layer 14, the opening 14a, the pad 16, the polymer layer 28, the opening 28a and the metal trace 30 in FIG. 3F, or the scheme 38 represents the combination of the scheme 20, the passivation layer 14, the opening 14a, the pad 16, the polymer layer 28, the opening 28a, the metal trace 30, the polymer layer 32 and the opening 32a in FIG. 3G, or the scheme 38 represents the combination of the scheme 20, the passivation layer 14, the opening 14a, the pad 16, the metal cap 18, the polymer layer 28 and the opening 28a in FIG. 4B, or the scheme 38 represents the combination of the scheme 20, the passivation layer 14, the opening 14a, the pad 16, the metal cap 18, the polymer layer 28, the opening 28a and the metal trace 30 in FIG. 4D, or the scheme 38 represents the combination of the scheme 20, the passivation layer 14, the opening 14a, the pad 16, the metal cap 18, the polymer layer 28, the opening 28a, the metal trace 30, the polymer layer 32 and the opening 32a in FIG. 4E, or the scheme 38 represents the combination of the scheme 20, the passivation layer 14, the opening 14a, the pad 16, the metal cap 18, the polymer layer 28, the opening 28a, the metal trace 30, the polymer layer 32, the opening 32a, the polymer layer 34, the opening 34a and the metal trace 36 in FIG. 5.

Embodiment 1

Figure 6A:
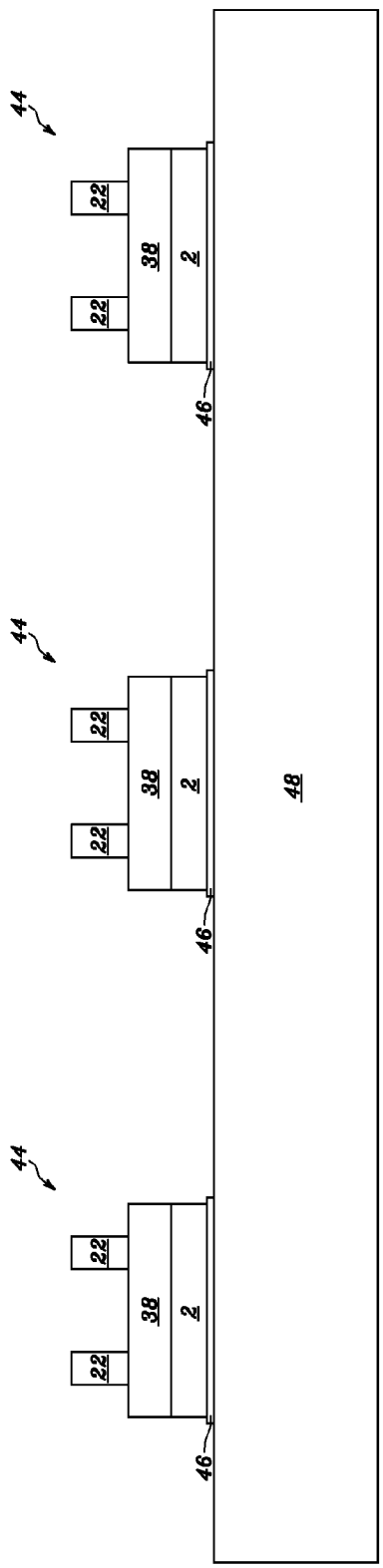
FIGS. 6A through 6Y are cross-sectional views showing a process according to one embodiment of the present invention.

Referring to FIG. 6A, a glue material 46 is first formed on multiple regions of a substrate 48 by a dispensing process to form multiple glue portions on the substrate 48. Next, multiple semiconductor chips 44 are respectively mounted onto the glue material 46 to be adhered to the substrate 48, and then the glue material 46 is baked at a temperature of between 100 and 200° C. In another word, the semiconductor substrate 2 of the semiconductor chip 44 can be adhered to the substrate 48 using the glue material 46.

The material of the glue material 46 may be polymer material, such as polyimide or epoxy resin, and the thickness of the glue material 46 is between 1 and 50 μm. For example, the glue material 46 may be polyimide having a thickness of between 1 and 50 μm. Alternatively, the glue material 46 may be epoxy resin having a thickness of between 1 and 50 μm. Therefore, the semiconductor chips 44 can be adhered to the substrate 48 using polyimide. Alternatively, the semiconductor chips 44 can be adhered to the substrate 48 using epoxy resin.

Figure 6B:
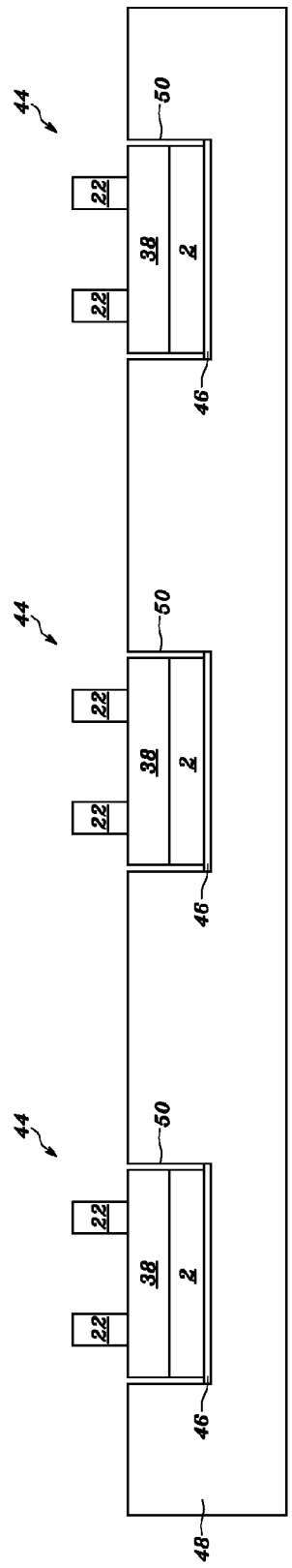

Referring to FIG. 6B, multiple cavities 50 may be formed in the substrate 48 using a mechanical drilling process, a laser drilling process or an etching process. Next, a glue material 46 can be formed on the surfaces of the cavities 50 in the substrate 48 by a dispensing process to form multiple glue portions in the cavities 50. Next, multiple semiconductor chips 44 are respectively mounted onto the glue portions 46 in the cavities 50 to be adhered to the surfaces of the cavities 50 in the substrate 48, and then the glue material 46 is baked at a temperature of between 100 and 200° C. In another word, the semiconductor substrate 2 of the semiconductor chip 44 can be adhered to the surfaces of the cavities 50 in the substrate 48 using the glue material 46. Therefore, the semiconductor chips 44 can be adhered to the surfaces of the cavities 50 in the substrate 48 using polyimide. Alternatively, the semiconductor chips 44 can be adhered to the surfaces of the cavities 50 in the substrate 48 using epoxy resin.

In FIGS. 6A and 6B, the substrate 48 may be a ball grid array (BGA) substrate with a thickness of between 200 and 2,000 μm. Alternatively, the substrate 48 may be a glass fiber reinforced epoxy based substrate with a thickness of between 200 and 2,000 μm. Alternatively, the substrate 48 may be a glass substrate with a thickness of between 200 and 2,000 μm. Alternatively, the substrate 48 may be a silicon substrate with a thickness of between 200 and 2,000 μm. Alternatively, the substrate 48 may be a ceramic substrate with a thickness of between 200 and 2,000 μm. Alternatively, the substrate 48 may be an organic substrate with a thickness of between 200 and 2,000 μm. Alternatively, the substrate 48 may be a metal substrate, comprising aluminum, with a thickness of between 200 and 2,000 μm. Alternatively, the substrate 48 may be a metal substrate, comprising copper, with a thickness of between 200 and 2,000 μm. The substrate 48 may have no metal trace in the substrate 48, but may have a function for carrying the semiconductor chips 44. When the substrate 48 is a metal substrate, the substrate 48 can be regarded as a heat sink.

Referring to FIG. 6C, a polymer material 52 having a thickness t5 of between 250 and 1,000 µm is formed on the substrate 48, on the semiconductor chips 44 and enclosing the metal bumps 22 of the semiconductor chips 44. The polymer material 52 can be formed by molding benzocyclobutane (BCB), polyimide (PI) or an epoxy-based material, by dispensing benzocyclobutane (BCB), polyimide (PI) or an epoxy-based material, by coating benzocyclobutane (BCB), polyimide (PI) or an epoxy-based material, by printing benzocyclobutane (BCB), polyimide (PI) or an epoxy-based material, or by laminating benzocyclobutane (BCB), polyimide (PI) or an epoxy-based material.

For example, the polymer material 52 can be formed by molding an epoxy-based material having a thickness t5 of between 250 and 1,000 µm on the substrate 48, on the semiconductor chips 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by molding polyimide or benzocyclobutane having a thickness t5 of between 250 and 1,000 µm on the substrate 48, on the semiconductor chips 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5.

For example, the polymer material 52 can be formed by dispensing polyimide or benzocyclobutane having a thickness t5 of between 250 and 1,000 µm on the substrate 48, on the semiconductor chips 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5.

Referring to FIG. 6D, a top surface of the polymer material 52 is polished to uncover a top surface of the metal bump 22 and to planarize a top surface of the polymer material 52, preferably by a mechanical polishing process. Alternatively, the top surface of the polymer material 52 is polished by a chemical mechanical polishing (CMP) process. When the polymer material 52 is being polished, the top portion of the metal bump 22 is allowed to be removed such that the metal bump 22, after being polished, may have a thickness t6 between 10 and 30 microns.

Figure 6E:
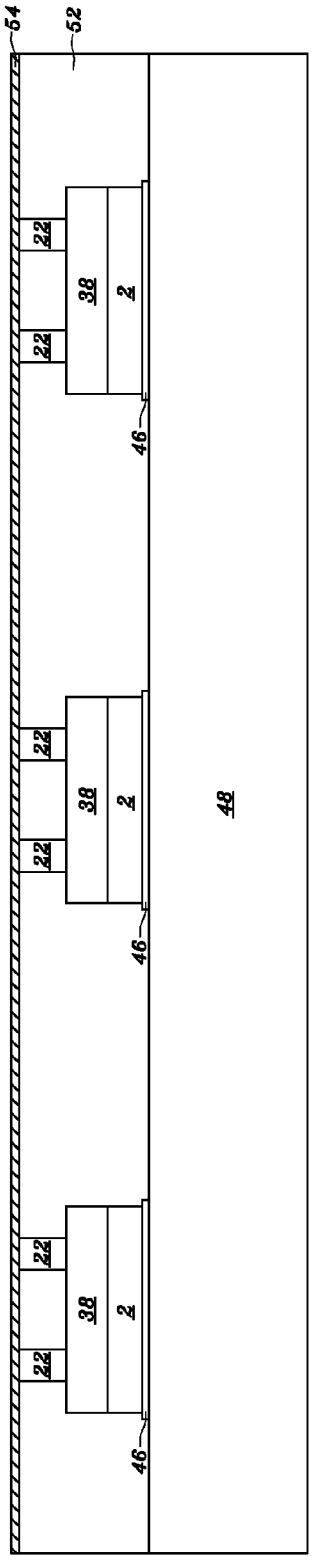

Next, referring to FIG. 6E, a metal layer 54 can be sputtered on the polymer material 52 and on a top surface of the metal bump 22. Alternatively, the metal layer 54 may be formed by an electroless plating process. The metal layer 54 can be formed of an adhesion/barrier layer having a thickness of between 0.03 and 1 µm on the polymer material 52 and on the top surface of the metal bump 22, and a seed layer having a thickness of between 0.05 and 2 µm, and preferably of between 0.1 and 1 µm, on the adhesion/barrier layer. Alternatively, the metal layer 54 can be formed of a seed layer having a thickness of between 0.05 and 2 µm, and preferably of between 0.1 and 1 µm, on the polymer material 52 and on the top surface of the metal bump 22. The material of the adhesion/barrier layer may include titanium, a titanium-tungsten alloy, titanium nitride, chromium, or tantalum nitride. The material of the seed layer may include gold, copper or silver.

For example, the metal layer 54 can be formed by sputtering a titanium layer having a thickness of between 0.03 and 1 µm on the polymer material 52 and on an exposed gold layer of the metal bump 22, and then sputtering a gold layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed copper layer of the metal bump 22, and then sputtering a gold layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed silver layer of the metal bump 22, and then sputtering a gold layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed nickel layer of the metal bump 22, and then sputtering a gold layer having a thickness of between 0.05 and 2 µm, and preferably of between 0.1 and 1 µm, on the titanium layer.

For example, the metal layer 54 can be formed by sputtering a titanium-tungsten-alloy layer having a thickness of between 0.03 and 1 µm on the polymer material 52 and on an exposed gold layer of the metal bump 22, and then sputtering a gold layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed copper layer of the metal bump 22, and then sputtering a gold layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed silver layer of the metal bump 22, and then sputtering a gold layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed nickel layer of the metal bump 22, and then sputtering a gold layer having a thickness of between 0.05 and 2 µm, and preferably of between 0.1 and 1 µm, on the titanium-tungsten-alloy layer.

For example, the metal layer 54 can be formed by sputtering a titanium-nitride layer having a thickness of between 0.03 and 1 µm on the polymer material 52 and on an exposed gold layer of the metal bump 22, and then sputtering a gold layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed copper layer of the metal bump 22, and then sputtering a gold layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed silver layer of the metal bump 22, and then sputtering a gold layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed nickel layer of the metal bump 22, and then sputtering a gold layer having a thickness of between 0.05 and 2 µm, and preferably of between 0.1 and 1 µm, on the titanium-nitride layer.

For example, the metal layer 54 can be formed by sputtering a chromium layer having a thickness of between 0.03 and 1 µm on the polymer material 52 and on an exposed gold layer of the metal bump 22, and then sputtering a gold layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 µm on the polymer material 52 and on an exposed copper layer of the metal bump 22 comprising copper, and then sputtering a gold layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 µm on the polymer material 52 and on an exposed silver layer of the metal bump 22, and then sputtering a gold layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 µm on the polymer material 52 and on an exposed nickel layer of the metal bump 22, and then sputtering a gold layer having a thickness of between 0.05 and 2 µm, and preferably of between 0.1 and 1 µm, on the chromium layer.

For example, the metal layer 54 can be formed by sputtering a tantalum-nitride layer having a thickness of between 0.03 and 1 µm on the polymer material 52 and on an exposed gold layer of the metal bump 22, and then sputtering a gold layer having a thickness of between 0.05 and 2 µm, and preferably of between 0.1 and 1 µm, on the tantalum-nitride layer. Alternatively, the metal layer 54 can be formed by sputtering a tantalum-nitride layer having a thickness of between 0.03 and 1 µm on the polymer material 52 and on an exposed copper layer of the metal bump 22, and then sputtering a gold layer having a thickness of between 0.05 and 2 µm, and preferably of between 0.1 and 1 µm, on the tantalum-nitride layer. Alternatively, the metal layer 54 can be formed by sputtering a tantalum-nitride layer having a thickness of between 0.03 and 1 µm on the polymer material 52 and on an exposed silver layer of the metal bump 22 comprising silver, and then sputtering a gold layer having a thickness of between 0.05 and 2 µm, and preferably of between 0.1 and 1 µm, on the tantalum-nitride layer. Alternatively, the metal layer 54 can be formed by sputtering a tantalum-nitride layer having a thickness of between 0.03 and 1 µm on the polymer material 52 and on an exposed nickel layer of the metal bump 22, and then sputtering a gold layer having a thickness of between 0.05 and 2 µm, and preferably of between 0.1 and 1 µm, on the tantalum-nitride layer.

For example, the metal layer 54 can be formed by sputtering a titanium layer having a thickness of between 0.03 and 1 µm on the polymer material 52 and on an exposed gold layer of the metal bump 22, and then sputtering a copper layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed copper layer of the metal bump 22, and then sputtering a copper layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed silver layer of the metal bump 22, and then sputtering a copper layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed nickel layer of the metal bump 22, and then sputtering a copper layer having a thickness of between 0.05 and 2 µm, and preferably of between 0.1 and 1 µm, on the titanium layer.

For example, the metal layer 54 can be formed by sputtering a titanium-tungsten-alloy layer having a thickness of between 0.03 and 1 µm on the polymer material 52 and on an exposed gold layer of the metal bump 22, and then sputtering a copper layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed copper layer of the metal bump 22, and then sputtering a copper layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed silver layer of the metal bump 22, and then sputtering a copper layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed nickel layer of the metal bump 22, and then sputtering a copper layer having a thickness of between 0.05 and 2 µm, and preferably of between 0.1 and 1 µm, on the titanium-tungsten-alloy layer.

For example, the metal layer 54 can be formed by sputtering a titanium-nitride layer having a thickness of between 0.03 and 1 µm on the polymer material 52 and on an exposed gold layer of the metal bump 22 comprising gold, and then sputtering a copper layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed copper layer of the metal bump 22, and then sputtering a copper layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed silver layer of the metal bump 22, and then sputtering a copper layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed nickel layer of the metal bump 22, and then sputtering a copper layer having a thickness of between 0.05 and 2 µm, and preferably of between 0.1 and 1 µm, on the titanium-nitride layer.

For example, the metal layer 54 can be formed by sputtering a chromium layer having a thickness of between 0.03 and 1 µm on the polymer material 52 and on an exposed gold layer of the metal bump 22, and then sputtering a copper layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 µm on the polymer material 52 and on an exposed copper layer of the metal bump 22, and then sputtering a copper layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 µm on the polymer material 52 and on an exposed silver layer of the metal bump 22, and then sputtering a copper layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 µm on the polymer material 52 and on an exposed nickel layer of the metal bump 22, and then sputtering a copper layer having a thickness of between 0.05 and 2 µm, and preferably of between 0.1 and 1 µm, on the chromium layer.

For example, the metal layer 54 can be formed by sputtering a tantalum-nitride layer having a thickness of between 0.03 and 1 µm on the polymer material 52 and on an exposed gold layer of the metal bump 22, and then sputtering a copper layer having a thickness of between 0.05 and 2 µm, and preferably of between 0.1 and 1 µm, on the tantalum-nitride layer. Alternatively, the metal layer 54 can be formed by sputtering a tantalum-nitride layer having a thickness of between 0.03 and 1 µm on the polymer material 52 and on an exposed copper layer of the metal bump 22, and then sputtering a copper layer having a thickness of between 0.05 and 2 µm, and preferably of between 0.1 and 1 µm, on the tantalum-nitride layer. Alternatively, the metal layer 54 can be formed by sputtering a tantalum-nitride layer having a thickness of between 0.03 and 1 µm on the polymer material 52 and on an exposed silver layer of the metal bump 22, and then sputtering a copper layer having a thickness of between 0.05 and 2 µm, and preferably of between 0.1 and 1 µm, on the tantalum-nitride layer. Alternatively, the metal layer 54 can be formed by sputtering a tantalum-nitride layer having a thickness of between 0.03 and 1 µm on the polymer material 52 and on an exposed nickel layer of the metal bump 22, and then sputtering a copper layer having a thickness of between 0.05 and 2 µm, and preferably of between 0.1 and 1 µm, on the tantalum-nitride layer.

For example, the metal layer 54 can be formed by sputtering a titanium layer having a thickness of between 0.03 and 1 µm on the polymer material 52 and on an exposed gold layer of the metal bump 22, and then sputtering a silver layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed copper layer of the metal bump 22, and then sputtering a silver layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed silver layer of the metal bump 22, and then sputtering a silver layer having a thickness of between 0.05 and 2 µm, and preferably of between 0.1 and 1 µm, on the titanium layer. Alternatively, the metal layer 54 can be formed by sputtering a titanium layer having a thickness of between 0.03 and 1 µm on the polymer material 52 and on an exposed nickel layer of the metal bump 22, and then sputtering a silver layer having a thickness of between 0.05 and 2 µm, and preferably of between 0.1 and 1 µm, on the titanium layer.

For example, the metal layer 54 can be formed by sputtering a titanium-tungsten-alloy layer having a thickness of between 0.03 and 1 µm on the polymer material 52 and on an exposed gold layer of the metal bump 22, and then sputtering a silver layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed copper layer of the metal bump 22, and then sputtering a silver layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed silver layer of the metal bump 22, and then sputtering a silver layer having a thickness of between 0.05 and 2 µm, and preferably of between 0.1 and 1 µm, on the titanium-tungsten-alloy layer. Alternatively, the metal layer 54 can be formed by sputtering a titanium-tungsten-alloy layer having a thickness of between 0.03 and 1 µm on the polymer material 52 and on an exposed nickel layer of the metal bump 22, and then sputtering a silver layer having a thickness of between 0.05 and 2 µm, and preferably of between 0.1 and 1 µm, on the titanium-tungsten-alloy layer.

For example, the metal layer 54 can be formed by sputtering a titanium-nitride layer having a thickness of between 0.03 and 1 µm on the polymer material 52 and on an exposed gold layer of the metal bump 22, and then sputtering a silver layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed copper layer of the metal bump 22, and then sputtering a silver layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed silver layer of the metal bump 22, and then sputtering a silver layer having a thickness of between 0.05 and 2 µm, and preferably of between 0.1 and 1 µm, on the titanium-nitride layer. Alternatively, the metal layer 54 can be formed by sputtering a titanium-nitride layer having a thickness of between 0.03 and 1 µm on the polymer material 52 and on an exposed nickel layer of the metal bump 22, and then sputtering a silver layer having a thickness of between 0.05 and 2 µm, and preferably of between 0.1 and 1 µm, on the titanium-nitride layer.

For example, the metal layer 54 can be formed by sputtering a chromium layer having a thickness of between 0.03 and 1 µm on the polymer material 52 and on an exposed gold layer of the metal bump 22, and then sputtering a silver layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 µm on the polymer material 52 and on an exposed copper layer of the metal bump 22, and then sputtering a silver layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 µm on the polymer material 52 and on an exposed silver layer of the metal bump 22, and then sputtering a silver layer having a thickness of between 0.05 and 2 µm, and preferably of between 0.1 and 1 µm, on the chromium layer. Alternatively, the metal layer 54 can be formed by sputtering a chromium layer having a thickness of between 0.03 and 1 μm on the polymer material 52 and on an exposed nickel layer of the metal bump 22, and then sputtering a silver layer having a thickness of between 0.05 and 2 μm, and preferably of between 0.1 and 1 μm, on the chromium layer.

For example, the metal layer 54 can be formed by sputtering a tantalum-nitride layer having a thickness of between 0.03 and 1 μm on the polymer material 52 and on an exposed gold layer of the metal bump 22, and then sputtering a silver layer having a thickness of between 0.05 and 2 μm, and preferably of between 0.1 and 1 μm, on the tantalum-nitride layer. Alternatively, the metal layer 54 can be formed by sputtering a tantalum-nitride layer having a thickness of between 0.03 and 1 μm on the polymer material 52 and on an exposed copper layer of the metal bump 22, and then sputtering a silver layer having a thickness of between 0.05 and 2 μm, and preferably of between 0.1 and 1 μm, on the tantalum-nitride layer. Alternatively, the metal layer 54 can be formed by sputtering a tantalum-nitride layer having a thickness of between 0.03 and 1 μm on the polymer material 52 and on an exposed silver layer of the metal bump 22, and then sputtering a silver layer having a thickness of between 0.05 and 2 μm, and preferably of between 0.1 and 1 μm, on the tantalum-nitride layer. Alternatively, the metal layer 54 can be formed by sputtering a tantalum-nitride layer having a thickness of between 0.03 and 1 μm on the polymer material 52 and on an exposed nickel layer of the metal bump 22, and then sputtering a silver layer having a thickness of between 0.05 and 2 μm, and preferably of between 0.1 and 1 μm, on the tantalum-nitride layer.

For example, the metal layer 54 can be formed by sputtering a gold layer having a thickness of between 0.05 and 2 μm, and preferably of between 0.1 and 1 μm, on the polymer material 52 and on an exposed gold layer of the metal bump 22. Alternatively, the metal layer 54 can be formed by sputtering a copper layer having a thickness of between 0.05 and 2 μm, and preferably of between 0.1 and 1 μm, on the polymer material 52 and on an exposed gold layer of the metal bump 22. Alternatively, the metal layer 54 can be formed by sputtering a silver layer having a thickness of between 0.05 and 2 μm, and preferably of between 0.1 and 1 μm, on the polymer material 52 and on an exposed gold layer of the metal bump 22.

For example, the metal layer 54 can be formed by sputtering a gold layer having a thickness of between 0.05 and 2 μm, and preferably of between 0.1 and 1 μm, on the polymer material 52 and on an exposed copper layer of the metal bump 22. Alternatively, the metal layer 54 can be formed by sputtering a copper layer having a thickness of between 0.05 and 2 μm, and preferably of between 0.1 and 1 μm, on the polymer material 52 and on an exposed copper layer of the metal bump 22. Alternatively, the metal layer 54 can be formed by sputtering a silver layer having a thickness of between 0.05 and 2 μm, and preferably of between 0.1 and 1 μm, on the polymer material 52 and on an exposed copper layer of the metal bump 22.

For example, the metal layer 54 can be formed by sputtering a gold layer having a thickness of between 0.05 and 2 μm, and preferably of between 0.1 and 1 μm, on the polymer material 52 and on an exposed nickel layer of the metal bump 22. Alternatively, the metal layer 54 can be formed by sputtering a copper layer having a thickness of between 0.05 and 2 μm, and preferably of between 0.1 and 1 μm, on the polymer material 52 and on an exposed nickel layer of the metal bump 22. Alternatively, the metal layer 54 can be formed by sputtering a silver layer having a thickness of between 0.05 and 2 μm, and preferably of between 0.1 and 1 μm, on the polymer material 52 and on an exposed nickel layer of the metal bump 22.

Figure 6F:
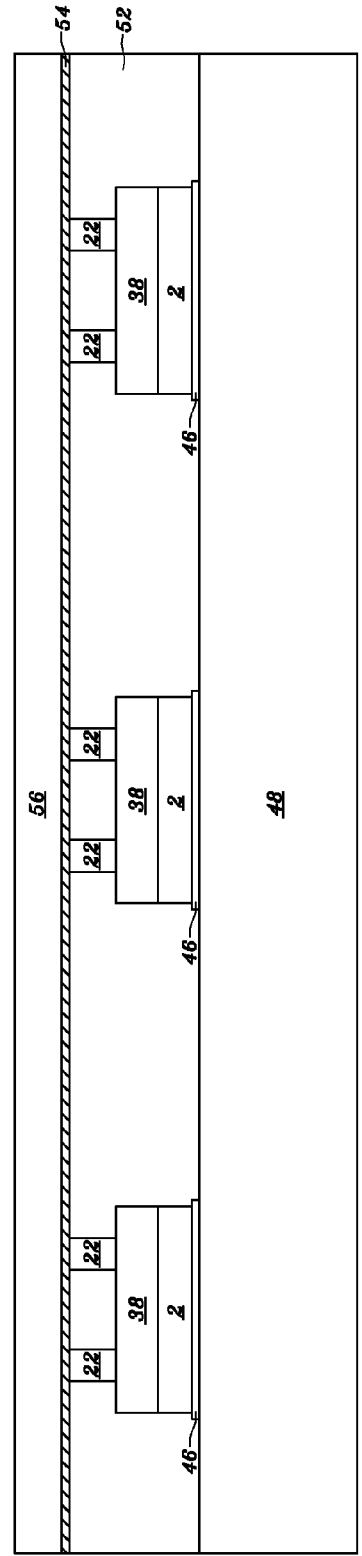
Figure 6G:
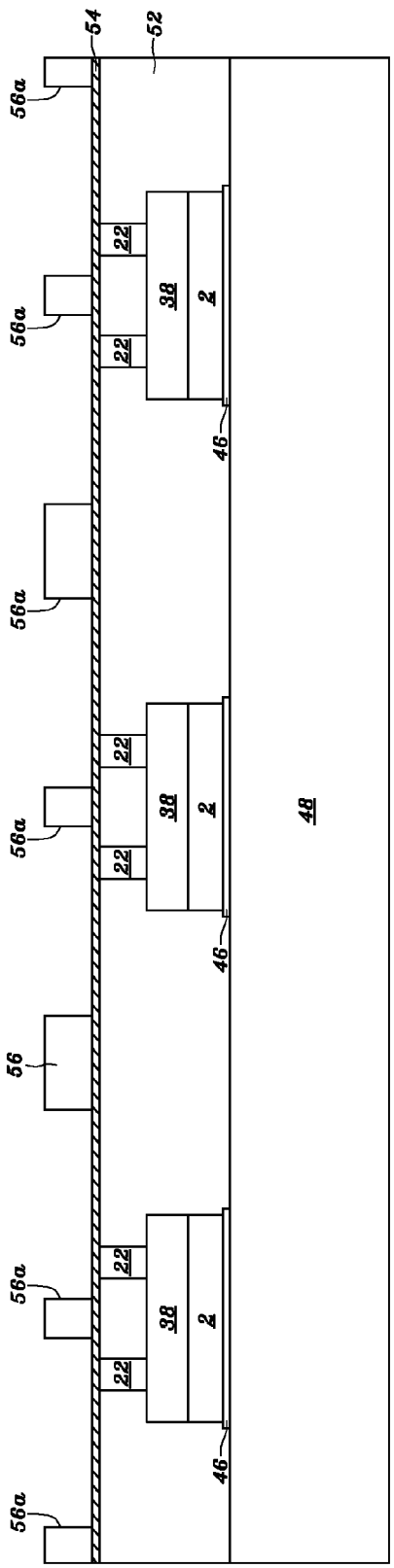

Next, referring to FIG. 6F, a photoresist layer 56, such as positive type photoresist or negative type photoresist, having a thickness of between 10 and 120 μm is formed on the metal layer 54 via a coating process, a spraying process or a lamination process. Referring to FIG. 6G, the photoresist layer 56 is patterned with the processes of exposure, development, etc., to form an opening 56a in the photoresist layer 56 exposing the metal layer 54. A 1× stepper or 1× contact aligner can be used to expose the photoresist layer 56 during the process of exposure. However, some residuals from the photoresist layer 56 could remain on the metal layer 54 exposed by the opening 56a. Thereafter, the residuals can be removed from the metal layer 54 exposed by the opening 56a with a plasma, such as $O_2$ plasma or plasma containing fluorine of below 200 PPM and oxygen.

For example, the photoresist layer 56 can be formed by coating a positive-type photosensitive polymer layer having a thickness of between 5 and 150 μm, and preferably of between 20 and 50 μm, on the above-mentioned copper layer, gold layer or silver layer of the metal layer 54, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the metal layer 54 with an $O_2$ plasma or a plasma containing fluorine of below 200 PPM and oxygen, such that the photoresist layer 56 can be patterned with an opening 56a in the photoresist layer 56 exposing the metal layer 54.

For example, the photoresist layer 56 can be formed by coating a positive type photoresist on the above-mentioned gold layer of the metal layer 54, and then patterning the positive type photoresist with the processes of exposure, development, etc., to form an opening in the positive type photoresist exposing the above-mentioned gold layer of the metal layer 54. Alternatively, the photoresist layer 56 can be formed by coating a positive type photoresist on the above-mentioned copper layer of the metal layer 54, and then patterning the positive type photoresist with the processes of exposure, development, etc., to form an opening in the positive type photoresist exposing the above-mentioned copper layer of the metal layer 54. Alternatively, the photoresist layer 56 can be formed by laminating a positive type photoresist on the above-mentioned gold layer of the metal layer 54, and then patterning the positive type photoresist with the processes of exposure, development, etc., to form an opening in the positive type photoresist exposing the above-mentioned gold layer of the metal layer 54. Alternatively, the photoresist layer 56 can be formed by laminating a positive type photoresist on the above-mentioned copper layer of the metal layer 54, and then patterning the positive type photoresist with the processes of exposure, development, etc., to form an opening in the positive type photoresist exposing the above-mentioned copper layer of the metal layer 54.

Figure 6H:
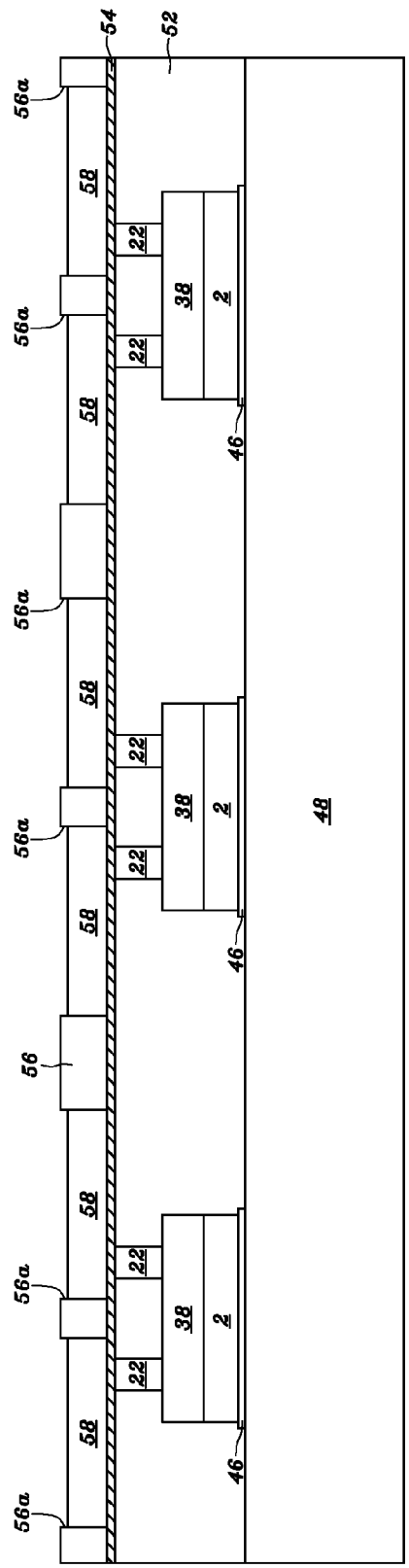

Referring to FIG. 6H, a metal layer 58 having a thickness of between 5 and 100 μm, and preferably of between 10 and 30 μm, is electroplated on the metal layer 54 exposed by the opening 56a. The material of the metal layer 58 may include gold, copper, silver or nickel. For example, the metal layer 58 can be formed by electroplating a gold layer having a thickness of between 5 and 100 μm, and preferably of between 10 and 30 μm, on the gold layer of the metal layer 54 exposed by the opening 56a. Alternatively, the metal layer 58 can be formed by electroplating a copper layer having a thickness of between 5 and 100 μm, and preferably of between 10 and 30 μm, on the copper layer of the metal layer 54 exposed by the opening 56a. Alternatively, the metal layer 58 can be formed by electroplating a silver layer having a thickness of between 5 and 100 μm, and preferably of between 10 and 30 μm, on the silver layer of the metal layer 54 exposed by the opening 56a. Alternatively, the metal layer 58 can be formed by electroplating a copper layer having a thickness of between 5 and 100 μm, and preferably of between 10 and 30 μm, on the copper layer of the metal layer 54 exposed by the opening 56a, and then electroplating a nickel layer having a thickness of between 1 and 10 microns on the electroplated copper layer in the opening 56a, wherein the thickness of the electroplated copper layer, in the opening 56a, plus the nickel layer is between 5 and 100 μm, and preferably of between 10 and 30 μm. Alternatively, the metal layer 58 can be formed by electroplating a copper layer having a thickness of between 5 and 100 μm, and preferably of between 10 and 30 μm, on the copper layer of the metal layer 54 exposed by the opening 56a, then electroplating a nickel layer having a thickness of between 1 and 10 microns on the electroplated copper layer in the opening 56a, and then electroplating a gold layer having a thickness of between 0.5 and 5 microns on the nickel in the opening 56a, wherein the thickness of the electroplated copper layer, in the opening 56a, the nickel layer and the gold layer is between 5 and 100 μm, and preferably of between 10 and 30 μm.

Next, referring to FIG. 6I, after the metal layer 58 is formed, most of the photoresist layer 56 can be removed using an organic solution with amide. However, some residuals from the photoresist layer 56 could remain on the metal layer 58 and on the metal layer 54. Thereafter, the residuals can be removed from the metal layer 58 and from the metal layer 54 with a plasma, such as $O_2$ plasma or plasma containing fluorine of below 200 PPM and oxygen.

Next, referring to FIG. 6J, the metal layer 54 not under the metal layer 58 is removed with a dry etching method or a wet etching method. As to the wet etching method, when the metal layer 54 comprises a titanium-tungsten-alloy layer, the titanium-tungsten-alloy layer can be etched with a solution containing hydrogen peroxide; when the metal layer 54 comprises a titanium layer, the titanium layer can be etched with a solution containing hydrogen fluoride; when the metal layer 54 comprises a gold layer, the gold layer can be etched with an iodine-containing solution, such as solution containing potassium iodide; when the metal layer 54 comprises a copper layer, the copper layer can be etched with a solution containing NH4OH. As to the dry etching method, when the metal layer 54 comprises a titanium layer or a titanium-tungsten-alloy layer, the titanium layer or the titanium-tungsten-alloy layer can be etched with a chlorine-containing plasma etching process or with an RIE process; when the metal layer 54 comprises is a gold layer, the gold layer can be removed with an ion milling process or with an Ar sputtering etching process. Generally, the dry etching method to etch the metal layer 54 not under the metal layer 58 may include a chemical plasma etching process, a sputtering etching process, such as argon sputter process, or a chemical vapor etching process.

Thereby, in this embodiment, a patterned circuit layer 60 can be formed on the polymer material 52 and on a top surface of the metal bump 22. The patterned circuit layer 60 can be formed of the metal layer 54 and the electroplated metal layer 58 on the metal layer 54.

Next, referring to FIG. 6K, an insulating layer 62 having a thickness of between 15 and 150 μm can be formed on the polymer material 52 and on the patterned circuit layer 60 via a coating process, a spraying process or a lamination process. The material of the insulating layer 62 may be polymer material, such as epoxy resin, benzocyclobutene (BCB) or polyimide. Next, referring to FIG. 6L, the insulating layer 62 is patterned with a laser drill process or the processes of exposure, development, etc., to form an opening 62a in the insulating layer 62 exposing the patterned circuit layer 60. For example, the insulating layer 62 can be formed by coating or laminating an epoxy resin layer having a thickness of between 15 and 150 μm on the polymer material 52 and on the patterned circuit layer 60, and then patterning the epoxy resin layer with a laser drill process to form an opening in the epoxy resin layer exposing the patterned circuit layer 60. Alternatively, the insulating layer 62 can be formed by coating or laminating a photo sensitive epoxy resin layer having a thickness of between 15 and 150 μm on the polymer material 52 and on the patterned circuit layer 60, and then patterning the photo sensitive epoxy resin layer with the processes of exposure, development, etc., to form an opening in the epoxy resin layer exposing the patterned circuit layer 60.

However, some residuals from the insulating layer 62 could remain on the patterned circuit layer 60 exposed by the opening 62a. Thereafter, the residuals can be removed from the patterned circuit layer 60 exposed by the opening 62a with a plasma, such as $O_2$ plasma or plasma containing fluorine of below 200 PPM and oxygen.

Next, referring to FIG. 6M, a tin-containing ball 64 with a diameter of between 0.25 and 1.2 mm is formed over the patterned circuit layer 60 exposed by the opening 62a and connected to the patterned circuit layer 60 through the opening 62a. For example, a nickel layer having a thickness of between 0.05 and 5 microns can be electroless plated on the copper layer of the patterned circuit layer 60 exposed by the opening 62a; next, a gold layer having a thickness of between 0.05 and 2 microns is electroless plated on the nickel layer; and next, the tin-containing ball 64 is planted on the gold layer. Alternatively, the tin-containing ball 64 may be formed by planting a tin-lead-alloy ball on the gold layer of the patterned circuit layer 60 exposed by the opening 62a at a temperature of between 180 and 190° C. Alternatively, the tin-containing ball 64 can be formed by screen printing a tin-lead alloy on the gold layer of the patterned circuit layer 60 exposed by the opening 62a, and then heating or reflowing the tin-lead alloy at a temperature of between 180 and 190° C. Alternatively, the tin-containing ball 64 may be formed by planting a lead-free ball, such as tin-silver alloy or tin-silver-copper alloy, on the gold layer of the patterned circuit layer 60 exposed by the opening 62a at a temperature of between 200 and 250° C. Alternatively, the tin-containing ball 64 can be formed by screen printing a lead-free alloy, such as tin-silver alloy or tin-silver-copper alloy, on the gold layer of the patterned circuit layer 60 exposed by the opening 62a, and then heating or reflowing the lead-free alloy at a temperature of between 200 and 250° C.

Alternatively, the tin-containing ball 64 may be formed by planting a tin-lead-alloy ball on the copper layer of the patterned circuit layer 60 exposed by the opening 62a at a temperature of between 180 and 190° C. Alternatively, the tin-containing ball 64 can be formed by screen printing a tin-lead alloy on the copper layer of the patterned circuit layer 60 exposed by the opening 62a, and then heating or reflowing the tin-lead alloy at a temperature of between 180 and 190° C. Alternatively, the tin-containing ball 64 may be formed by planting a lead-free ball, such as tin-silver alloy or tin-silver-copper alloy, on the copper layer of the patterned circuit layer 60 exposed by the opening 62*a* at a temperature of between 200 and 250° C. Alternatively, the tin-containing ball 64 can be formed by screen printing a lead-free alloy, such as tin-silver alloy or tin-silver-copper alloy, on the copper layer of the patterned circuit layer 60 exposed by the opening 62*a*, and then heating or reflowing the lead-free alloy at a temperature of between 200 and 250° C.

Referring to FIG. 6N, after the tin-containing ball 64 is formed, the substrate 48, the polymer material 52 and the insulating layer 62 can be cutted into a plurality of chip packages 66 using a mechanical cutting process or using a laser cutting process.

In this embodiment, multiple patterned circuit layers and multiple insulating layers can be formed over the polymer material 52, wherein one of the insulating layers is between the neighboring two of the patterned circuit layers. These patterned circuit layers are connected to each other through multiple metal vias in the insulating layers. The tin-containing ball 64 can be formed over the topmost one of the patterned circuit layers, and the bottommost one of the patterned circuit layers can be connected to the metal bump 22. The following example is described for forming two patterned circuit layers. More than two patterned circuit layers can be referred to the following example.

Figure 6O:
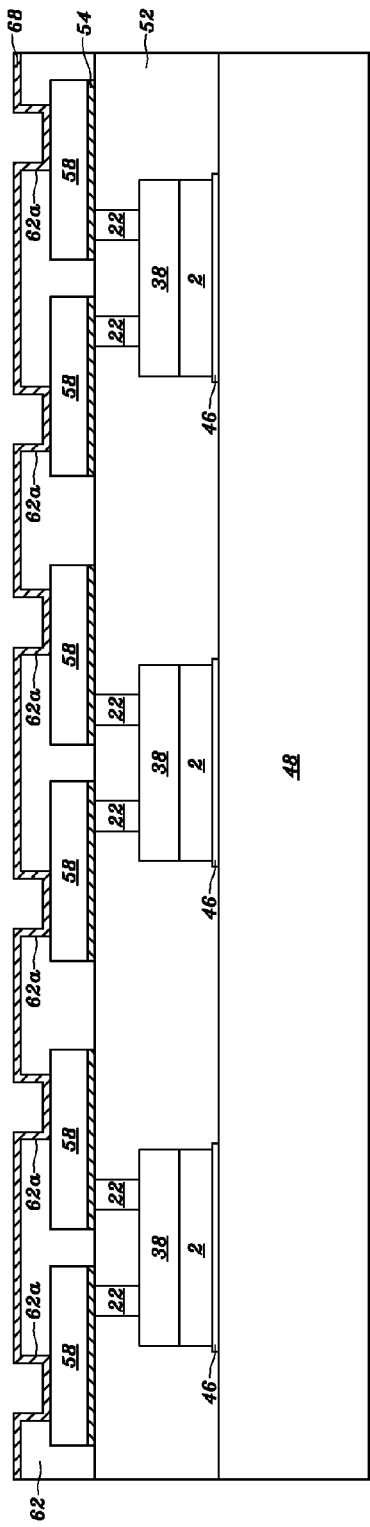

Referring to FIG. 6O, after the step shown in FIG. 6L, a metal layer 68 can be sputtered on the insulating layer 62 and on the patterned circuit layer 60 exposed by the opening 62*a*. Alternatively, the metal layer 68 may be formed by an electroless plating process. The metal layer 68 can be formed of an adhesion/barrier layer having a thickness of between 0.03 and 1 μm on the insulating layer 62 and on the patterned circuit layer 60 exposed by the opening 62*a*, and a seed layer having a thickness of between 0.05 and 2 μm, and preferably of between 0.1 and 1 μm, on the adhesion/barrier layer. Alternatively, the metal layer 68 can be formed of a seed layer having a thickness of between 0.05 and 2 μm, and preferably of between 0.1 and 1 μm, on the insulating layer 62 and on the patterned circuit layer 60 exposed by the opening 62*a*. The material of the adhesion/barrier layer may include titanium, a titanium-tungsten alloy, titanium nitride, chromium, or tantalum nitride. The material of the seed layer may include gold, copper or silver.

For example, the metal layer 68 can be formed by sputtering a titanium layer having a thickness of between 0.03 and 1 μm on the insulating layer 62 and on the gold layer of the patterned circuit layer 60 exposed by the opening 62*a*, and then sputtering a gold layer having a thickness of between 0.05 and 2 μm, and preferably of between 0.1 and 1 μm on the titanium layer. Alternatively, the metal layer 68 can be formed by sputtering a titanium layer having a thickness of between 0.03 and 1 μm on the insulating layer 62 and on the copper layer of the patterned circuit layer 60 exposed by the opening 62*a*, and then sputtering a gold layer having a thickness of between 0.05 and 2 μm, and preferably of between 0.1 and 1 μm, on the titanium layer. Alternatively, the metal layer 68 can be formed by sputtering a titanium layer having a thickness of between 0.03 and 1 μm on the insulating layer 62 and on the silver layer of the patterned circuit layer 60 exposed by the opening 62*a*, and then sputtering a gold layer having a thickness of between 0.05 and 2 μm, and preferably of between 0.1 and 1 μm, on the titanium layer. Alternatively, the metal layer 68 can be formed by sputtering a titanium layer having a thickness of between 0.03 and 1 μm on the insulating layer 62 and on the nickel layer of the patterned circuit layer 60 exposed by the opening 62*a*, and then sputtering a gold layer having a thickness of between 0.05 and 2 μm, and preferably of between 0.1 and 1 μm, on the titanium layer.

For example, the metal layer 68 can be formed by sputtering a titanium-tungsten-alloy layer having a thickness of between 0.03 and 1 μm on the insulating layer 62 and on the gold layer of the patterned circuit layer 60 exposed by the opening 62*a*, and then sputtering a gold layer having a thickness of between 0.05 and 2 μm, and preferably of between 0.1 and 1 μm, on the titanium-tungsten-alloy layer. Alternatively, the metal layer 68 can be formed by sputtering a titanium-tungsten-alloy layer having a thickness of between 0.03 and 1 μm on the insulating layer 62 and on the copper layer of the patterned circuit layer 60 exposed by the opening 62*a*, and then sputtering a gold layer having a thickness of between 0.05 and 2 μm, and preferably of between 0.1 and 1 μm, on the titanium-tungsten-alloy layer. Alternatively, the metal layer 68 can be formed by sputtering a titanium-tungsten-alloy layer having a thickness of between 0.03 and 1 μm on the insulating layer 62 and on the silver layer of the patterned circuit layer 60 exposed by the opening 62*a*, and then sputtering a gold layer having a thickness of between 0.05 and 2 μm, and preferably of between 0.1 and 1 μm, on the titanium-tungsten-alloy layer. Alternatively, the metal layer 68 can be formed by sputtering a titanium-tungsten-alloy layer having a thickness of between 0.03 and 1 μm on the insulating layer 62 and on the nickel layer of the patterned circuit layer 60 exposed by the opening 62*a*, and then sputtering a gold layer having a thickness of between 0.05 and 2 μm, and preferably of between 0.1 and 1 μm, on the titanium-tungsten-alloy layer.

For example, the metal layer 68 can be formed by sputtering a titanium-nitride layer having a thickness of between 0.03 and 1 μm on the insulating layer 62 and on the gold layer of the patterned circuit layer 60 exposed by the opening 62*a*, and then sputtering a gold layer having a thickness of between 0.05 and 2 μm, and preferably of between 0.1 and 1 μm, on the titanium-nitride layer. Alternatively, the metal layer 68 can be formed by sputtering a titanium-nitride layer having a thickness of between 0.03 and 1 μm on the insulating layer 62 and on the copper layer of the patterned circuit layer 60 exposed by the opening 62*a*, and then sputtering a gold layer having a thickness of between 0.05 and 2 μm, and preferably of between 0.1 and 1 μm, on the titanium-nitride layer. Alternatively, the metal layer 68 can be formed by sputtering a titanium-nitride layer having a thickness of between 0.03 and 1 μm on the insulating layer 62 and on the silver layer of the patterned circuit layer 60 exposed by the opening 62*a*, and then sputtering a gold layer having a thickness of between 0.05 and 2 μm, and preferably of between 0.1 and 1 μm, on the titanium-nitride layer. Alternatively, the metal layer 68 can be formed by sputtering a titanium-nitride layer having a thickness of between 0.03 and 1 μm on the insulating layer 62 and on the nickel layer of the patterned circuit layer 60 exposed by the opening 62*a*, and then sputtering a gold layer having a thickness of between 0.05 and 2 μm, and preferably of between 0.1 and 1 μm, on the titanium-nitride layer.

For example, the metal layer 68 can be formed by sputtering a chromium layer having a thickness of between 0.03 and 1 μm on the insulating layer 62 and on the gold layer of the patterned circuit layer 60 exposed by the opening 62*a*, and then sputtering a gold layer having a thickness of between 0.05 and 2 μm, and preferably of between 0.1 and 1 μm, on the chromium layer. Alternatively, the metal layer 68 can be formed by sputtering a chromium layer having a thickness of between 0.03 and 1 μm on the insulating layer 62 and on the copper layer of the patterned circuit layer 60 exposed by the opening 62a, and then sputtering a gold layer having a thickness of between 0.05 and 2 µm, and preferably of between 0.1 and 1 µm, on the chromium layer. Alternatively, the metal layer 68 can be formed by sputtering a chromium layer having a thickness of between 0.03 and 1 µm on the insulating layer 62 and on the silver layer of the patterned circuit layer 60 exposed by the opening 62a, and then sputtering a gold layer having a thickness of between 0.05 and 2 µm, and preferably of between 0.1 and 1 µm, on the chromium layer. Alternatively, the metal layer 68 can be formed by sputtering a chromium layer having a thickness of between 0.03 and 1 µm on the insulating layer 62 and on the nickel layer of the patterned circuit layer 60 exposed by the opening 62a, and then sputtering a gold layer having a thickness of between 0.05 and 2 µm, and preferably of between 0.1 and 1 µm, on the chromium layer.

For example, the metal layer 68 can be formed by sputtering a tantalum-nitride layer having a thickness of between 0.03 and 1 µm on the insulating layer 62 and on the gold layer of the patterned circuit layer 60 exposed by the opening 62a, and then sputtering a gold layer having a thickness of between 0.05 and 2 µm, and preferably of between 0.1 and 1 µm, on the tantalum-nitride layer. Alternatively, the metal layer 68 can be formed by sputtering a tantalum-nitride layer having a thickness of between 0.03 and 1 µm on the insulating layer 62 and on the copper layer of the patterned circuit layer 60 exposed by the opening 62a, and then sputtering a gold layer having a thickness of between 0.05 and 2 µm, and preferably of between 0.1 and 1 µm, on the tantalum-nitride layer. Alternatively, the metal layer 68 can be formed by sputtering a tantalum-nitride layer having a thickness of between 0.03 and 1 µm on the insulating layer 62 and on the silver layer of the patterned circuit layer 60 exposed by the opening 62a, and then sputtering a gold layer having a thickness of between 0.05 and 2 µm, and preferably of between 0.1 and 1 µm, on the tantalum-nitride layer. Alternatively, the metal layer 68 can be formed by sputtering a tantalum-nitride layer having a thickness of between 0.03 and 1 µm on the insulating layer 62 and on the nickel layer of the patterned circuit layer 60 exposed by the opening 62a, and then sputtering a gold layer having a thickness of between 0.05 and 2 µm, and preferably of between 0.1 and 1 µm, on the tantalum-nitride layer.

For example, the metal layer 68 can be formed by sputtering a titanium layer having a thickness of between 0.03 and 1 µm on the insulating layer 62 and on the gold layer of the patterned circuit layer 60 exposed by the opening 62a, and then sputtering a silver layer having a thickness of between 0.05 and 2 µm, and preferably of between 0.1 and 1 µm on the titanium layer. Alternatively, the metal layer 68 can be formed by sputtering a titanium layer having a thickness of between 0.03 and 1 µm on the insulating layer 62 and on the copper layer of the patterned circuit layer 60 exposed by the opening 62a, and then sputtering a silver layer having a thickness of between 0.05 and 2 µm, and preferably of between 0.1 and 1 µm, on the titanium layer. Alternatively, the metal layer 68 can be formed by sputtering a titanium layer having a thickness of between 0.03 and 1 µm on the insulating layer 62 and on the silver layer of the patterned circuit layer 60 exposed by the opening 62a, and then sputtering a silver layer having a thickness of between 0.05 and 2 µm, and preferably of between 0.1 and 1 µm, on the titanium layer. Alternatively, the metal layer 68 can be formed by sputtering a titanium layer having a thickness of between 0.03 and 1 µm on the insulating layer 62 and on the nickel layer of the patterned circuit layer 60 exposed by the opening 62a, and then sputtering a silver layer having a thickness of between 0.05 and 2 µm, and preferably of between 0.1 and 1 µm, on the titanium layer.

For example, the metal layer 68 can be formed by sputtering a titanium-tungsten-alloy layer having a thickness of between 0.03 and 1 µm on the insulating layer 62 and on the gold layer of the patterned circuit layer 60 exposed by the opening 62a, and then sputtering a silver layer having a thickness of between 0.05 and 2 µm, and preferably of between 0.1 and 1 µm, on the titanium-tungsten-alloy layer. Alternatively, the metal layer 68 can be formed by sputtering a titanium-tungsten-alloy layer having a thickness of between 0.03 and 1 µm on the insulating layer 62 and on the copper layer of the patterned circuit layer 60 exposed by the opening 62a, and then sputtering a silver layer having a thickness of between 0.05 and 2 µm, and preferably of between 0.1 and 1 µm, on the titanium-tungsten-alloy layer. Alternatively, the metal layer 68 can be formed by sputtering a titanium-tungsten-alloy layer having a thickness of between 0.03 and 1 µm on the insulating layer 62 and on the silver layer of the patterned circuit layer 60 exposed by the opening 62a, and then sputtering a silver layer having a thickness of between 0.05 and 2 µm, and preferably of between 0.1 and 1 µm, on the titanium-tungsten-alloy layer. Alternatively, the metal layer 68 can be formed by sputtering a titanium-tungsten-alloy layer having a thickness of between 0.03 and 1 µm on the insulating layer 62 and on the nickel layer of the patterned circuit layer 60 exposed by the opening 62a, and then sputtering a silver layer having a thickness of between 0.05 and 2 µm, and preferably of between 0.1 and 1 µm, on the titanium-tungsten-alloy layer.

For example, the metal layer 68 can be formed by sputtering a titanium-nitride layer having a thickness of between 0.03 and 1 µm on the insulating layer 62 and on the gold layer of the patterned circuit layer 60 exposed by the opening 62a, and then sputtering a silver layer having a thickness of between 0.05 and 2 µm, and preferably of between 0.1 and 1 µm, on the titanium-nitride layer. Alternatively, the metal layer 68 can be formed by sputtering a titanium-nitride layer having a thickness of between 0.03 and 1 µm on the insulating layer 62 and on the copper layer of the patterned circuit layer 60 exposed by the opening 62a, and then sputtering a silver layer having a thickness of between 0.05 and 2 µm, and preferably of between 0.1 and 1 µm, on the titanium-nitride layer. Alternatively, the metal layer 68 can be formed by sputtering a titanium-nitride layer having a thickness of between 0.03 and 1 µm on the insulating layer 62 and on the silver layer of the patterned circuit layer 60 exposed by the opening 62a, and then sputtering a silver layer having a thickness of between 0.05 and 2 µm, and preferably of between 0.1 and 1 µm, on the titanium-nitride layer. Alternatively, the metal layer 68 can be formed by sputtering a titanium-nitride layer having a thickness of between 0.03 and 1 µm on the insulating layer 62 and on the nickel layer of the patterned circuit layer 60 exposed by the opening 62a, and then sputtering a silver layer having a thickness of between 0.05 and 2 µm, and preferably of between 0.1 and 1 µm, on the titanium-nitride layer.

For example, the metal layer 68 can be formed by sputtering a chromium layer having a thickness of between 0.03 and 1 µm on the insulating layer 62 and on the gold layer of the patterned circuit layer 60 exposed by the opening 62a, and then sputtering a silver layer having a thickness of between 0.05 and 2 µm, and preferably of between 0.1 and 1 µm, on the chromium layer. Alternatively, the metal layer 68 can be formed by sputtering a chromium layer having a thickness of between 0.03 and 1 µm on the insulating layer 62 and on the copper layer of the patterned circuit layer 60 exposed by the opening 62a, and then sputtering a silver layer having a thickness of between 0.05 and 2 μm, and preferably of between 0.1 and 1 μm, on the chromium layer. Alternatively, the metal layer 68 can be formed by sputtering a chromium layer having a thickness of between 0.03 and 1 μm on the insulating layer 62 and on the silver layer of the patterned circuit layer 60 exposed by the opening 62a, and then sputtering a silver layer having a thickness of between 0.05 and 2 μm, and preferably of between 0.1 and 1 μm, on the chromium layer. Alternatively, the metal layer 68 can be formed by sputtering a chromium layer having a thickness of between 0.03 and 1 μm on the insulating layer 62 and on the nickel layer of the patterned circuit layer 60 exposed by the opening 62a, and then sputtering a silver layer having a thickness of between 0.05 and 2 μm, and preferably of between 0.1 and 1 μm, on the chromium layer.

For example, the metal layer 68 can be formed by sputtering a tantalum-nitride layer having a thickness of between 0.03 and 1 μm on the insulating layer 62 and on the gold layer of the patterned circuit layer 60 exposed by the opening 62a, and then sputtering a silver layer having a thickness of between 0.05 and 2 μm, and preferably of between 0.1 and 1 μm, on the tantalum-nitride layer. Alternatively, the metal layer 68 can be formed by sputtering a tantalum-nitride layer having a thickness of between 0.03 and 1 μm on the insulating layer 62 and on the copper layer of the patterned circuit layer 60 exposed by the opening 62a, and then sputtering a silver layer having a thickness of between 0.05 and 2 μm, and preferably of between 0.1 and 1 μm, on the tantalum-nitride layer. Alternatively, the metal layer 68 can be formed by sputtering a tantalum-nitride layer having a thickness of between 0.03 and 1 μm on the insulating layer 62 and on the silver layer of the patterned circuit layer 60 exposed by the opening 62a, and then sputtering a silver layer having a thickness of between 0.05 and 2 μm, and preferably of between 0.1 and 1 μm, on the tantalum-nitride layer. Alternatively, the metal layer 68 can be formed by sputtering a tantalum-nitride layer having a thickness of between 0.03 and 1 μm on the insulating layer 62 and on the nickel layer of the patterned circuit layer 60 exposed by the opening 62a, and then sputtering a silver layer having a thickness of between 0.05 and 2 μm, and preferably of between 0.1 and 1 μm, on the tantalum-nitride layer.

For example, the metal layer 68 can be formed by sputtering a titanium layer having a thickness of between 0.03 and 1 μm on the insulating layer 62 and on the gold layer of the patterned circuit layer 60 exposed by the opening 62a, and then sputtering a copper layer having a thickness of between 0.05 and 2 μm, and preferably of between 0.1 and 1 μm on the titanium layer. Alternatively, the metal layer 68 can be formed by sputtering a titanium layer having a thickness of between 0.03 and 1 μm on the insulating layer 62 and on the copper layer of the patterned circuit layer 60 exposed by the opening 62a, and then sputtering a copper layer having a thickness of between 0.05 and 2 μm, and preferably of between 0.1 and 1 μm, on the titanium layer. Alternatively, the metal layer 68 can be formed by sputtering a titanium layer having a thickness of between 0.03 and 1 μm on the insulating layer 62 and on the silver layer of the patterned circuit layer 60 exposed by the opening 62a, and then sputtering a copper layer having a thickness of between 0.05 and 2 μm, and preferably of between 0.1 and 1 μm, on the titanium layer. Alternatively, the metal layer 68 can be formed by sputtering a titanium layer having a thickness of between 0.03 and 1 μm on the insulating layer 62 and on the nickel layer of the patterned circuit layer 60 exposed by the opening 62a, and then sputtering a copper layer having a thickness of between 0.05 and 2 μm, and preferably of between 0.1 and 1 μm, on the titanium layer.

For example, the metal layer 68 can be formed by sputtering a titanium-tungsten-alloy layer having a thickness of between 0.03 and 1 μm on the insulating layer 62 and on the gold layer of the patterned circuit layer 60 exposed by the opening 62a, and then sputtering a copper layer having a thickness of between 0.05 and 2 μm, and preferably of between 0.1 and 1 μm, on the titanium-tungsten-alloy layer. Alternatively, the metal layer 68 can be formed by sputtering a titanium-tungsten-alloy layer having a thickness of between 0.03 and 1 μm on the insulating layer 62 and on the copper layer of the patterned circuit layer 60 exposed by the opening 62a, and then sputtering a copper layer having a thickness of between 0.05 and 2 μm, and preferably of between 0.1 and 1 μm, on the titanium-tungsten-alloy layer. Alternatively, the metal layer 68 can be formed by sputtering a titanium-tungsten-alloy layer having a thickness of between 0.03 and 1 μm on the insulating layer 62 and on the silver layer of the patterned circuit layer 60 exposed by the opening 62a, and then sputtering a copper layer having a thickness of between 0.05 and 2 μm, and preferably of between 0.1 and 1 μm, on the titanium-tungsten-alloy layer. Alternatively, the metal layer 68 can be formed by sputtering a titanium-tungsten-alloy layer having a thickness of between 0.03 and 1 μm on the insulating layer 62 and on the nickel layer of the patterned circuit layer 60 exposed by the opening 62a, and then sputtering a copper layer having a thickness of between 0.05 and 2 μm, and preferably of between 0.1 and 1 μm, on the titanium-tungsten-alloy layer.

For example, the metal layer 68 can be formed by sputtering a titanium-nitride layer having a thickness of between 0.03 and 1 μm on the insulating layer 62 and on the gold layer of the patterned circuit layer 60 exposed by the opening 62a, and then sputtering a copper layer having a thickness of between 0.05 and 2 μm, and preferably of between 0.1 and 1 μm, on the titanium-nitride layer. Alternatively, the metal layer 68 can be formed by sputtering a titanium-nitride layer having a thickness of between 0.03 and 1 μm on the insulating layer 62 and on the copper layer of the patterned circuit layer 60 exposed by the opening 62a, and then sputtering a copper layer having a thickness of between 0.05 and 2 μm, and preferably of between 0.1 and 1 μm, on the titanium-nitride layer. Alternatively, the metal layer 68 can be formed by sputtering a titanium-nitride layer having a thickness of between 0.03 and 1 μm on the insulating layer 62 and on the silver layer of the patterned circuit layer 60 exposed by the opening 62a, and then sputtering a copper layer having a thickness of between 0.05 and 2 μm, and preferably of between 0.1 and 1 μm, on the titanium-nitride layer. Alternatively, the metal layer 68 can be formed by sputtering a titanium-nitride layer having a thickness of between 0.03 and 1 μm on the insulating layer 62 and on the nickel layer of the patterned circuit layer 60 exposed by the opening 62a, and then sputtering a copper layer having a thickness of between 0.05 and 2 μm, and preferably of between 0.1 and 1 μm, on the titanium-nitride layer.

For example, the metal layer 68 can be formed by sputtering a chromium layer having a thickness of between 0.03 and 1 μm on the insulating layer 62 and on the gold layer of the patterned circuit layer 60 exposed by the opening 62a, and then sputtering a copper layer having a thickness of between 0.05 and 2 μm, and preferably of between 0.1 and 1 μm, on the chromium layer. Alternatively, the metal layer 68 can be formed by sputtering a chromium layer having a thickness of between 0.03 and 1 μm on the insulating layer 62 and on the copper layer of the patterned circuit layer 60 exposed by the opening 62a, and then sputtering a copper layer having a thickness of between 0.05 and 2 µm, and preferably of between 0.1 and 1 µm, on the chromium layer. Alternatively, the metal layer 68 can be formed by sputtering a chromium layer having a thickness of between 0.03 and 1 µm on the insulating layer 62 and on the silver layer of the patterned circuit layer 60 exposed by the opening 62a, and then sputtering a copper layer having a thickness of between 0.05 and 2 µm, and preferably of between 0.1 and 1 µm, on the chromium layer. Alternatively, the metal layer 68 can be formed by sputtering a chromium layer having a thickness of between 0.03 and 1 µm on the insulating layer 62 and on the nickel layer of the patterned circuit layer 60 exposed by the opening 62a, and then sputtering a copper layer having a thickness of between 0.05 and 2 µm, and preferably of between 0.1 and 1 µm, on the chromium layer.

For example, the metal layer 68 can be formed by sputtering a tantalum-nitride layer having a thickness of between 0.03 and 1 µm on the insulating layer 62 and on the gold layer of the patterned circuit layer 60 exposed by the opening 62a, and then sputtering a copper layer having a thickness of between 0.05 and 2 µm, and preferably of between 0.1 and 1 µm, on the tantalum-nitride layer. Alternatively, the metal layer 68 can be formed by sputtering a tantalum-nitride layer having a thickness of between 0.03 and 1 µm on the insulating layer 62 and on the copper layer of the patterned circuit layer 60 exposed by the opening 62a, and then sputtering a copper layer having a thickness of between 0.05 and 2 µm, and preferably of between 0.1 and 1 µm, on the tantalum-nitride layer. Alternatively, the metal layer 68 can be formed by sputtering a tantalum-nitride layer having a thickness of between 0.03 and 1 µm on the insulating layer 62 and on the silver layer of the patterned circuit layer 60 exposed by the opening 62a, and then sputtering a copper layer having a thickness of between 0.05 and 2 µm, and preferably of between 0.1 and 1 µm, on the tantalum-nitride layer. Alternatively, the metal layer 68 can be formed by sputtering a tantalum-nitride layer having a thickness of between 0.03 and 1 µm on the insulating layer 62 and on the nickel layer of the patterned circuit layer 60 exposed by the opening 62a, and then sputtering a copper layer having a thickness of between 0.05 and 2 µm, and preferably of between 0.1 and 1 µm, on the tantalum-nitride layer.

For example, the metal layer 68 can be formed by sputtering a gold layer having a thickness of between 0.05 and 2 µm, and preferably of between 0.1 and 1 µm, on the insulating layer 62 and on the gold layer of the patterned circuit layer 60 exposed by the opening 62a. Alternatively, the metal layer 68 can be formed by sputtering a copper layer having a thickness of between 0.05 and 2 µm, and preferably of between 0.1 and 1 µm, on the insulating layer 62 and on the gold layer of the patterned circuit layer 60 exposed by the opening 62a. Alternatively, the metal layer 68 can be formed by sputtering a silver layer having a thickness of between 0.05 and 2 µm, and preferably of between 0.1 and 1 µm, on the insulating layer 62 and on the gold layer of the patterned circuit layer 60 exposed by the opening 62a.

For example, the metal layer 68 can be formed by sputtering a gold layer having a thickness of between 0.05 and 2 µm, and preferably of between 0.1 and 1 µm, on the insulating layer 62 and on the copper layer of the patterned circuit layer 60 exposed by the opening 62a. Alternatively, the metal layer 68 can be formed by sputtering a copper layer having a thickness of between 0.05 and 2 µm, and preferably of between 0.1 and 1 µm, on the insulating layer 62 and on the copper layer of the patterned circuit layer 60 exposed by the opening 62a. Alternatively, the metal layer 68 can be formed by sputtering a silver layer having a thickness of between 0.05 and 2 µm, and preferably of between 0.1 and 1 µm, on the insulating layer 62 and on the copper layer of the patterned circuit layer 60 exposed by the opening 62a.

For example, the metal layer 68 can be formed by sputtering a gold layer having a thickness of between 0.05 and 2 µm, and preferably of between 0.1 and 1 µm, on the insulating layer 62 and on the nickel layer of the patterned circuit layer 60 exposed by the opening 62a. Alternatively, the metal layer 68 can be formed by sputtering a copper layer having a thickness of between 0.05 and 2 µm, and preferably of between 0.1 and 1 µm, on the insulating layer 62 and on the nickel layer of the patterned circuit layer 60 exposed by the opening 62a. Alternatively, the metal layer 68 can be formed by sputtering a silver layer having a thickness of between 0.05 and 2 µm, and preferably of between 0.1 and 1 µm, on the insulating layer 62 and on the nickel layer of the patterned circuit layer 60 exposed by the opening 62a.

Figure 6P:
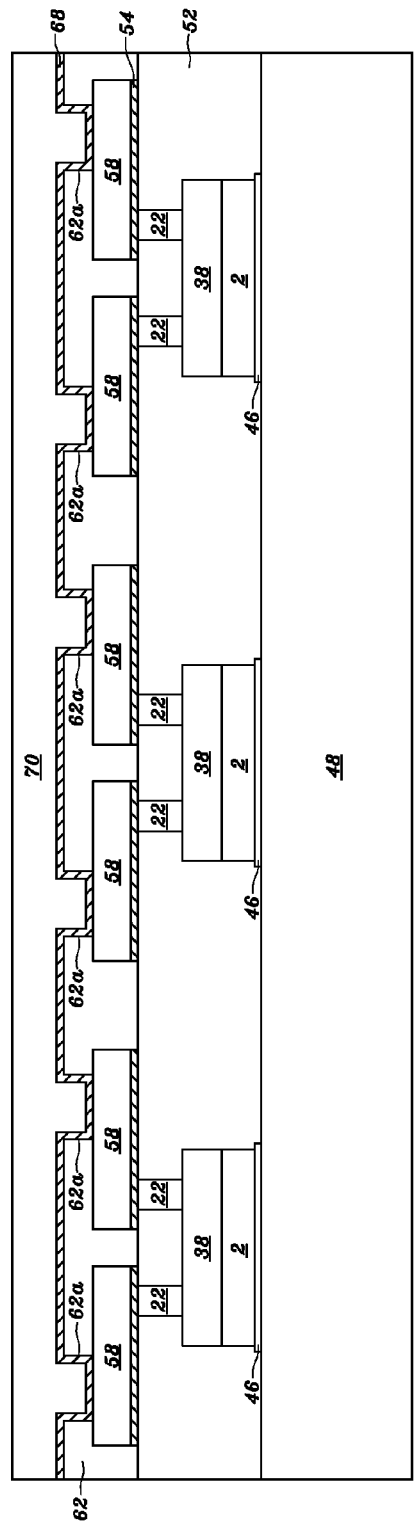

Next, referring to FIG. 6P, a photoresist layer 70, such as positive type photoresist or negative type photoresist, having a thickness of between 10 and 120 µm is formed on the metal layer 68 via a coating process, a spraying process or a lamination process. Referring to FIG. 6Q, the photoresist layer 70 is patterned with the processes of exposure, development, etc., to form an opening 70a in the photoresist layer 70 exposing the metal layer 68. A 1× stepper or 1× contact aligner can be used to expose the photoresist layer 70 during the process of exposure. However, some residuals from the photoresist layer 70 could remain on the metal layer 68 exposed by the opening 70a. Thereafter, the residuals can be removed from the metal layer 68 exposed by the opening 70a with a plasma, such as $O_2$ plasma or plasma containing fluorine of below 200 PPM and oxygen.

For example, the photoresist layer 70 can be formed by coating a positive-type photosensitive polymer layer having a thickness of between 5 and 150 µm, and preferably of between 20 and 50 µm, on the above-mentioned copper layer, gold layer or silver layer of the metal layer 68, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the metal layer 68 with an $O_2$ plasma or a plasma containing fluorine of below 200 PPM and oxygen, such that the photoresist layer 70 can be patterned with an opening 70a in the photoresist layer 70 exposing the metal layer 68.

For example, the photoresist layer 70 can be formed by coating a positive type photoresist on the above-mentioned gold layer of the metal layer 68, and then patterning the positive type photoresist with the processes of exposure, development, etc., to form an opening in the positive type photoresist exposing the above-mentioned gold layer of the metal layer 68. Alternatively, the photoresist layer 70 can be formed by coating a positive type photoresist on the above-mentioned copper layer of the metal layer 68, and then patterning the positive type photoresist with the processes of exposure, development, etc., to form an opening in the positive type photoresist exposing the above-mentioned copper layer of the metal layer 68. Alternatively, the photoresist layer 70 can be formed by laminating a positive type photoresist on the above-mentioned gold layer of the metal layer 68, and then patterning the positive type photoresist with the processes of exposure, development, etc., to form an opening in the positive type photoresist exposing the above-mentioned gold layer of the metal layer 68. Alternatively, the photoresist layer 70 can be formed by laminating a positive type photoresist on the above-mentioned copper layer of the metal layer 68, and then patterning the positive type photoresist with the processes of exposure, development, etc., to form an opening in the positive type photoresist exposing the above-mentioned copper layer of the metal layer 68.

Referring to FIG. 6R, a metal layer 72 having a thickness of between 5 and 100 μm, and preferably of between 10 and 30 μm, is electroplated on the metal layer 68 exposed by the opening 70a. The material of the metal layer 72 may include gold, copper, silver or nickel. For example, the metal layer 72 can be formed by electroplating a gold layer having a thickness of between 5 and 100 μm, and preferably of between 10 and 30 μm, on the gold layer of the metal layer 68 exposed by the opening 70a. Alternatively, the metal layer 72 can be formed by electroplating a copper layer having a thickness of between 5 and 100 μm, and preferably of between 10 and 30 μm, on the copper layer of the metal layer 68 exposed by the opening 70a. Alternatively, the metal layer 72 can be formed by electroplating a silver layer having a thickness of between 5 and 100 μm, and preferably of between 10 and 30 μm, on the silver layer of the metal layer 68 exposed by the opening 70a. Alternatively, the metal layer 72 can be formed by electroplating a copper layer having a thickness of between 5 and 100 μm, and preferably of between 10 and 30 μm, on the copper layer of the metal layer 68 exposed by the opening 70a, and then electroplating a nickel layer having a thickness of between 1 and 10 microns on the electroplated copper layer in the opening 70a, wherein the thickness of the electroplated copper layer, in the opening 56a, plus the nickel layer is between 5 and 100 μm, and preferably of between 10 and 30 μm. Alternatively, the metal layer 72 can be formed by electroplating a copper layer having a thickness of between 5 and 100 μm, and preferably of between 10 and 30 μm, on the copper layer of the metal layer 68 exposed by the opening 70a, then electroplating a nickel layer having a thickness of between 1 and 10 microns on the electroplated copper layer in the opening 70a, and then electroplating a gold layer having a thickness of between 0.5 and 5 microns on the nickel in the opening 70a, wherein the thickness of the electroplated copper layer, in the opening 56a, the nickel layer and the gold layer is between 5 and 100 μm, and preferably of between 10 and 30 μm.

Figure 6S:
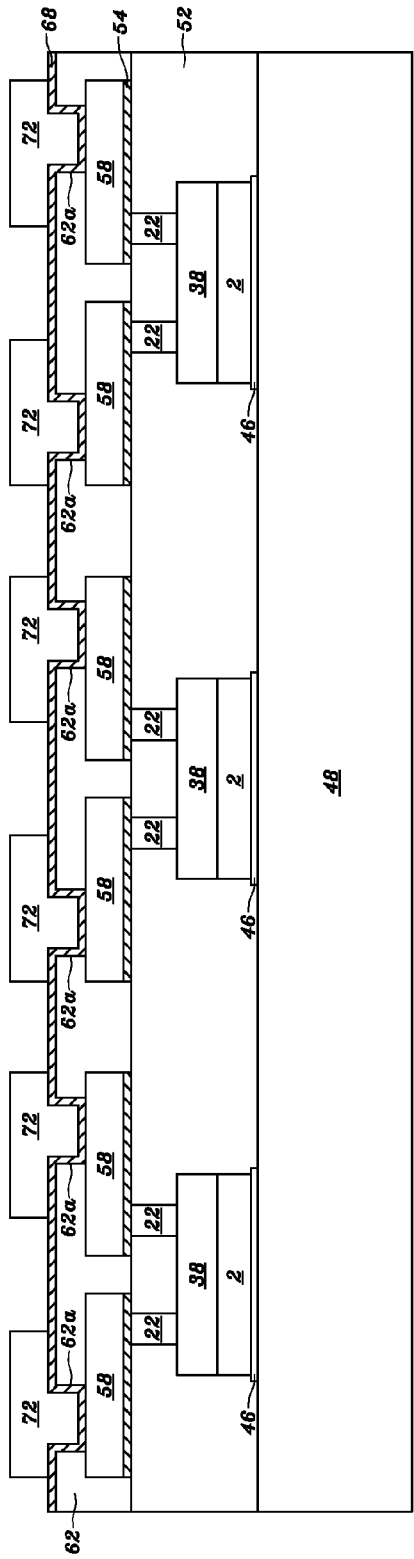

Next, referring to FIG. 6S, after the metal layer 72 is formed, most of the photoresist layer 70 can be removed using an organic solution with amide. However, some residuals from the photoresist layer 70 could remain on the metal layer 72 and on the metal layer 68. Thereafter, the residuals can be removed from the metal layer 72 and from the metal layer 68 with a plasma, such as $O_2$ plasma or plasma containing fluorine of below 200 PPM and oxygen.

Figure 6T:
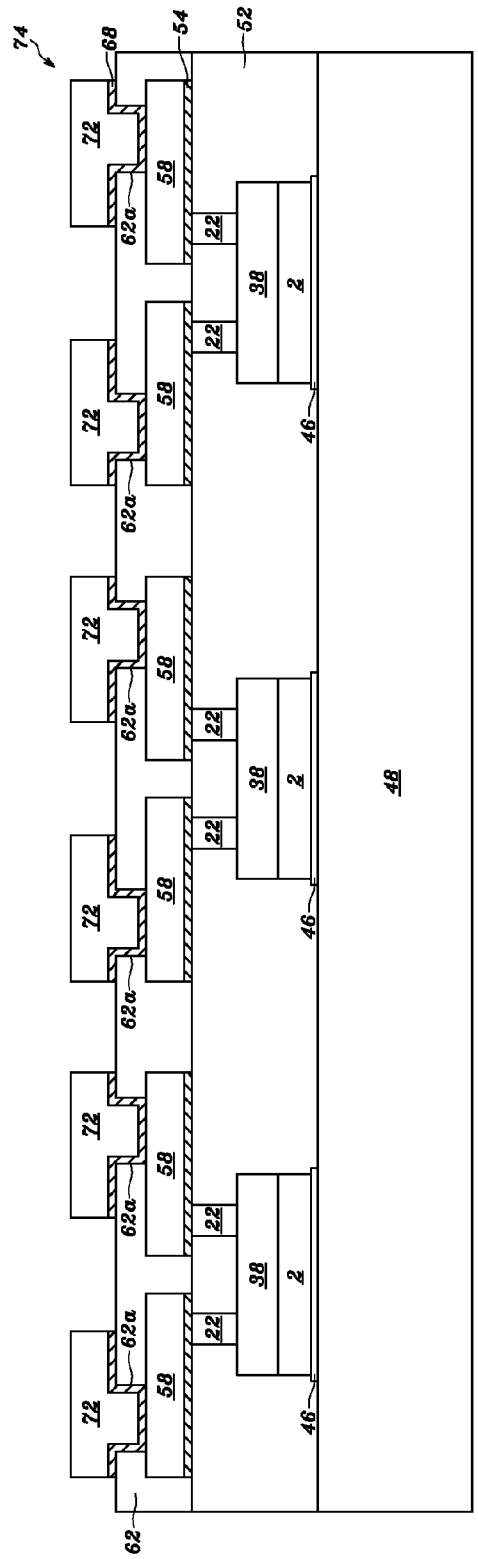

Next, referring to FIG. 6T, the metal layer 68 not under the metal layer 72 is removed with a dry etching method or a wet etching method. As to the wet etching method, when the metal layer 68 comprises a titanium-tungsten-alloy layer, the titanium-tungsten-alloy layer can be etched with a solution containing hydrogen peroxide; when the metal layer 68 comprises a titanium layer, the titanium layer can be etched with a solution containing hydrogen fluoride; when the metal layer 68 comprises a gold layer, the gold layer can be etched with an iodine-containing solution, such as solution containing potassium iodide; when the metal layer 68 comprises a copper layer, the copper layer can be etched with a solution containing NH4OH. As to the dry etching method, when the metal layer 68 comprises a titanium layer or a titanium-tungsten-alloy layer, the titanium layer or the titanium-tungsten-alloy layer can be etched with a chlorine-containing plasma etching process or with an RIE process; when the metal layer 68 comprises is a gold layer, the gold layer can be removed with an ion milling process or with an Ar sputtering etching process. Generally, the dry etching method to etch the metal layer 68 not under the metal layer 72 may include a chemical plasma etching process, a sputtering etching process, such as argon sputter process, or a chemical vapor etching process.

Thereby, in this embodiment, a patterned circuit layer 74 can be formed on the insulating layer 62 and on the patterned circuit layer 60 exposed by the opening 62a. The patterned circuit layer 74 can be formed of the metal layer 68 and the electroplated metal layer 72 on the metal layer 68.

Next, referring to FIG. 6U, a solder mask 76 having a thickness of between 15 and 150 μm can be formed on the insulating layer 62 and on the patterned circuit layer 74 via a coating process, a spraying process or a lamination process. The material of the solder mask 76 may be polymer material, such as epoxy resin, benzocyclobutene (BCB) or polyimide. Next, referring to FIG. 6V, the solder mask 76 is patterned with a laser drill process or the processes of exposure, development, etc., to form an opening 76a in the solder mask 76 exposing the patterned circuit layer 74. For example, the solder mask 76 can be formed by coating or laminating an epoxy resin layer having a thickness of between 15 and 150 μm on the insulating layer 62 and on the patterned circuit layer 74, and then patterning the epoxy resin layer with a laser drill process to form an opening in the epoxy resin layer exposing the patterned circuit layer 74. Alternatively, the solder mask 76 can be formed by coating or laminating a photo sensitive epoxy resin layer having a thickness of between 15 and 150 μm on the insulating layer 62 and on the patterned circuit layer 74, and then patterning the photo sensitive epoxy resin layer with the processes of exposure, development, etc., to form an opening in the epoxy resin layer exposing the patterned circuit layer 74.

However, some residuals from the solder mask 76 could remain on the patterned circuit layer 74 exposed by the opening 76a. Thereafter, the residuals can be removed from the patterned circuit layer 74 exposed by the opening 76a with a plasma, such as $O_2$ plasma or plasma containing fluorine of below 200 PPM and oxygen.

Figure 6W:
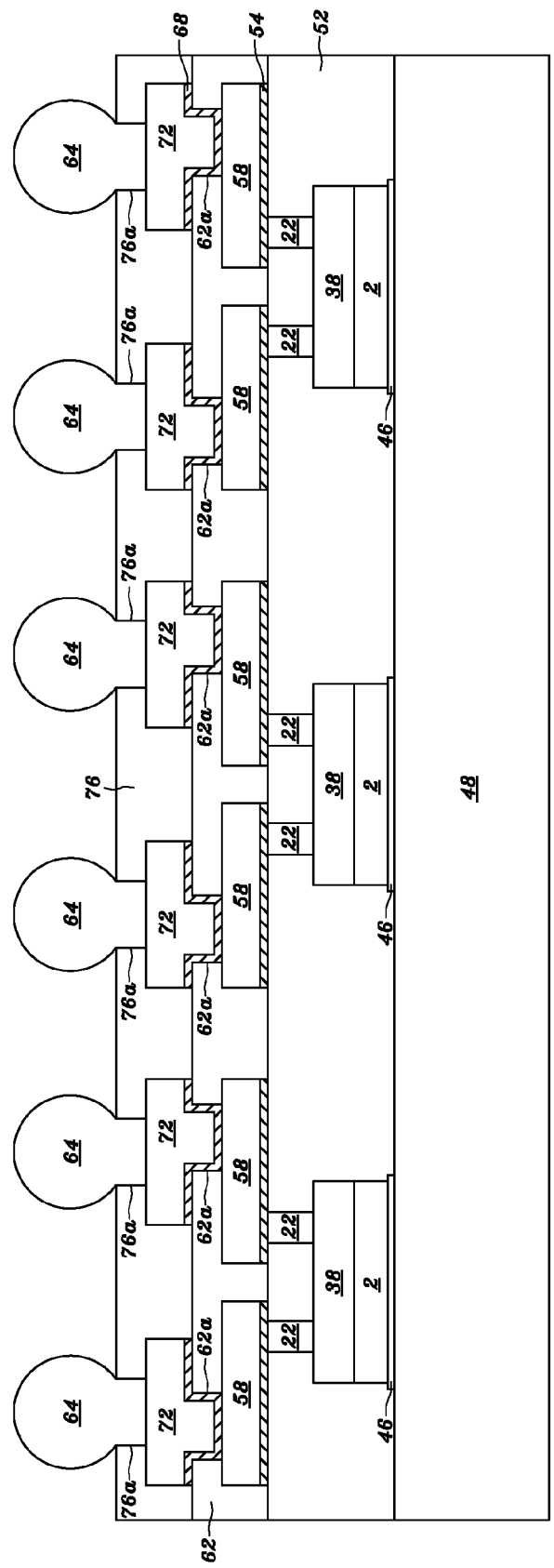

Referring to FIG. 6W, a tin-containing ball 64 with a diameter of between 0.25 and 1.2 mm is formed over the patterned circuit layer 74 exposed by the opening 76a and connected to the patterned circuit layer 74 through the opening 76a. For example, a nickel layer having a thickness of between 0.05 and 5 microns can be electroless plated on the copper layer of the patterned circuit layer 74 exposed by the opening 76a; next, a gold layer having a thickness of between 0.05 and 2 microns is electroless plated on the nickel layer; and next, the tin-containing ball 64 is planted on the gold layer. Alternatively, the tin-containing ball 64 may be formed by planting a tin-lead-alloy ball on the gold layer of the patterned circuit layer 74 exposed by the opening 76a at a temperature of between 180 and 190° C. Alternatively, the tin-containing ball 64 can be formed by screen printing a tin-lead alloy on the gold layer of the patterned circuit layer 74 exposed by the opening 76a, and then heating or reflowing the tin-lead alloy at a temperature of between 180 and 190° C. Alternatively, the tin-containing ball 64 may be formed by planting a lead-free ball, such as tin-silver alloy or tin-silver-copper alloy, on the gold layer of the patterned circuit layer 74 exposed by the opening 76a at a temperature of between 200 and 250° C.

Alternatively, the tin-containing ball 64 can be formed by screen printing a lead-free alloy, such as tin-silver alloy or tin-silver-copper alloy, on the gold layer of the patterned circuit layer 74 exposed by the opening 76a, and then heating or reflowing the lead-free alloy at a temperature of between 200 and 250° C.

Alternatively, the tin-containing ball 64 may be formed by planting a tin-lead-alloy ball on the copper layer of the patterned circuit layer 74 exposed by the opening 76a at a temperature of between 180 and 190° C. Alternatively, the tin-containing ball 64 can be formed by screen printing a tin-lead alloy on the copper layer of the patterned circuit layer 74 exposed by the opening 76a, and then heating or reflowing the tin-lead alloy at a temperature of between 180 and 190° C. Alternatively, the tin-containing ball 64 may be formed by planting a lead-free ball, such as tin-silver alloy or tin-silver-copper alloy, on the copper layer of the patterned circuit layer 74 exposed by the opening 76a at a temperature of between 200 and 250° C. Alternatively, the tin-containing ball 64 can be formed by screen printing a lead-free alloy, such as tin-silver alloy or tin-silver-copper alloy, on the copper layer of the patterned circuit layer 74 exposed by the opening 76a, and then heating or reflowing the lead-free alloy at a temperature of between 200 and 250° C.

Figure 6X:
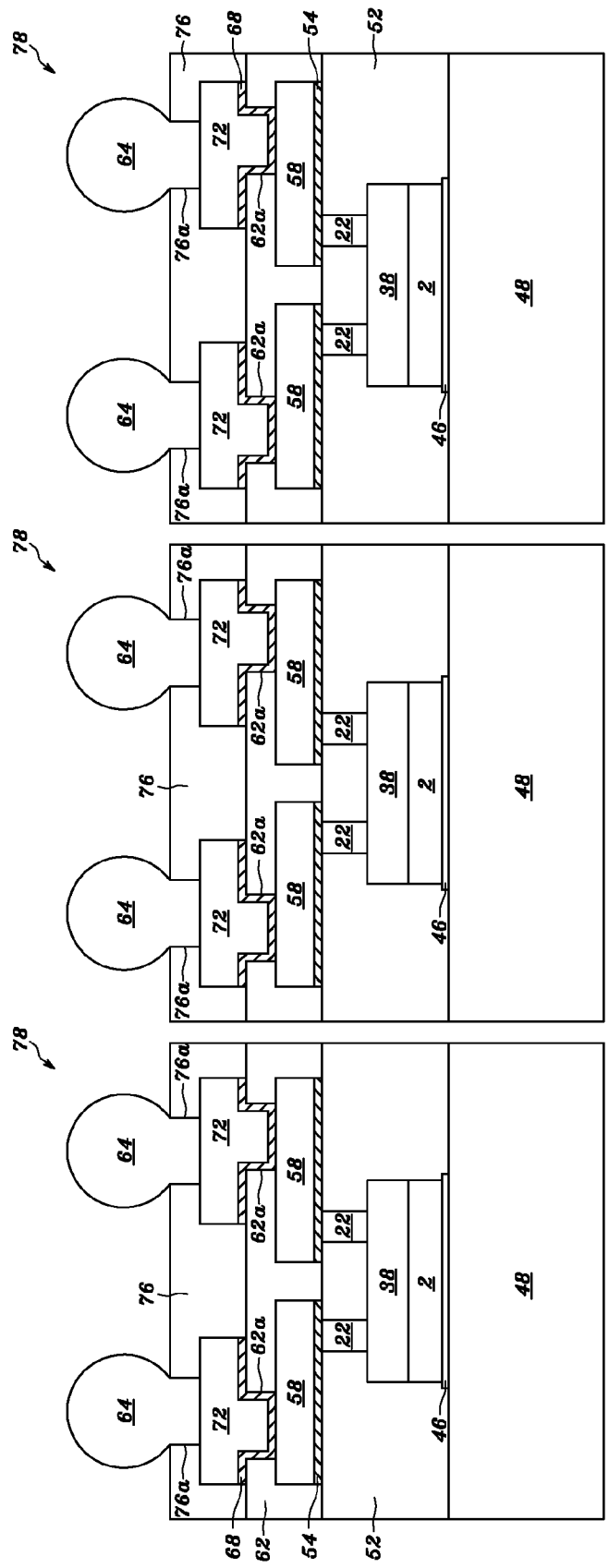

Referring to FIG. 6X, after the tin-containing ball 64 is formed, the substrate 48, the polymer material 52, the insulating layer 62 and the solder mask 76 can be cutted into a plurality of chip packages 78 using a mechanical cutting process or using a laser cutting process.

Figure 6Y:
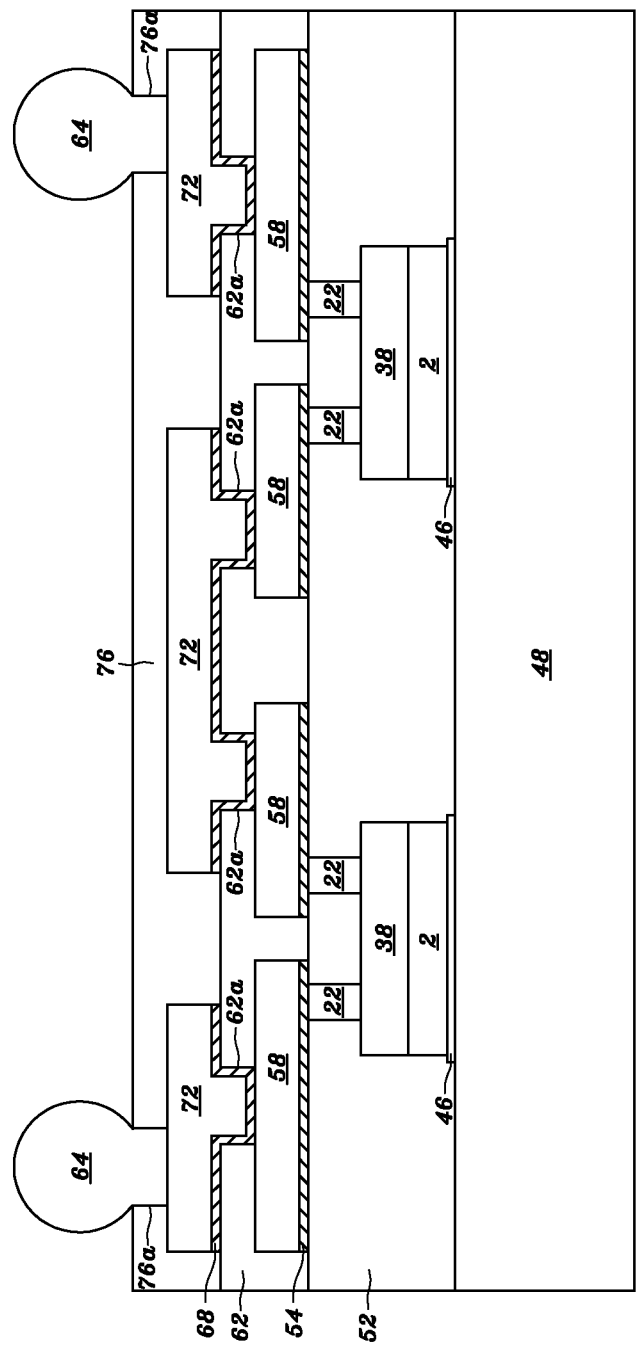

Referring to FIG. 6Y, in this embodiment, the patterned circuit layer 60 and the patterned circuit layer 74 may include an interconnect trace connecting multiple metal bumps 22 of the two semiconductor chips 44 for providing a power voltage, a ground reference voltage or for transmitting a signal, such as clock signal, address signal, data signal or logic signal. Multiple tin-containing balls 64 are connected to the metal bumps 22 of the semiconductor chips 44 via the patterned circuit layer 60 and the patterned circuit layer 74. After the tin-containing balls 64 are formed, the substrate 48, the polymer material 52, the insulating layer 62 and the solder mask 76 can be cutted into a plurality of chip packages using a mechanical cutting process or using a laser cutting process. Each chip package includes multiple semiconductor chips connected to each other or one another through the above-mentioned interconnect trace.

Embodiment 2

Referring to FIG. 7A, a glue material 80 is first formed on multiple regions of a substrate 48 by a coating process, a lamination process, an immerseon process or a spraying process to form multiple glue portions on the substrate 48. Next, multiple semiconductor chips 44 are respectively mounted onto the glue material 80 to be adhered to the substrate 48 by heating the glue material 80 at a temperature of between 120 and 250° C. In another word, the semiconductor substrate 2 of the semiconductor chip 44 can be adhered to the substrate 48 using the glue material 80.

The material of the glue material 80 may be polymer material, such as polyimide or epoxy resin, and the thickness of the glue material 80 is between 1 and 50 µm. For example, the glue material 80 may be polyimide having a thickness of between 1 and 50 µm. Alternatively, the glue material 46 may be epoxy resin having a thickness of between 1 and 50 µm. Therefore, the semiconductor chips 44 can be adhered to the substrate 48 using polyimide. Alternatively, the semiconductor chips 44 can be adhered to the substrate 48 using epoxy resin. The structure of the substrate 48 shown in FIGS. 7A-7I can be referred to the substrate 48 illustrated in FIGS. 6A and 6B.

Referring to FIG. 7B, multiple cavities 82 may be formed in the substrate 48 using a mechanical drilling process, a laser drilling process or an etching process. Next, a glue material 80 can be formed on the surfaces of the cavities 82 in the substrate 48 by a coating process, a lamination process, a immerseon process or a spraying process to form multiple glue portions in the cavities 82. Next, multiple semiconductor chips 44 are respectively mounted onto the glue portions 80 in the cavities 82 to be adhered to the surfaces of the cavities 82 in the substrate 48 by heating the glue material 80 at a temperature of between 120 and 250° C. In another word, the semiconductor substrate 2 of the semiconductor chip 44 can be adhered to the surfaces of the cavities 82 in the substrate 48 using the glue material 80. Therefore, the semiconductor chips 44 can be adhered to the surfaces of the cavities 82 in the substrate 48 using polyimide. Alternatively, the semiconductor chips 44 can be adhered to the surfaces of the cavities 82 in the substrate 48 using epoxy resin.

Figure 7C:
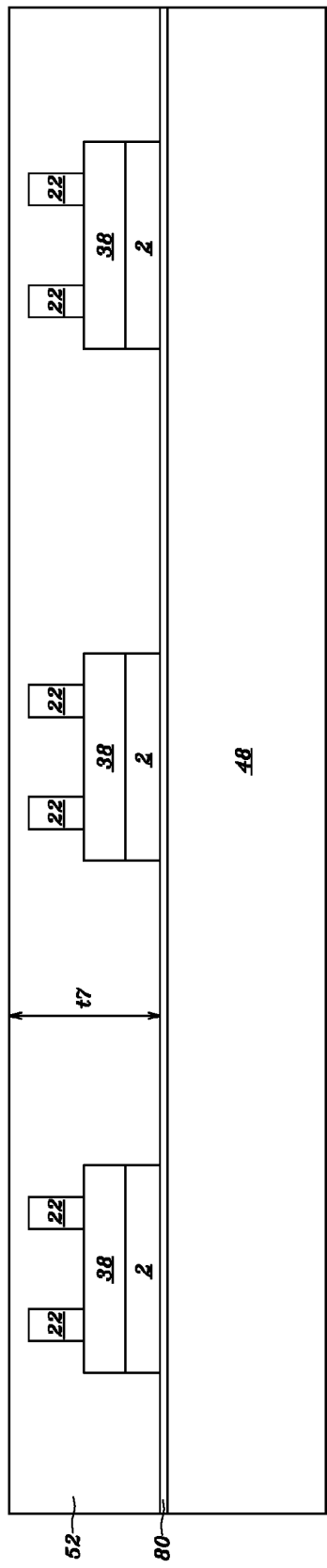

Referring to FIG. 7C, a polymer material 52 having a thickness t7 of between 250 and 1,000 µm is formed on the glue material 80, on the semiconductor chips 44 and enclosing the metal bumps 22 of the semiconductor chips 44. The polymer material 52 can be formed by molding benzocyclobutane (BCB), polyimide (PI) or an epoxy-based material, by dispensing benzocyclobutane (BCB), polyimide (PI) or an epoxy-based material, by coating benzocyclobutane (BCB), polyimide (PI) or an epoxy-based material, by printing benzocyclobutane (BCB), polyimide (PI) or an epoxy-based material, or by laminating benzocyclobutane (BCB), polyimide (PI) or an epoxy-based material.

For example, the polymer material 52 can be formed by molding an epoxy-based material having a thickness t7 of between 250 and 1,000 µm on the glue material 80, made of polyimide, on the semiconductor chips 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by molding an epoxy-based material having a thickness t7 of between 250 and 1,000 µm on the glue material 80, made of epoxy resin, on the semiconductor chips 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by molding polyimide or benzocyclobutane having a thickness t7 of between 250 and 1,000 µm on the glue material 80, made of polyimide, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by molding polyimide or benzocyclobutane having a thickness t7 of between 250 and 1,000 µm on the glue material 80, made of epoxy resin, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5.

For example, the polymer material 52 can be formed by dispensing polyimide or benzocyclobutane having a thickness t7 of between 250 and 1,000 µm on the glue material 80, made of polyimide, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by dispensing polyimide or benzocyclobutane having a thickness t7 of between 250 and 1,000 μm on the glue material 80, made of epoxy resin, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5.

Figure 7D:
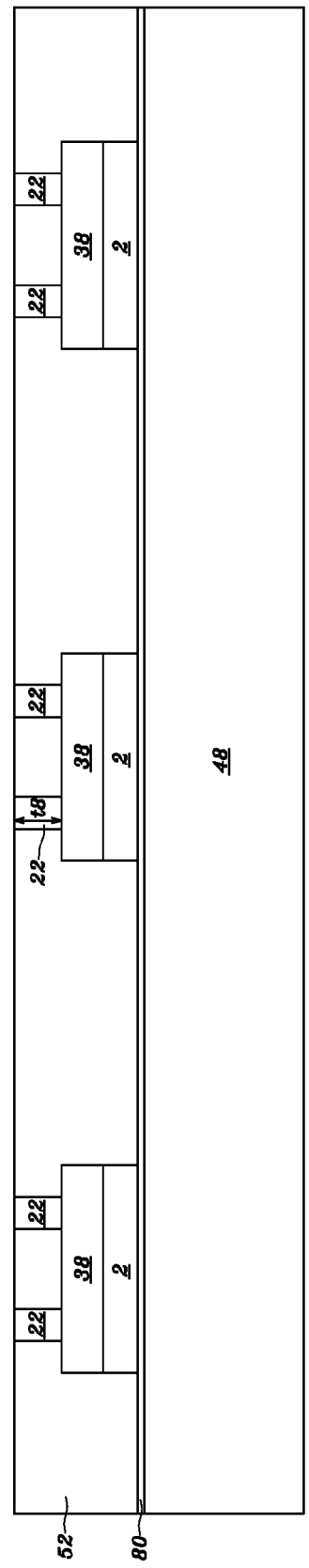
Figure 7E:
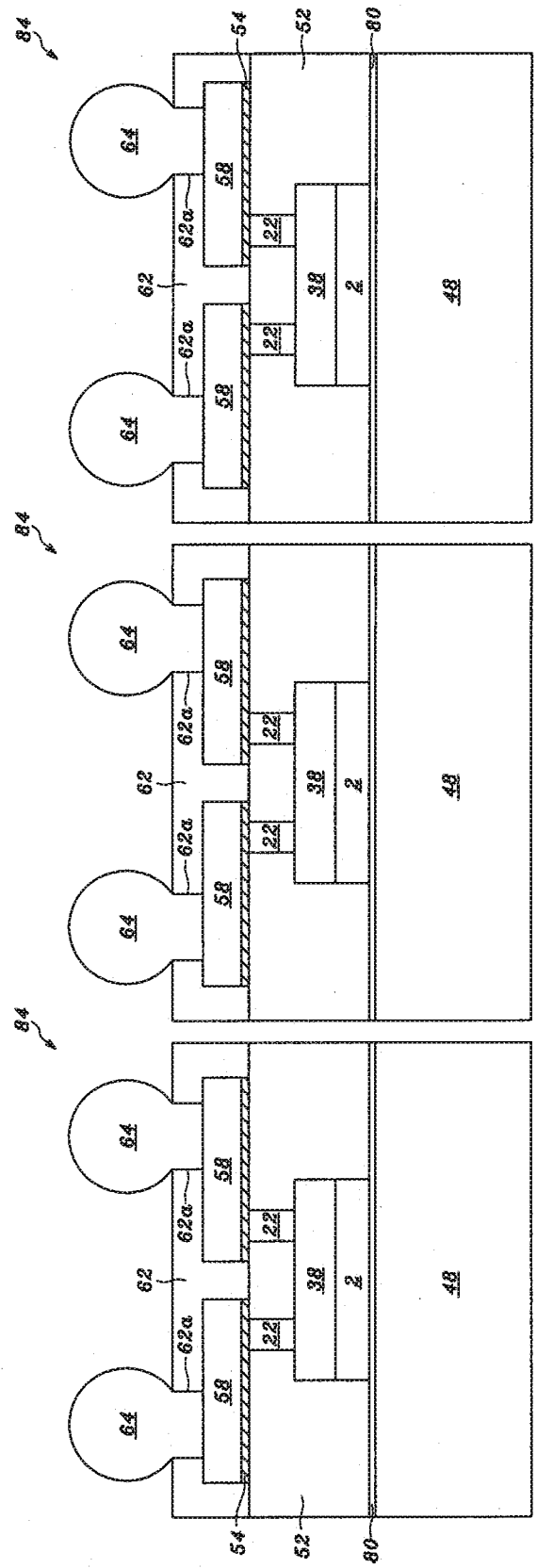
Figure 7F:
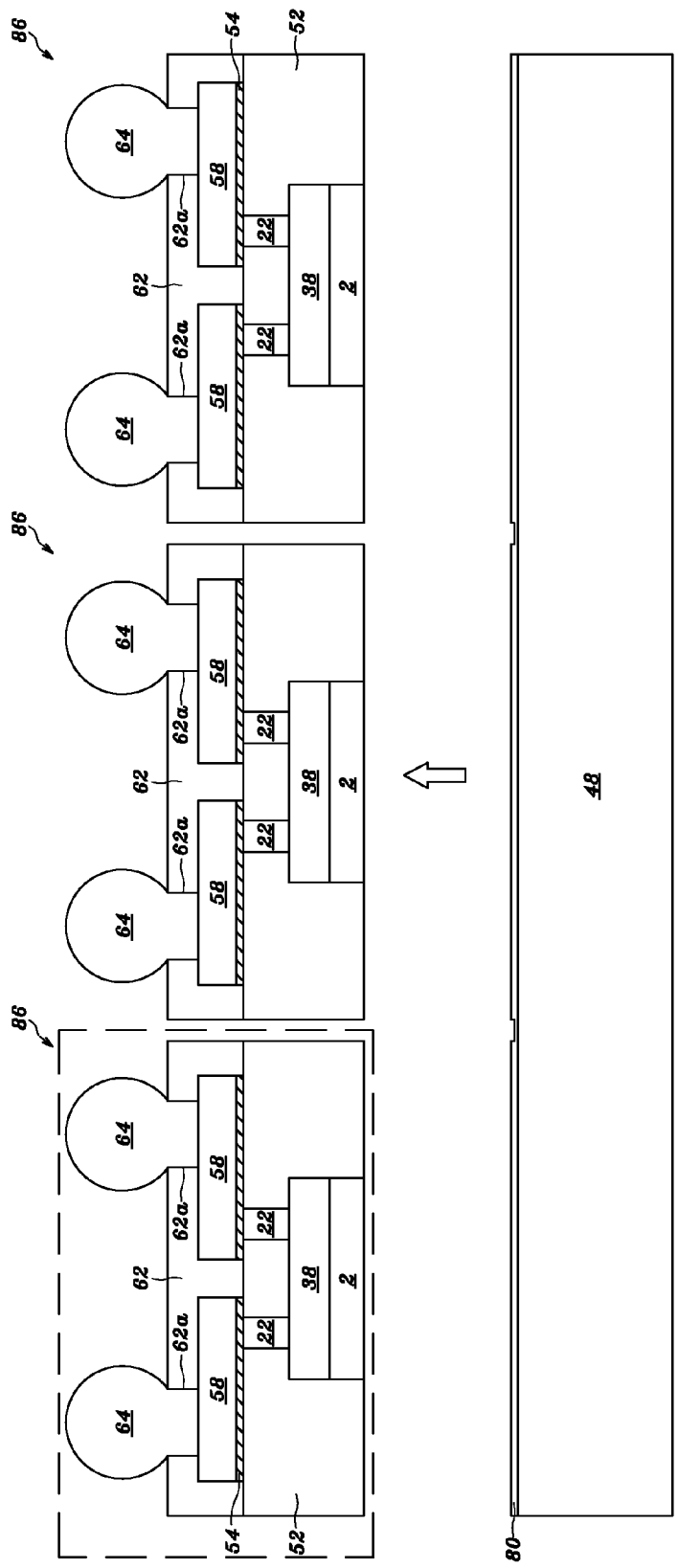
Figure 7G:
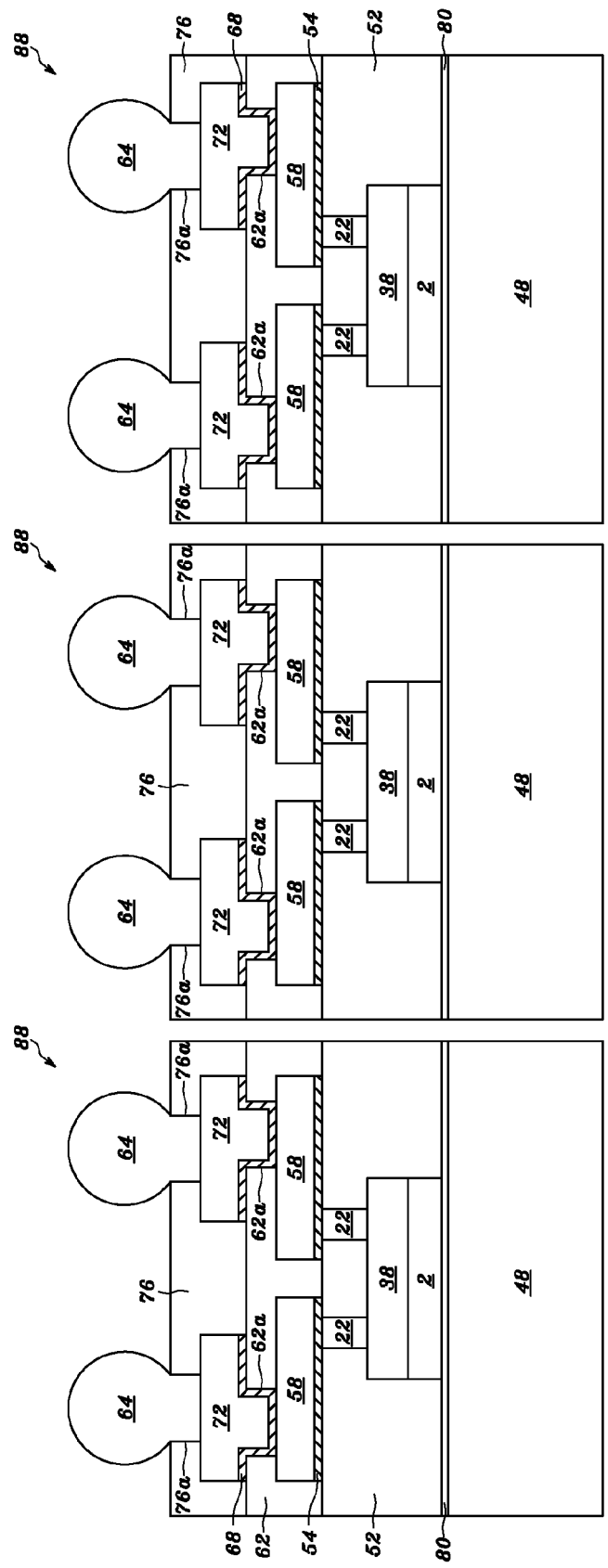
Figure 7H:
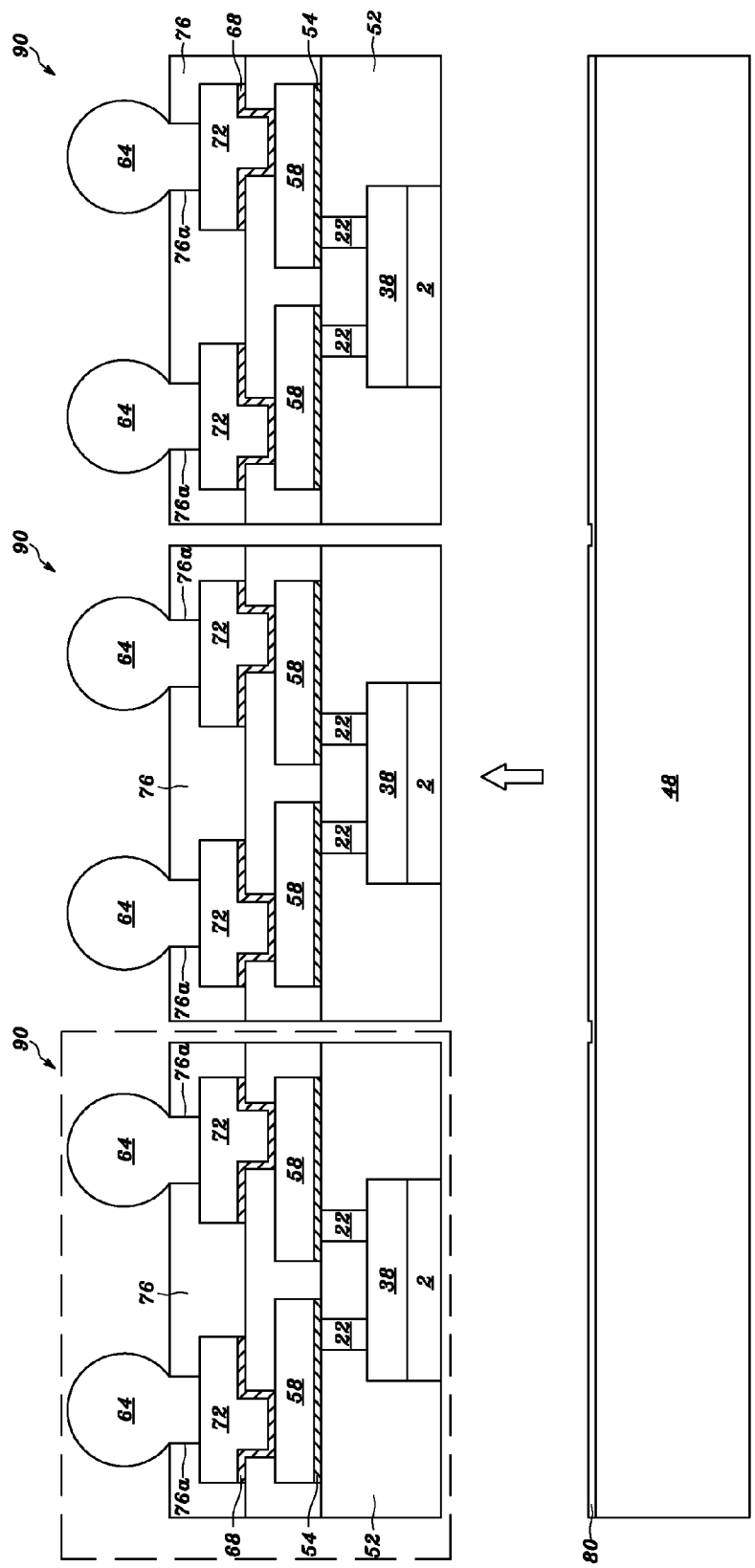

Referring to FIG. 7D, a top surface of the polymer material 52 is polished to uncover a top surface of the metal bump 22 and to planarize a top surface of the polymer material 52, preferably by a mechanical polishing process. Alternatively, the top surface of the polymer material 52 is polished by a chemical mechanical polishing (CMP) process. When the polymer material 52 is being polished, the top portion of the metal bump 22 is allowed to be removed such that the metal bump 22, after being polished, may have a thickness t8 between 10 and 30 microns.

After the polymer material 52 is formed, the steps as referred to in FIGS. 6E-6M are performed in sequence. Next, referring to FIG. 7E, the substrate 48, the glue material 80, the polymer material 52 and the insulating layer 62 can be cutted into a plurality of chip packages 84 using a mechanical cutting process or using a laser cutting process. Alternatively, referring to FIG. 7F, the glue material 80, the polymer material 52 and the insulating layer 62 can be cutted using a mechanical cutting process or using a laser cutting process in the time when the substrate 48 is not cutted, and then the substrate 48 is separated from the semiconductor chips 44 and the polymer material 52. So far, multiple chip packages 86 are completed.

In this embodiment, multiple patterned circuit layers and multiple insulating layers can be formed over the polymer material 52, wherein one of the insulating layers is between the neighboring two of the patterned circuit layers. These patterned circuit layers are connected to each other through multiple metal vias in the insulating layers. The tin-containing ball 64 can be formed over the topmost one of the patterned circuit layers, and the bottommost one of the patterned circuit layers can be connected to the metal bump 22. The following example is described for forming two patterned circuit layers. More than two patterned circuit layers can be referred to the following example.

After the polymer material 52 is formed, the steps as referred to in FIGS. 6E-6W are performed in sequence. Next, referring to FIG. 7G, the substrate 48, the glue material 80, the polymer material 52, the insulating layer 62 and the solder mask 76 can be cutted into a plurality of chip packages 88 using a mechanical cutting process or using a laser cutting process. Alternatively, referring to FIG. 7H, the glue material 80, the polymer material 52, the insulating layer 62 and the solder mask 76 can be cutted using a mechanical cutting process or using a laser cutting process in the time when the substrate 48 is not cutted, and then the substrate 48 is separated from the semiconductor chips 44 and the polymer material 52. So far, multiple chip packages 90 are completed.

Figure 7I:
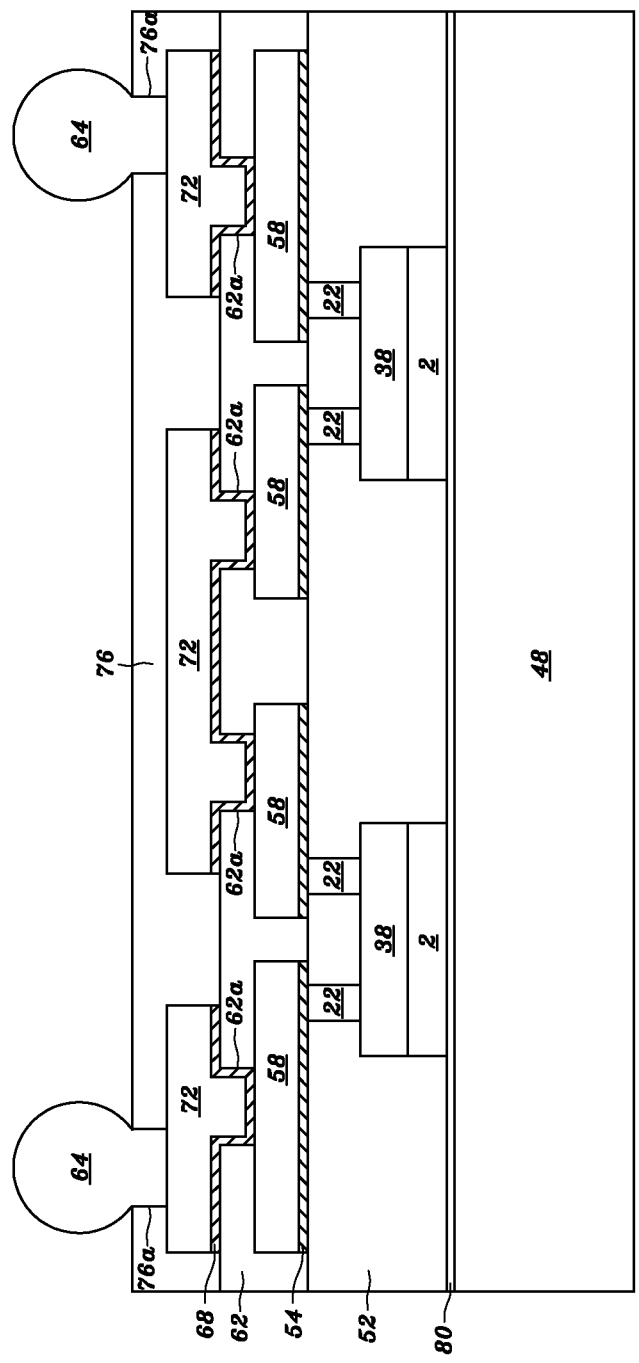
Figure 7J:
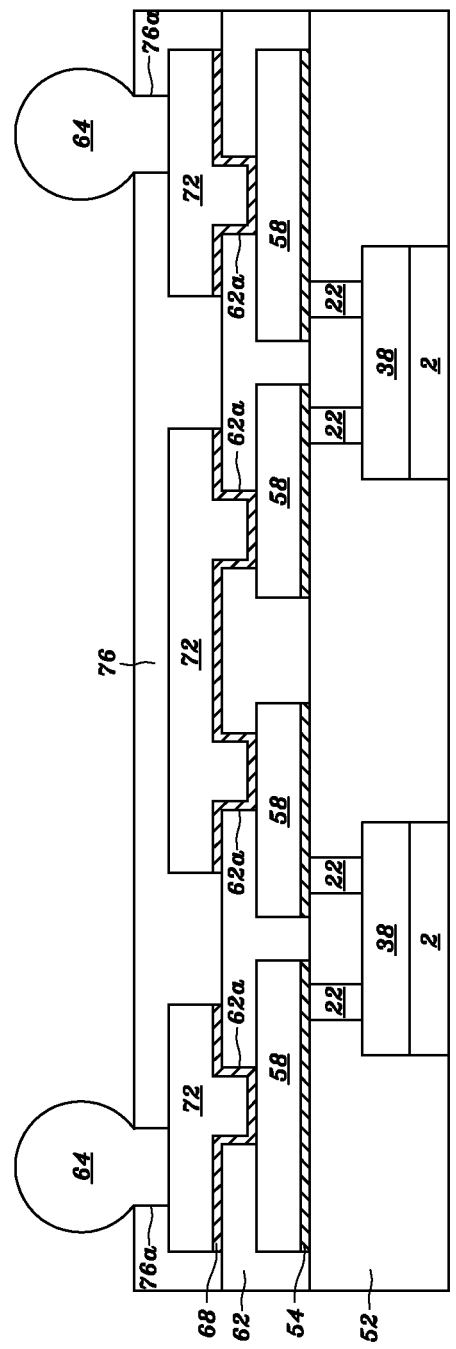

Referring to FIG. 7I, in this embodiment, the patterned circuit layer 60 and the patterned circuit layer 74 may include an interconnect trace connecting multiple metal bumps 22 of the two semiconductor chips 44 for providing a power voltage, a ground reference voltage or for transmitting a signal, such as clock signal, address signal, data signal or logic signal. Multiple tin-containing balls 64 are connected to the metal bumps 22 of the semiconductor chips 44 via the patterned circuit layer 60 and the patterned circuit layer 74. After the tin-containing balls 64 are formed, the substrate 48, the glue material 80, the polymer material 52, the insulating layer 62 and the solder mask 76 can be cutted into a plurality of chip packages using a mechanical cutting process or using a laser cutting process. Alternatively, referring to FIG. 7J, the glue material 80, the polymer material 52, the insulating layer 62 and the solder mask 76 can be cutted using a mechanical cutting process or using a laser cutting process in the time when the substrate 48 is not cutted, and then the substrate 48 is separated from the semiconductor chips 44 and the polymer material 52. So far, multiple chip packages are completed. Each chip package includes multiple semiconductor chips connected to each other or one another through the above-mentioned interconnect trace.

Embodiment 3

Figure 8A:
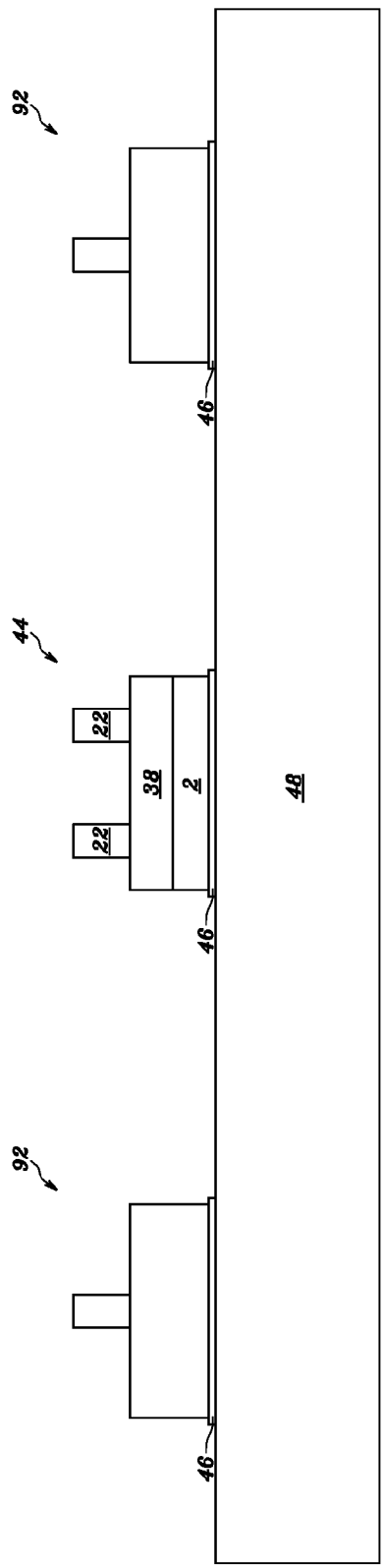

Referring to FIG. 8A, a glue material 46 is first formed on multiple regions of a substrate 48 by a dispensing process to form multiple glue portions on the substrate 48. Next, multiple semiconductor chips 44 and multiple passive devices 92, such as resistors, capacitors, inductors or filters, are respectively mounted onto the glue material 46 to be adhered to the substrate 48, and then the glue material 46 is baked at a temperature of between 100 and 200° C. The specification of the glue material 46 and the substrate 48 shown in FIGS. 8A-8M can be referred to the glue material 46 and the substrate 48 illustrated in FIGS. 6A and 6B.

Figure 8B:
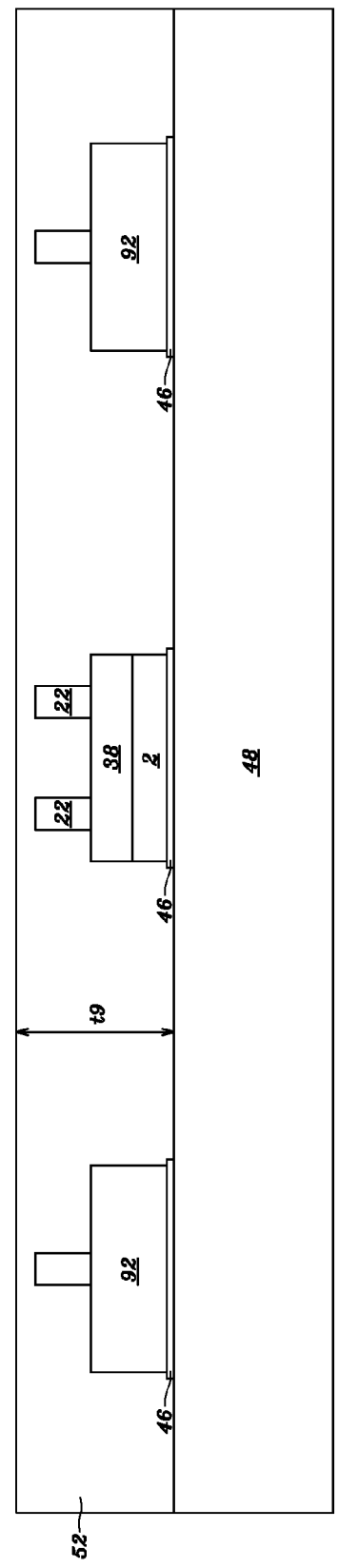
Figure 8E:
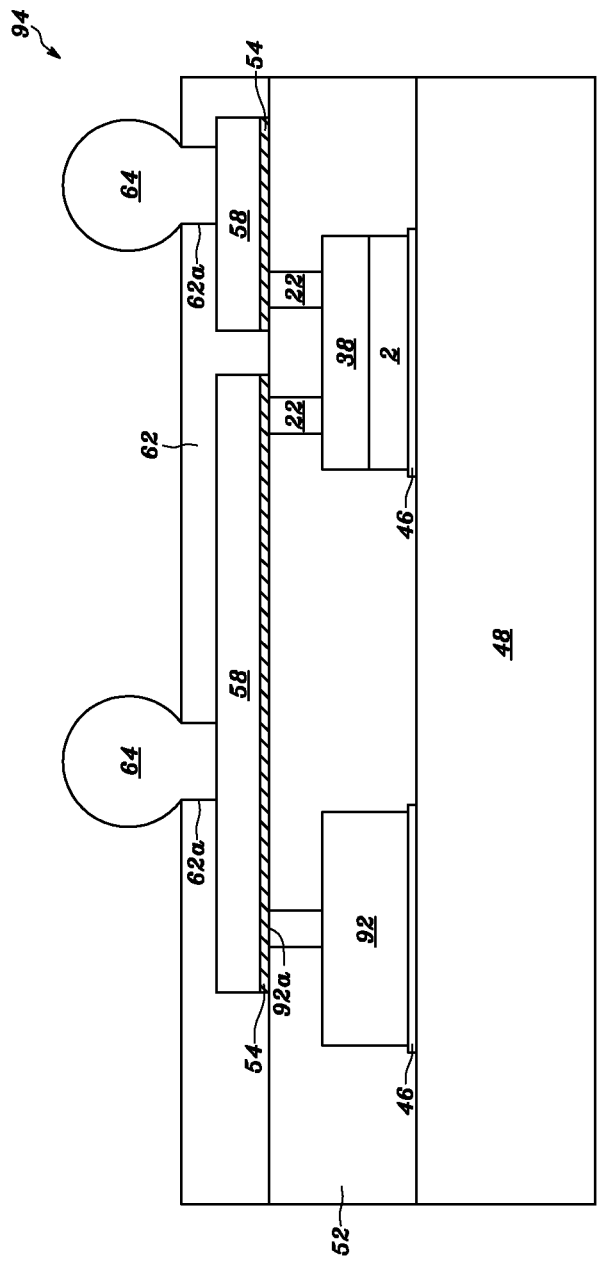

Referring to FIG. 8B, a polymer material 52 having a thickness of between t9 of between 250 and 1,000 μm is formed on the substrate 48, on the passive devices 92, on the semiconductor chips 44 and enclosing the metal bumps 22. The polymer material 52 can be formed by a molding process or a dispensing process. The polymer material 52 can be formed by molding benzocyclobutane (BCB), polyimide (PI) or an epoxy-based material, by dispensing benzocyclobutane (BCB), polyimide (PI) or an epoxy-based material, by coating benzocyclobutane (BCB), polyimide (PI) or an epoxy-based material, by printing benzocyclobutane (BCB), polyimide (PI) or an epoxy-based material, or by laminating benzocyclobutane (BCB), polyimide (PI) or an epoxy-based material.

For example, the polymer material 52 can be formed by molding an epoxy-based material having a thickness t9 of between 250 and 1,000 μm on the substrate 48, on the passive devices 92, on the semiconductor chips 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by molding polyimide or benzocyclobutane having a thickness t9 of between 250 and 1,000 μm on the substrate 48, on the passive devices 92, on the semiconductor chips 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5.

For example, the polymer material 52 can be formed by dispensing polyimide or benzocyclobutane having a thickness t9 of between 250 and 1,000 μm on the substrate 48, on the passive devices 92, on the semiconductor chips 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5.

Referring to FIG. 8C, a top surface of the polymer material 52 is polished to uncover a top surface of the metal bump 22 and a contact point 92a of the passive device 92 and to planarize a top surface of the polymer material 52, preferably by a mechanical polishing process. Alternatively, the top surface of the polymer material 52 is polished by a chemical mechanical polishing (CMP) process. When the polymer material 52 is being polished, the top portion of the metal bump 22 is allowed to be removed such that the metal bump 22, after being polished, may have a thickness t6 between 10 and 30 microns.

Referring to FIG. 8D, a metal layer 54 can be sputtered on the polymer material 52, on the contact point 92a and on a top surface of the metal bump 22. Alternatively, the metal layer 54 may be formed by an electroless plating process. The metal layer 54 can be formed of an adhesion/barrier layer having a thickness of between 0.03 and 1 µm on the polymer material 52m, on the contact point 92a and on the top surface of the metal bump 22, and a seed layer having a thickness of between 0.05 and 2 µm, and preferably of between 0.1 and 1 µm, on the adhesion/barrier layer. Alternatively, the metal layer 54 can be formed of a seed layer having a thickness of between 0.05 and 2 µm, and preferably of between 0.1 and 1 µm, on the polymer material 52, on the contact point 92a, and on the top surface of the metal bump 22. The material of the adhesion/barrier layer may include titanium, a titanium-tungsten alloy, titanium nitride, chromium, or tantalum nitride. The material of the seed layer may include gold, copper or silver. The process for forming the metal layer 54 on the polymer material 52, on the contact point 92a and on the metal bumps 22, as shown in FIG. 8D, can be referred to the process for forming the metal layer 54 on the polymer material 52 and on the metal bump 22, as illustrated in FIG. 6E.

After the metal layer 54 is formed, the steps as referred to in FIGS. 6F-6M are performed in sequence. Next, referring to FIG. 8E, the substrate 48, the polymer material 52 and the insulating layer 62 can be cutted into a plurality of chip packages 94 using a mechanical cutting process or using a laser cutting process.

In these chip packages 94, the patterned circuit layer 60 may include an interconnect trace connecting one of the metal bump 22 of the semiconductor chip 44 and the contact point 92a of the passive device 92 for providing a power voltage, a ground reference voltage or for transmitting a signal. A tin-containing ball 64 is connected to the other one of the metal bump 22 of the semiconductor chips 44 via the patterned circuit layer 60, and another tin-containing ball 64 is connected to the interconnect trace via the patterned circuit layer 60.

Figure 8F:
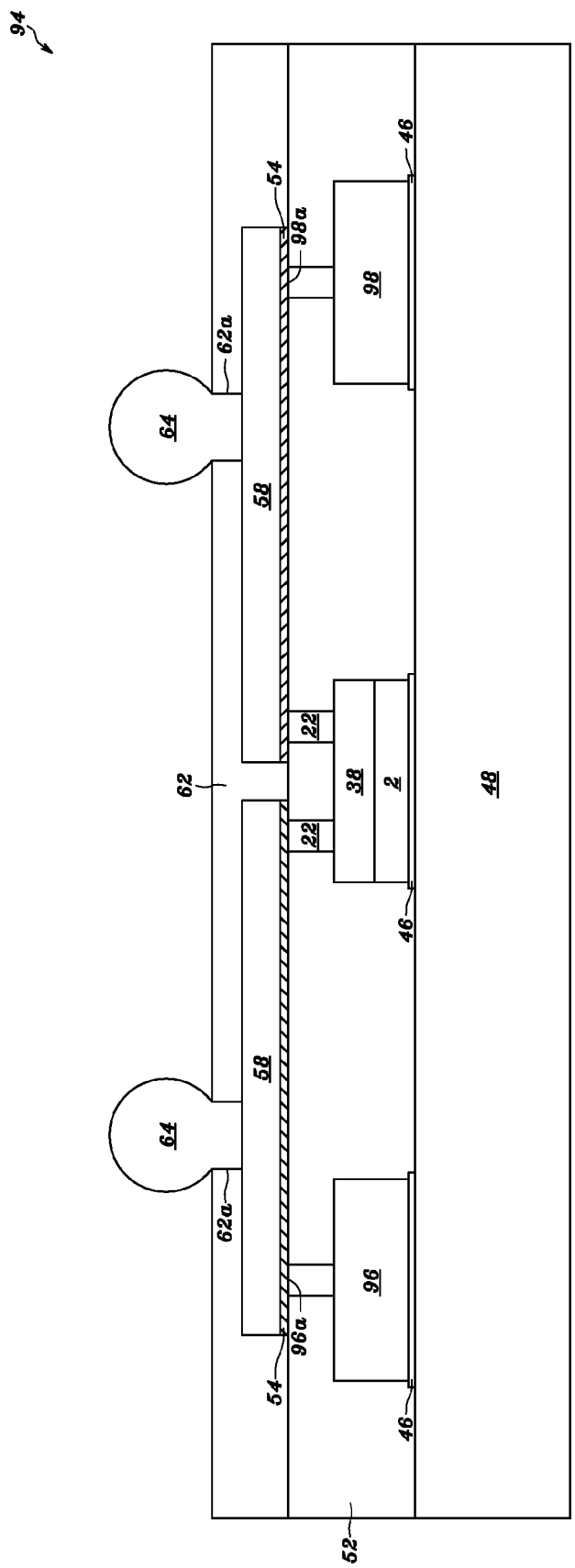
Figure 8G:
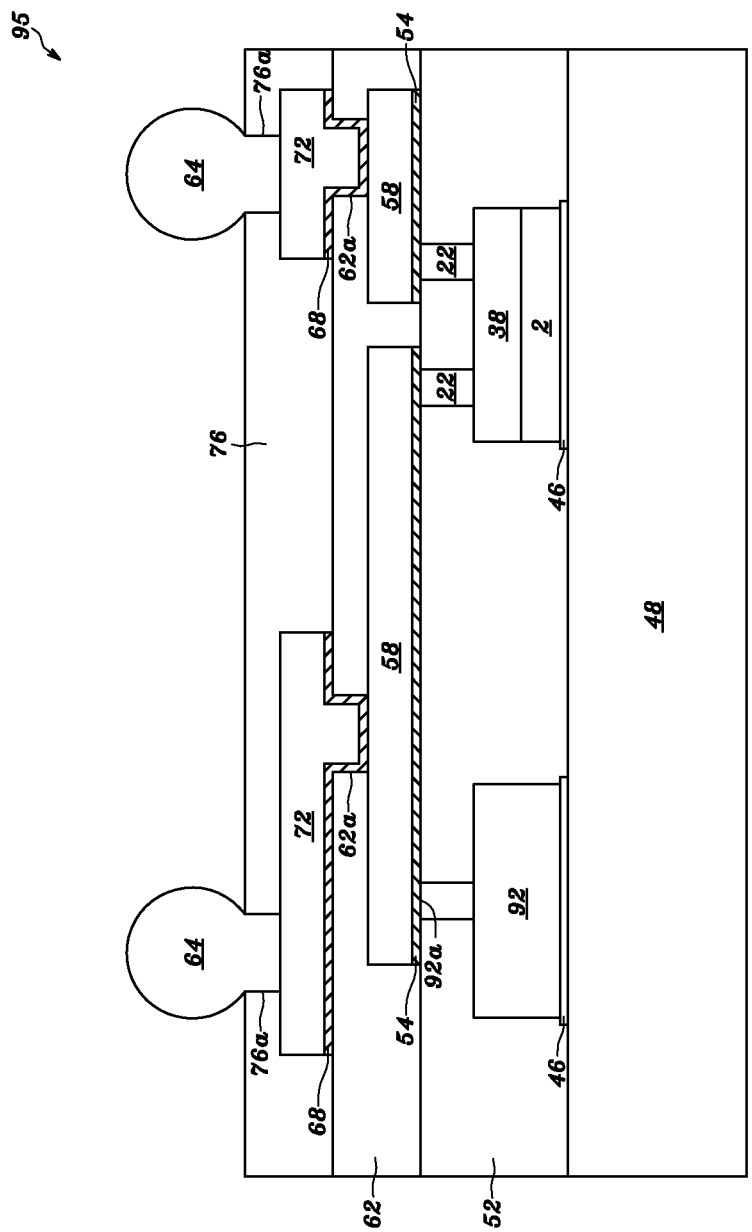

Alternatively, referring to FIG. 8F, these chip packages 94 may comprise a semiconductor chip 44 and two passive devices 96 and 98. The patterned circuit layer 60 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60. When the passive device 96 is a resistor, the passive device 98 can be a capacitor. When the passive device 96 is a resistor, the passive device 98 can be an inductor. When the passive device 96 is a capacitor, the passive device 98 can be an inductor.

Alternatively, multiple patterned circuit layers and multiple insulating layers can be formed over the polymer material 52, wherein one of the insulating layers is between the neighboring two of the patterned circuit layers. These patterned circuit layers are connected to each other through multiple metal vias in the insulating layers. The tin-containing ball 64 can be formed over the topmost one of the patterned circuit layers, and the bottommost one of the patterned circuit layers can be connected to the metal bump 22 and a contact point of the passive device. The following example is described for forming two patterned circuit layers. More than two patterned circuit layers can be referred to the following example.

After the metal layer 54 is formed, the steps as referred to in FIGS. 6F-6W are performed in sequence. Next, referring to FIG. 8G, the substrate 48, the polymer material 52, the insulating layer 62 and the solder mask 76 can be cutted into a plurality of chip packages 95 using a mechanical cutting process or using a laser cutting process.

In these chip packages 95, the patterned circuit layer 60 may include an interconnect trace connecting one of the metal bump 22 of the semiconductor chip 44 and the contact point 92a of the passive device 92 for providing a power voltage, a ground reference voltage or for transmitting a signal. The interconnect trace may be connected to a tin-containing ball 64 via the patterned circuit layer 74. The tin-containing balls 64 can be connected to the integrated circuit chip 44 and the passive device 92 through these patterned circuit layers 60 and 74.

Alternatively, in these chip packages 95, the patterned circuit layers 60 and 74 may include an interconnect trace connecting one of the metal bump 22 of the semiconductor chip 44 and the contact point 92a of the passive device 92 for providing a power voltage, a ground reference voltage or for transmitting a signal. The interconnect trace may be connected to a tin-containing ball 64 via the patterned circuit layer 74. The tin-containing balls 64 can be connected to the integrated circuit chip 44 and the passive device 92 through these patterned circuit layers 60 and 74.

Figure 8H:
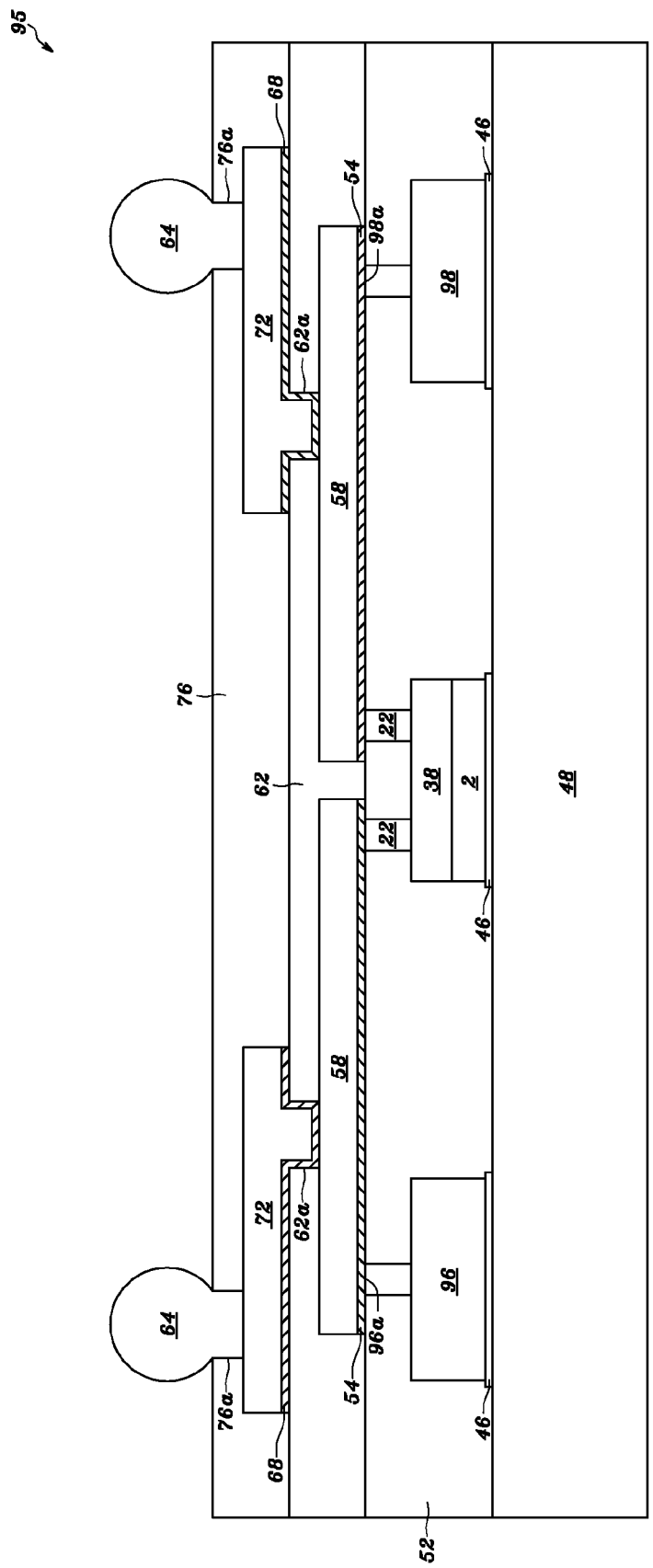

Alternatively, referring to FIG. 8H, these chip packages 95 may comprise a semiconductor chip 44 and two passive devices 96 and 98. The patterned circuit layer 60 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60 and the patterned circuit layer 74. Alternatively, these chip packages 95 may comprise a semiconductor chip 44 and two passive devices 96 and 98. The patterned circuit layers 60 and 74 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60 and the patterned circuit layer 74. When the passive device 96 is a resistor, the passive device 98 can be a capacitor. When the passive device 96 is a resistor, the passive device 98 can be an inductor. When the passive device 96 is a capacitor, the passive device 98 can be an inductor.

Figure 8I:
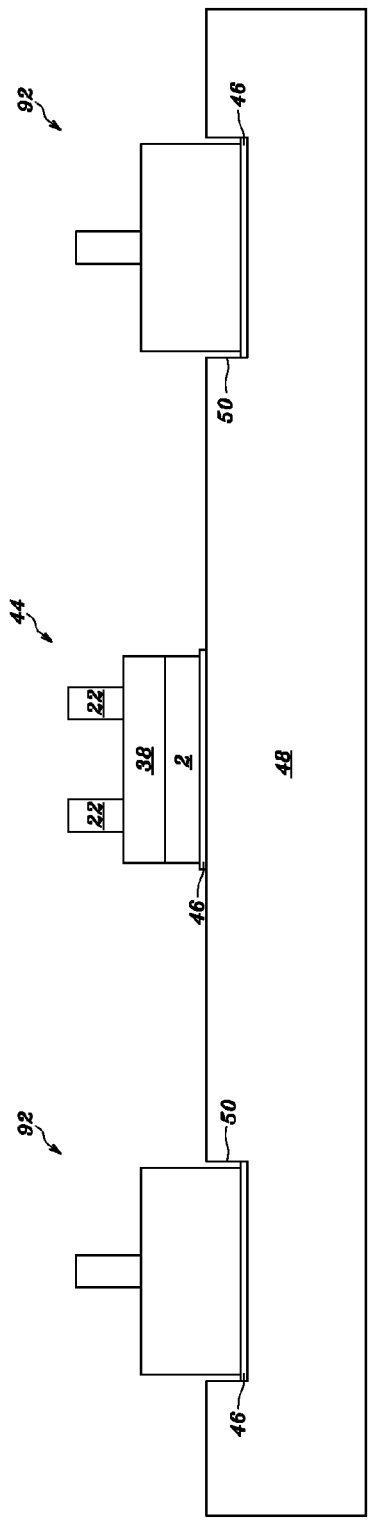

Referring to FIG. 8I, multiple cavities 50 may be formed in the substrate 48 using a mechanical drilling process, a laser drilling process or an etching process. Next, a glue material 46 can be formed on bottom surfaces of the cavities 50 in the substrate 48 for adhering to passive devices 92 and on a top surface of the substrate 48, not over the cavities 50, for adhering to the semiconductor chips 44 by a dispensing process to form multiple glue portions. Next, multiple semiconductor chips 44 are mounted onto the glue material 46 on the top surface of the substrate 48, not over the cavities 50, and multiple passive devices 92 are mounted onto the glue material 46 in the cavities 50. Next, the glue material 46 is baked at a temperature of between 100 and 200° C.

Figure 8J:
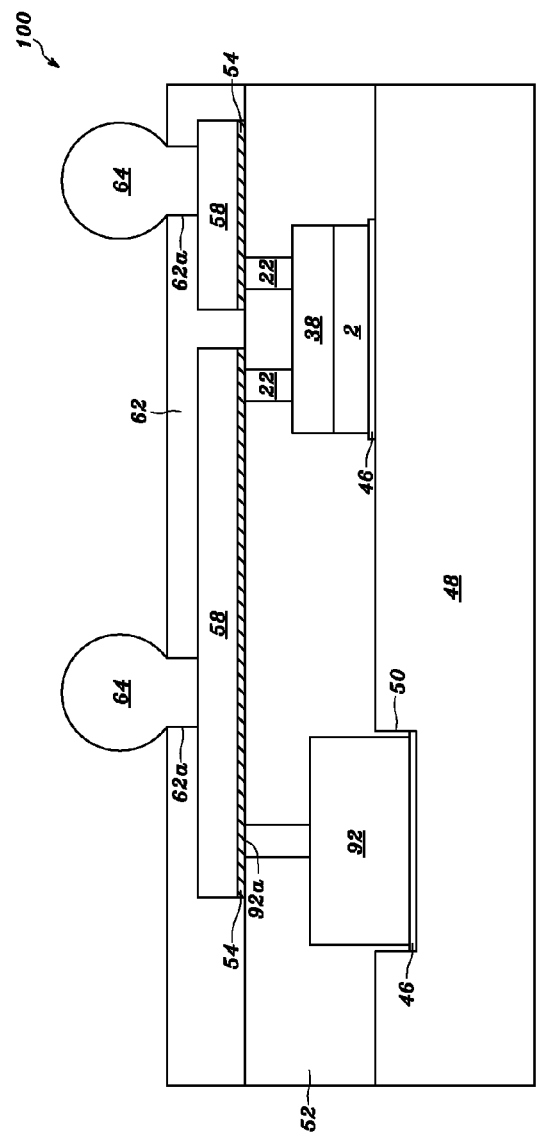

Referring to FIG. 8J, after these semiconductor chips 44 and these passive devices 92 are adhered to the substrate 48, the steps as referred to in FIGS. 8B-8E are performed in sequence. So far, multiple chip packages 100 are completed.

In these chip packages 100, the patterned circuit layer 60 may include an interconnect trace connecting one of the metal bump 22 of the semiconductor chip 44 and the contact point 92a of the passive device 92 for providing a power voltage, a ground reference voltage or for transmitting a signal. A tin-containing ball 64 is connected to the other one of the metal bump 22 of the semiconductor chips 44 via the patterned circuit layer 60, and another tin-containing ball 64 is connected to the interconnect trace via the patterned circuit layer 60.

Figure 8K:
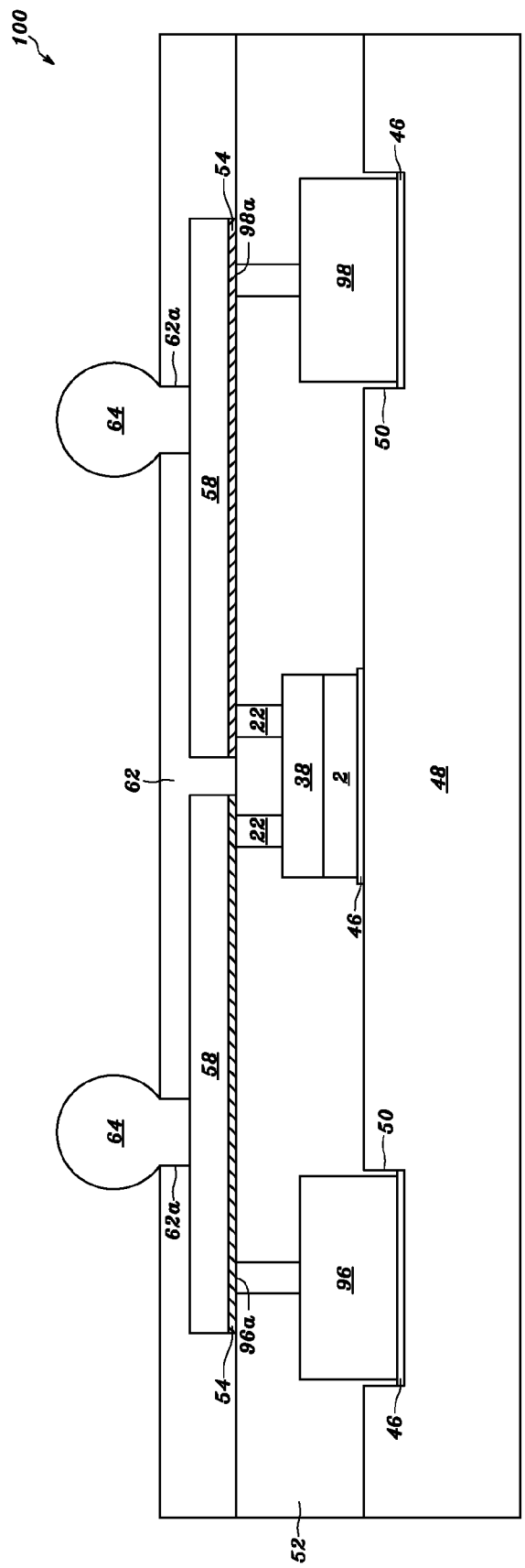
Figure 8L:
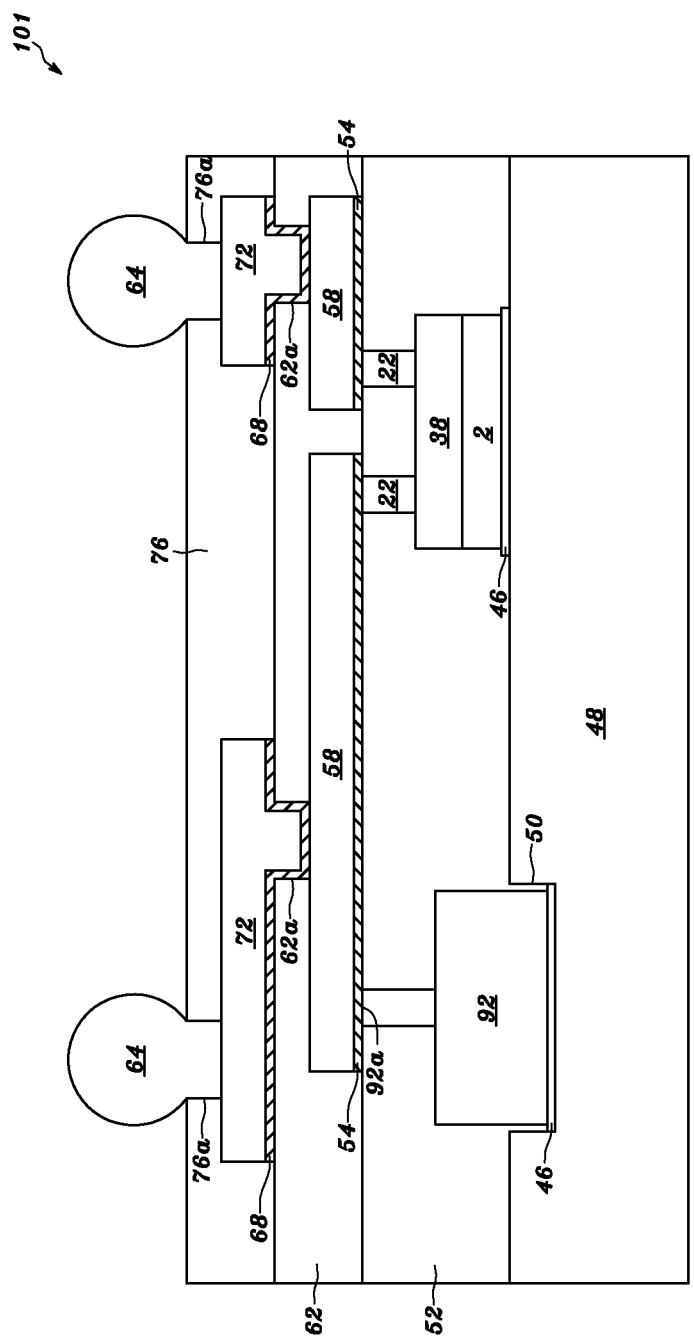

Alternatively, referring to FIG. 8K, these chip packages 100 may comprise a semiconductor chip 44 and two passive devices 96 and 98. The patterned circuit layer 60 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60. When the passive device 96 is a resistor, the passive device 98 can be a capacitor. When the passive device 96 is a resistor, the passive device 98 can be an inductor. When the passive device 96 is a capacitor, the passive device 98 can be an inductor.

Alternatively, multiple patterned circuit layers and multiple insulating layers can be formed over the polymer material 52, wherein one of the insulating layers is between the neighboring two of the patterned circuit layers. These patterned circuit layers are connected to each other through multiple metal vias in the insulating layers. The tin-containing ball 64 can be formed over the topmost one of the patterned circuit layers, and the bottommost one of the patterned circuit layers can be connected to the metal bump 22 and a contact point of the passive device. The following example is described for forming two patterned circuit layers. More than two patterned circuit layers can be referred to the following example.

After the metal layer 54 is formed, the steps as referred to in FIGS. 6F-6W are performed in sequence. Next, referring to FIG. 8L, the substrate 48, the polymer material 52, the insulating layer 62 and the solder mask 76 can be cutted into a plurality of chip packages 101 using a mechanical cutting process or using a laser cutting process.

In these chip packages 101, the patterned circuit layer 60 may include an interconnect trace connecting one of the metal bump 22 of the semiconductor chip 44 and the contact point 92a of the passive device 92 for providing a power voltage, a ground reference voltage or for transmitting a signal. The interconnect trace may be connected to a tin-containing ball 64 via the patterned circuit layer 74. The tin-containing balls 64 can be connected to the integrated circuit chip 44 and the passive device 92 through these patterned circuit layers 60 and 74.

Alternatively, in these chip packages 101, the patterned circuit layers 60 and 74 may include an interconnect trace connecting one of the metal bump 22 of the semiconductor chip 44 and the contact point 92a of the passive device 92 for providing a power voltage, a ground reference voltage or for transmitting a signal. The interconnect trace may be connected to a tin-containing ball 64 via the patterned circuit layer 74. The tin-containing balls 64 can be connected to the integrated circuit chip 44 and the passive device 92 through these patterned circuit layers 60 and 74.

Figure 8M:
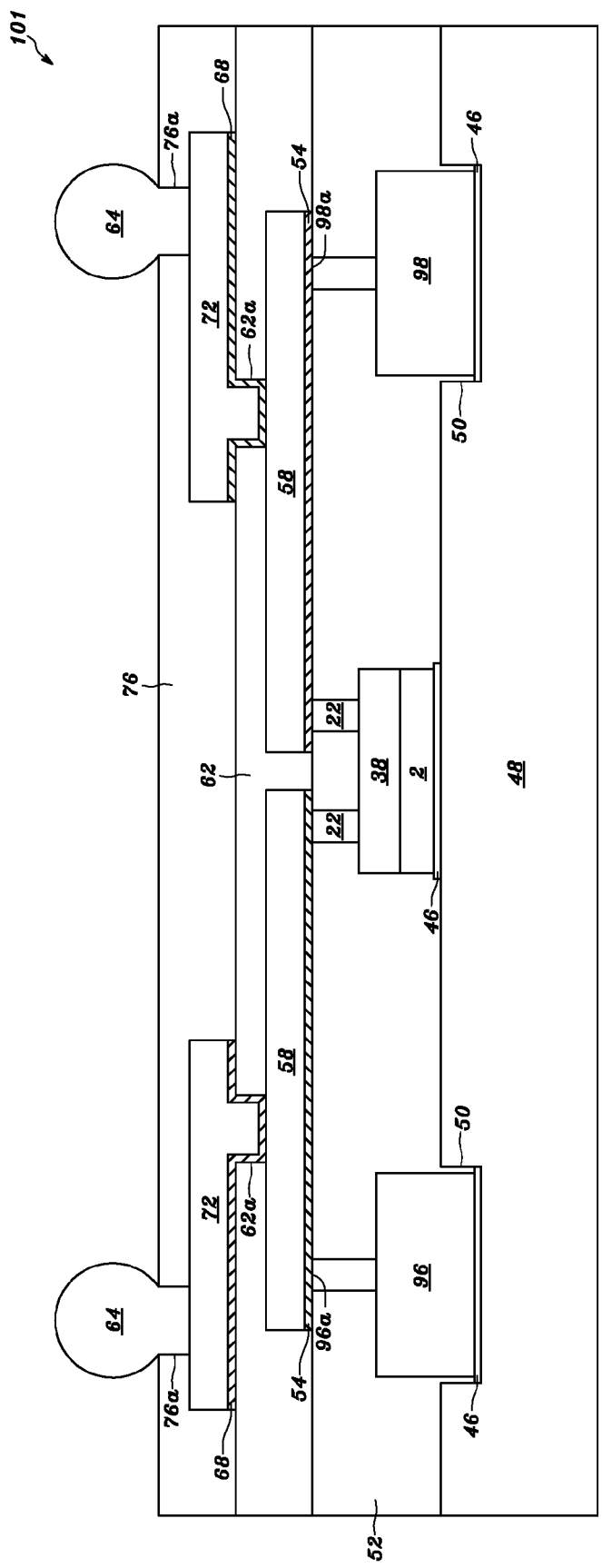

Alternatively, referring to FIG. 8M, these chip packages 101 may comprise a semiconductor chip 44 and two passive devices 96 and 98. The patterned circuit layer 60 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60 and the patterned circuit layer 74. Alternatively, these chip packages 101 may comprise a semiconductor chip 44 and two passive devices 96 and 98. The patterned circuit layers 60 and 74 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60 and the patterned circuit layer 74. When the passive device 96 is a resistor, the passive device 98 can be a capacitor. When the passive device 96 is a resistor, the passive device 98 can be an inductor. When the passive device 96 is a capacitor, the passive device 98 can be an inductor.

Embodiment 4

Figure 9C:
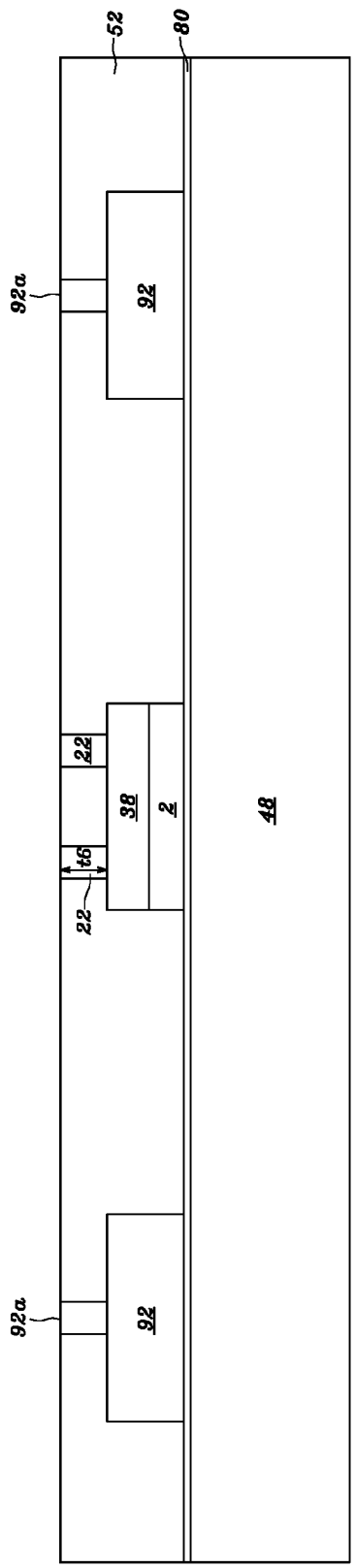

Referring to FIG. 9A, a glue material 80 is first formed on multiple regions of a substrate 48 by a coating process, a lamination process, an immerseon process or a spraying process to form multiple glue portions on the substrate 48. Next, multiple semiconductor chips 44 and multiple passive devices 92, such as resistors, capacitors, inductors or filters, are respectively mounted onto the glue material 80 to be adhered to the substrate 48 by heating the glue material 80 at a temperature of between 120 and 250° C. The structure of the substrate 48 shown in FIGS. 9A-9L can be referred to the substrate 48 illustrated in FIGS. 6A and 6B. The specification of the glue material 80 shown in FIGS. 9A-9L can be referred to the glue material 80 illustrated in FIG. 7A.

Referring to FIG. 9B, a polymer material 52 having a thickness of between t10 of between 250 and 1,000 µm is formed on the glue material 80, on the passive devices 92, on the semiconductor chips 44 and enclosing the metal bumps 22. The polymer material 52 can be formed by a molding process or a dispensing process. The polymer material 52 can be formed by molding benzocyclobutane (BCB), polyimide (PI) or an epoxy-based material, by dispensing benzocyclobutane (BCB), polyimide (PI) or an epoxy-based material, by coating benzocyclobutane (BCB), polyimide (PI) or an epoxy-based material, by printing benzocyclobutane (BCB), polyimide (PI) or an epoxy-based material, or by laminating benzocyclobutane (BCB), polyimide (PI) or an epoxy-based material.

For example, the polymer material 52 can be formed by molding an epoxy-based material having a thickness t10 of between 250 and 1,000 μm on the glue material 80, made of polyimide, on the passive device 92, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by molding an epoxy-based material having a thickness t10 of between 250 and 1,000 μm on the glue material 80, made of epoxy resin, on the passive device 92, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by molding polyimide or benzocyclobutane having a thickness t10 of between 250 and 1,000 μm on the glue material 80, made of polyimide, on the passive device 92, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by molding polyimide or benzocyclobutane having a thickness t10 of between 250 and 1,000 μm on the glue material 80, made of epoxy resin, on the passive device 92, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5.

For example, the polymer material 52 can be formed by dispensing polyimide or benzocyclobutane having a thickness t10 of between 250 and 1,000 μm on the glue material 80, made of polyimide, on the passive device 92, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5. Alternatively, the polymer material 52 can be formed by dispensing polyimide or benzocyclobutane having a thickness t10 of between 250 and 1,000 μm on the glue material 80, made of epoxy resin, on the passive device 92, on the semiconductor chip 44 and enclosing any one of the above-mentioned kinds of metal bump 22 as illustrated in FIGS. 2A-2I, 2A-a through 2A-g, in FIGS. 3A-3G, in FIGS. 4A-4E and in FIG. 5.

Referring to FIG. 9C, a top surface of the polymer material 52 is polished to uncover a top surface of the metal bump 22 and a contact point 92a of the passive device 92 and to planarize a top surface of the polymer material 52, preferably by a mechanical polishing process. Alternatively, the top surface of the polymer material 52 is polished by a chemical mechanical polishing (CMP) process. When the polymer material 52 is being polished, the top portion of the metal bump 22 is allowed to be removed such that the metal bump 22, after being polished, may have a thickness t6 between 10 and 30 microns.

Figure 9D:
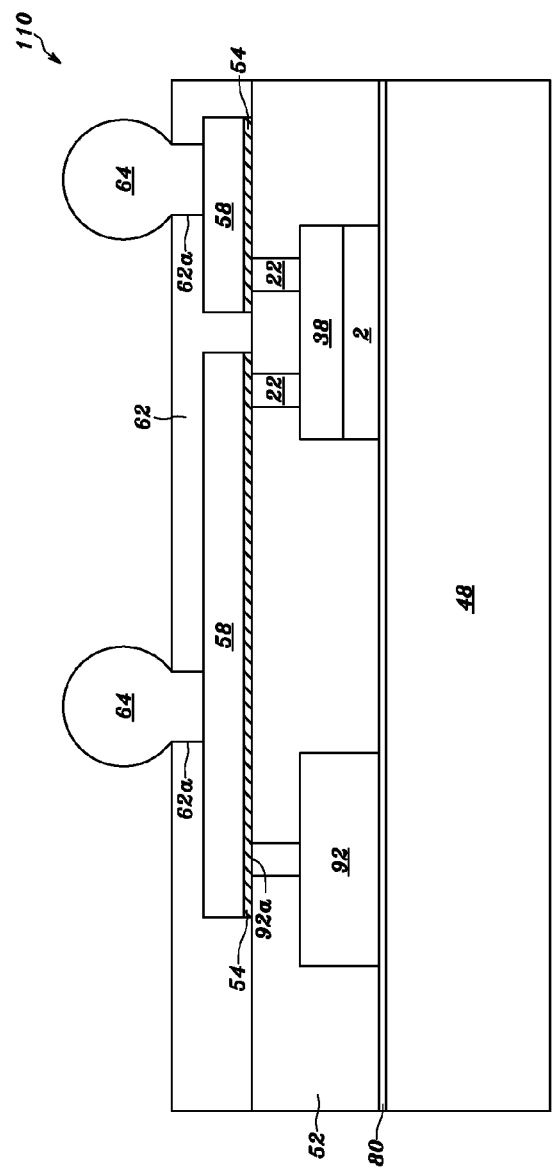

Referring to FIG. 9D, after the step of show in FIG. 9C, the steps as referred to in FIGS. 6E-6M are performed in sequence. Next, the substrate 48, the glue material 80, the polymer material 52 and the insulating layer 62 can be cutted into a plurality of chip packages 110 using a mechanical cutting process or using a laser cutting process. Alternatively, the glue material 80, the polymer material 52 and the insulating layer 62 can be cutted using a mechanical cutting process or using a laser cutting process in the time when the substrate 48 is not cutted, and then the substrate 48 is separated from the semiconductor chips 44, the passive devices 92 and the polymer material 52. So far, multiple chip packages 110 are completed.

In these chip packages 110, the patterned circuit layer 60 may include an interconnect trace connecting one of the metal bump 22 of the semiconductor chip 44 and the contact point 92a of the passive device 92 for providing a power voltage, a ground reference voltage or for transmitting a signal. A tin-containing ball 64 is connected to the other one of the metal bump 22 of the semiconductor chips 44 via the patterned circuit layer 60, and another tin-containing ball 64 is connected to the interconnect trace via the patterned circuit layer 60.

Figure 9E:
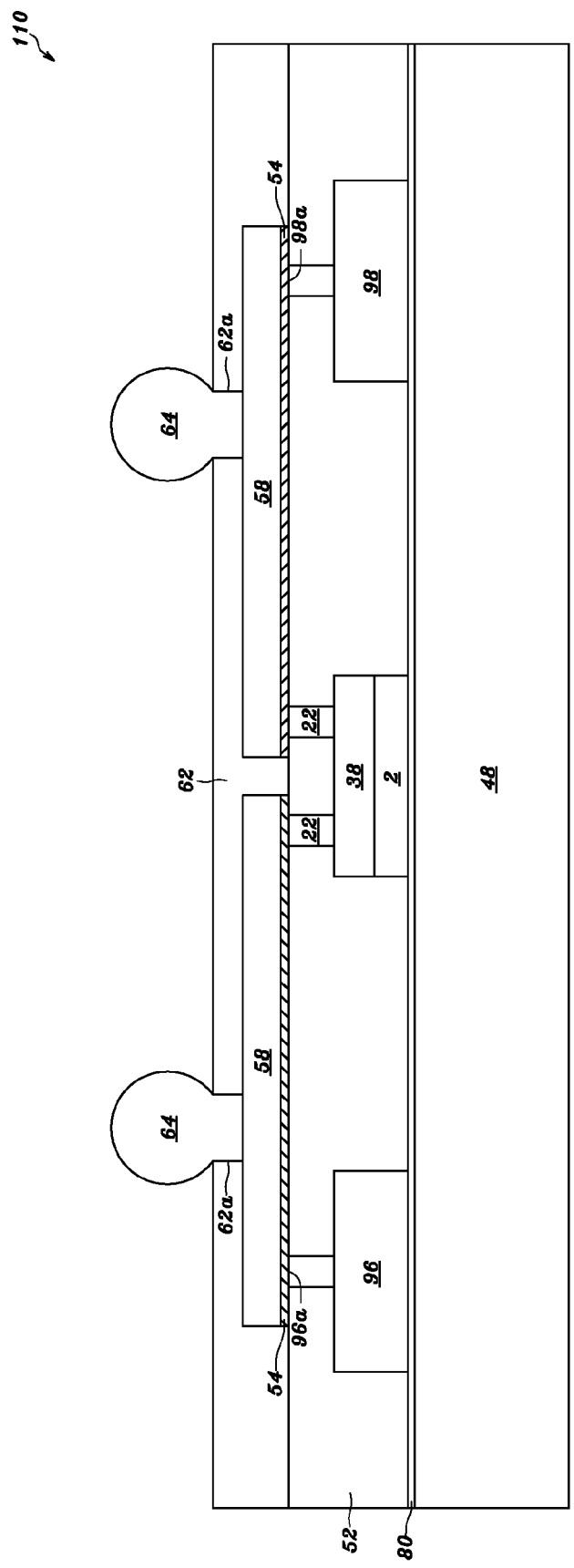
Figure 9F:
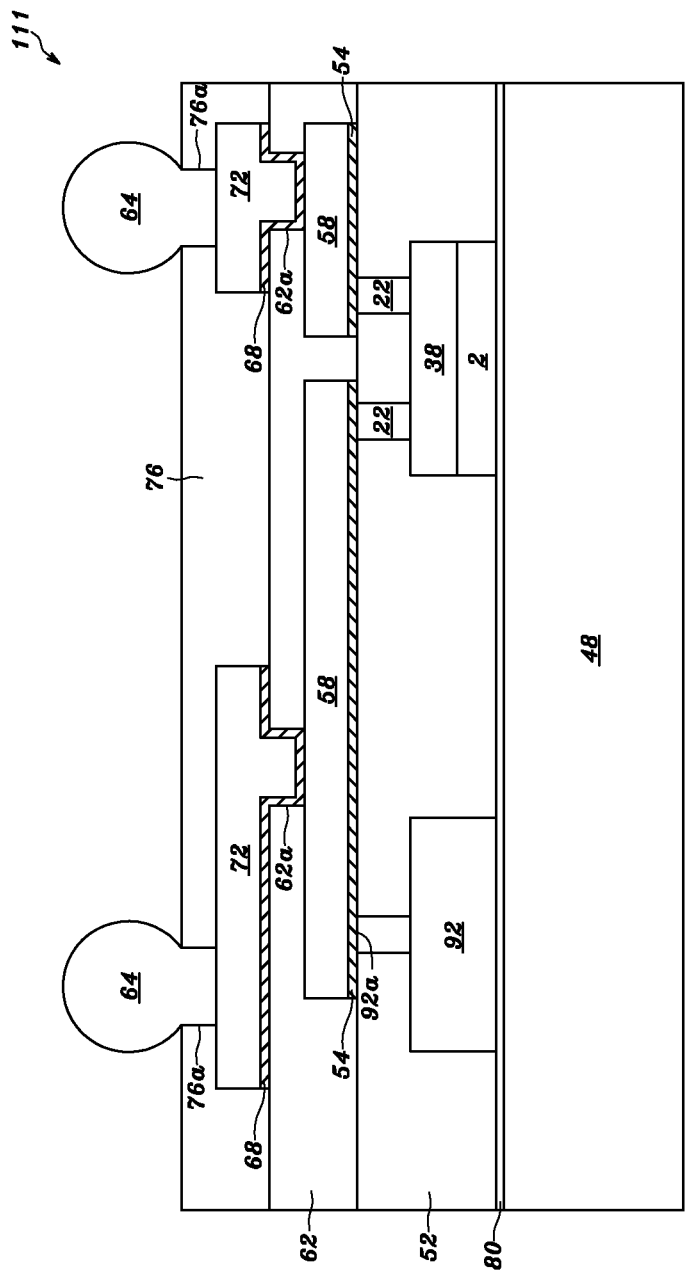

Alternatively, referring to FIG. 9E, these chip packages 110 may comprise a semiconductor chip 44 and two passive devices 96 and 98. The patterned circuit layer 60 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60. When the passive device 96 is a resistor, the passive device 98 can be a capacitor. When the passive device 96 is a resistor, the passive device 98 can be an inductor. When the passive device 96 is a capacitor, the passive device 98 can be an inductor.

Alternatively, multiple patterned circuit layers and multiple insulating layers can be formed over the polymer material 52, wherein one of the insulating layers is between the neighboring two of the patterned circuit layers. These patterned circuit layers are connected to each other through multiple metal vias in the insulating layers. The tin-containing ball 64 can be formed over the topmost one of the patterned circuit layers, and the bottommost one of the patterned circuit layers can be connected to the metal bump 22 and a contact point of the passive device. The following example is described for forming two patterned circuit layers. More than two patterned circuit layers can be referred to the following example.

After the step of show in FIG. 9C, the steps as referred to in FIGS. 6E-6W are performed in sequence. Next, referring to FIG. 9F, the substrate 48, the glue material 80, the polymer material 52, the insulating layer 62 and the solder mask 76 can be cutted into a plurality of chip packages 111 using a mechanical cutting process or using a laser cutting process. Alternatively, the glue material 80, the polymer material 52, the insulating layer 62 and the solder mask 76 can be cutted using a mechanical cutting process or using a laser cutting process in the time when the substrate 48 is not cutted, and then the substrate 48 is separated from the semiconductor chips 44, the passive devices 92 and the polymer material 52. So far, multiple chip packages 111 are completed.

In these chip packages 111, the patterned circuit layer 60 may include an interconnect trace connecting one of the metal bump 22 of the semiconductor chip 44 and the contact point 92a of the passive device 92 for providing a power voltage, a ground reference voltage or for transmitting a signal. The interconnect trace may be connected to a tin-containing ball 64 via the patterned circuit layer 74. The tin-containing balls 64 can be connected to the integrated circuit chip 44 and the passive device 92 through these patterned circuit layers 60 and 74.

Alternatively, in these chip packages 111, the patterned circuit layers 60 and 74 may include an interconnect trace connecting one of the metal bump 22 of the semiconductor chip 44 and the contact point 92a of the passive device 92 for providing a power voltage, a ground reference voltage or for transmitting a signal. The interconnect trace may be connected to a tin-containing ball 64 via the patterned circuit layer 74. The tin-containing balls 64 can be connected to the integrated circuit chip 44 and the passive device 92 through these patterned circuit layers 60 and 74.

Figure 9G:
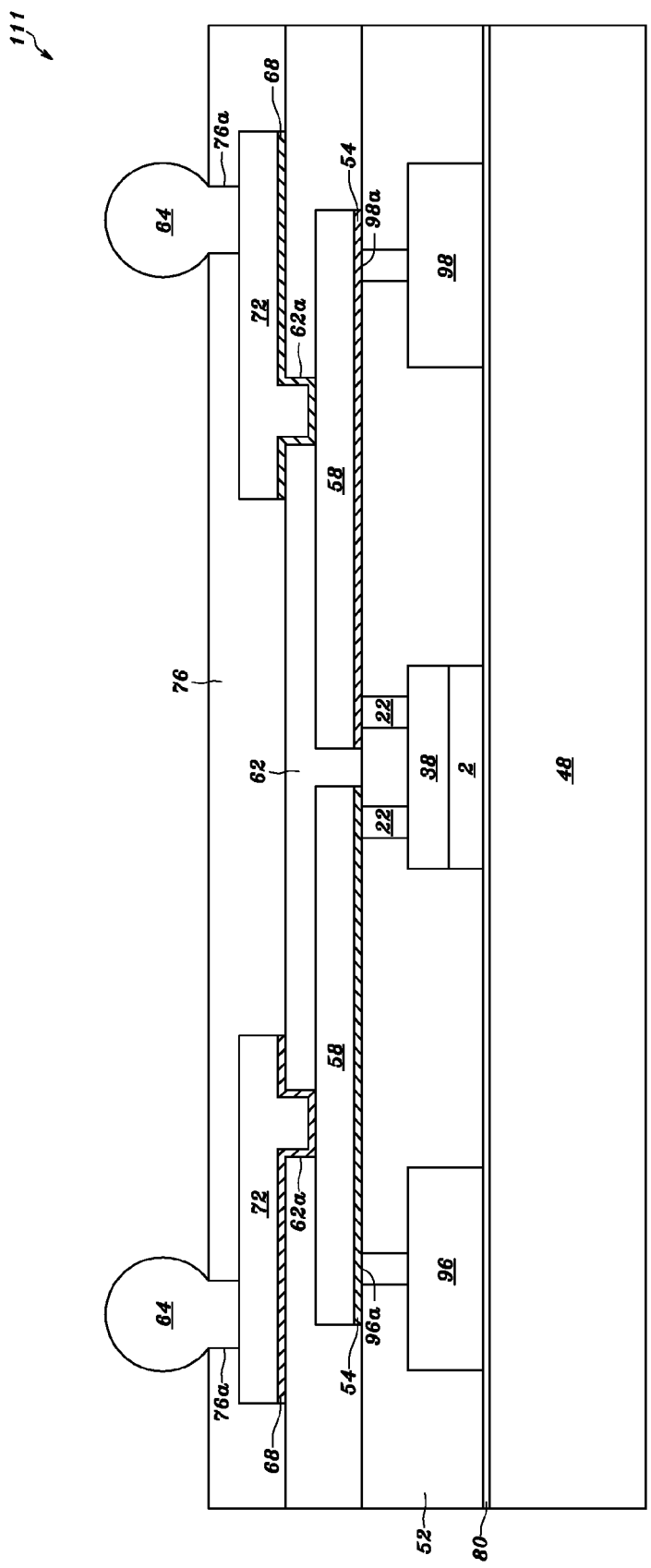

Alternatively, referring to FIG. 9G, these chip packages 111 may comprise a semiconductor chip 44 and two passive devices 96 and 98. The patterned circuit layer 60 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60 and the patterned circuit layer 74. Alternatively, these chip packages 111 may comprise a semiconductor chip 44 and two passive devices 96 and 98. The patterned circuit layers 60 and 74 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60 and the patterned circuit layer 74. When the passive device 96 is a resistor, the passive device 98 can be a capacitor. When the passive device 96 is a resistor, the passive device 98 can be an inductor. When the passive device 96 is a capacitor, the passive device 98 can be an inductor.

Figure 9H:
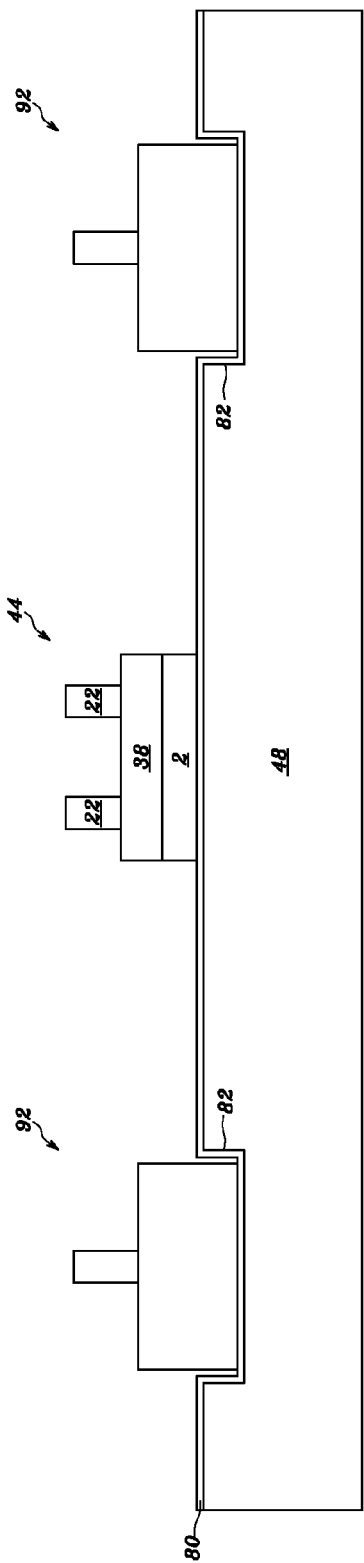

Referring to FIG. 9H, multiple cavities 82 may be formed in the substrate 48 using a mechanical drilling process, a laser drilling process or an etching process. Next, a glue material 80 can be formed on bottom surfaces of the cavities 82 in the substrate 48 for adhering to passive devices 92 and on a top surface of the substrate 48, not over the cavities 82, for adhering to the semiconductor chips 44 by a coating process, a lamination process, an immerseon process or a spraying process to form multiple glue portions. Next, multiple semiconductor chips 44 are mounted onto the glue material 80 on the top surface of the substrate 48, not over the cavities 82, and multiple passive devices 92 are mounted onto the glue material 80 in the cavities 82 by heating the glue material 80 at a temperature of between 120 and 250° C.

Figure 9I:
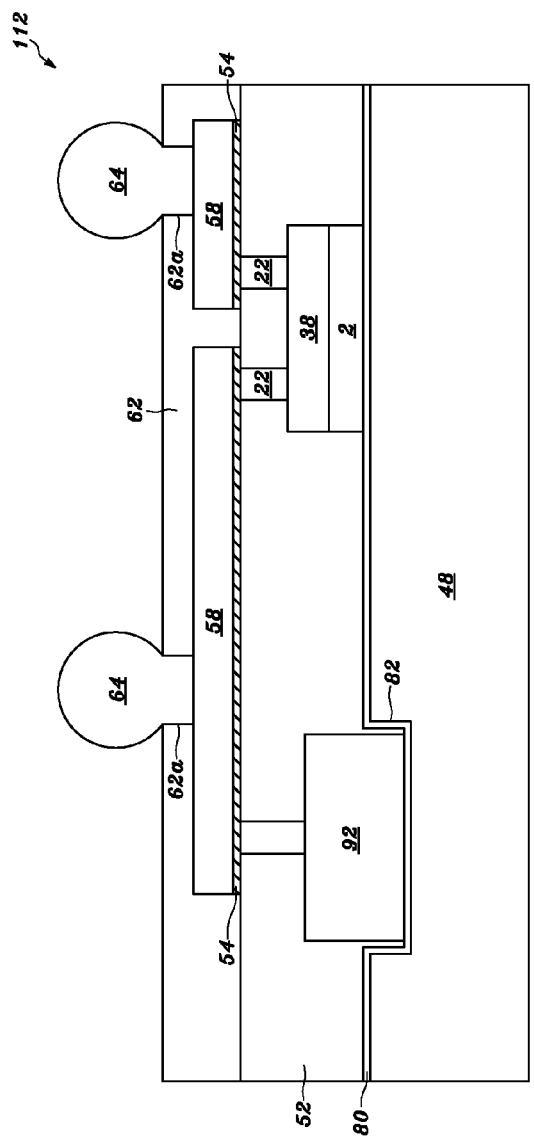

Referring to FIG. 9I, after these semiconductor chips 44 and these passive devices 92 are adhered to the substrate 48, the steps as referred to in FIGS. 9B-9D are performed in sequence. So far, multiple chip packages 112 are completed.

In these chip packages 112, the patterned circuit layer 60 may include an interconnect trace connecting one of the metal bump 22 of the semiconductor chip 44 and the contact point 92a of the passive device 92 for providing a power voltage, a ground reference voltage or for transmitting a signal. A tin-containing ball 64 is connected to the other one of the metal bump 22 of the semiconductor chips 44 via the patterned circuit layer 60, and another tin-containing ball 64 is connected to the interconnect trace via the patterned circuit layer 60.

Figure 9J:
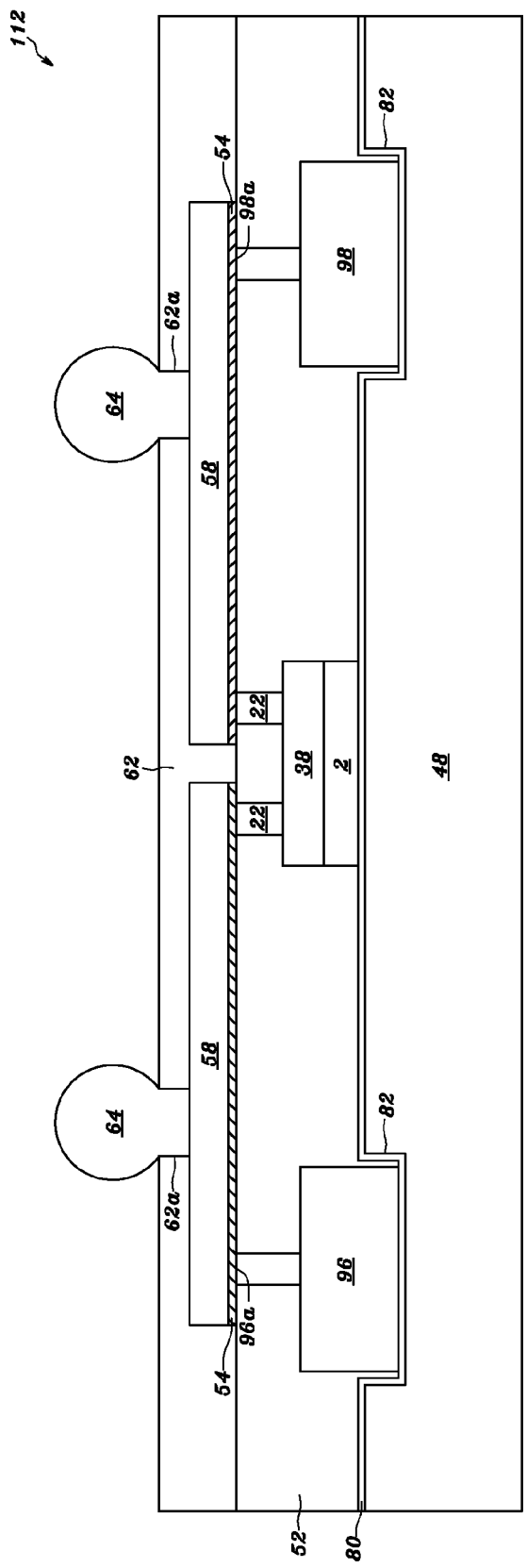
Figure 9K:
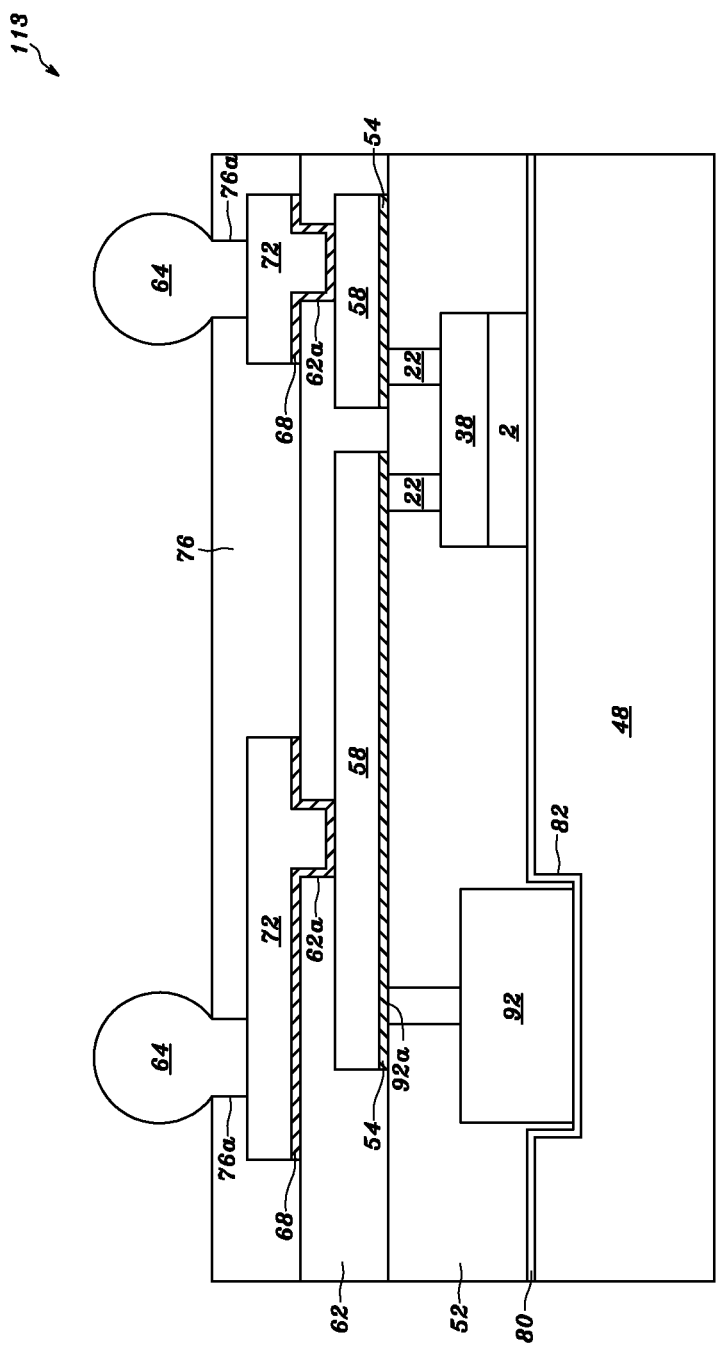

Alternatively, referring to FIG. 9J, these chip packages 112 may comprise a semiconductor chip 44 and two passive devices 96 and 98. The patterned circuit layer 60 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60. When the passive device 96 is a resistor, the passive device 98 can be a capacitor. When the passive device 96 is a resistor, the passive device 98 can be an inductor. When the passive device 96 is a capacitor, the passive device 98 can be an inductor.

Alternatively, multiple patterned circuit layers and multiple insulating layers can be formed over the polymer material 52, wherein one of the insulating layers is between the neighboring two of the patterned circuit layers. These patterned circuit layers are connected to each other through multiple metal vias in the insulating layers. The tin-containing ball 64 can be formed over the topmost one of the patterned circuit layers, and the bottommost one of the patterned circuit layers can be connected to the metal bump 22 and a contact point of the passive device. The following example is described for forming two patterned circuit layers. More than two patterned circuit layers can be referred to the following example.

After these semiconductor chips 44 and these passive devices 92 are adhered to the substrate 48, the steps as referred to in FIGS. 6C-6W are performed in sequence. Next, referring to FIG. 9K, the substrate 48, the glue material 80, the polymer material 52, the insulating layer 62 and the solder mask 76 can be cutted into a plurality of chip packages 113 using a mechanical cutting process or using a laser cutting process. Alternatively, the glue material 80, the polymer material 52, the insulating layer 62 and the solder mask 76 can be cutted using a mechanical cutting process or using a laser cutting process in the time when the substrate 48 is not cutted, and then the substrate 48 is separated from the semiconductor chips 44, the passive devices 92 and the polymer material 52. So far, multiple chip packages 113 are completed.

In these chip packages 113, the patterned circuit layer 60 may include an interconnect trace connecting one of the metal bump 22 of the semiconductor chip 44 and the contact point 92a of the passive device 92 for providing a power voltage, a ground reference voltage or for transmitting a signal. The interconnect trace may be connected to a tin-containing ball 64 via the patterned circuit layer 74. The tin-containing balls 64 can be connected to the integrated circuit chip 44 and the passive device 92 through these patterned circuit layers 60 and 74.

Alternatively, in these chip packages 113, the patterned circuit layers 60 and 74 may include an interconnect trace connecting one of the metal bump 22 of the semiconductor chip 44 and the contact point 92a of the passive device 92 for providing a power voltage, a ground reference voltage or for transmitting a signal. The interconnect trace may be connected to a tin-containing ball 64 via the patterned circuit layer 74. The tin-containing balls 64 can be connected to the integrated circuit chip 44 and the passive device 92 through these patterned circuit layers 60 and 74.

Figure 9L:
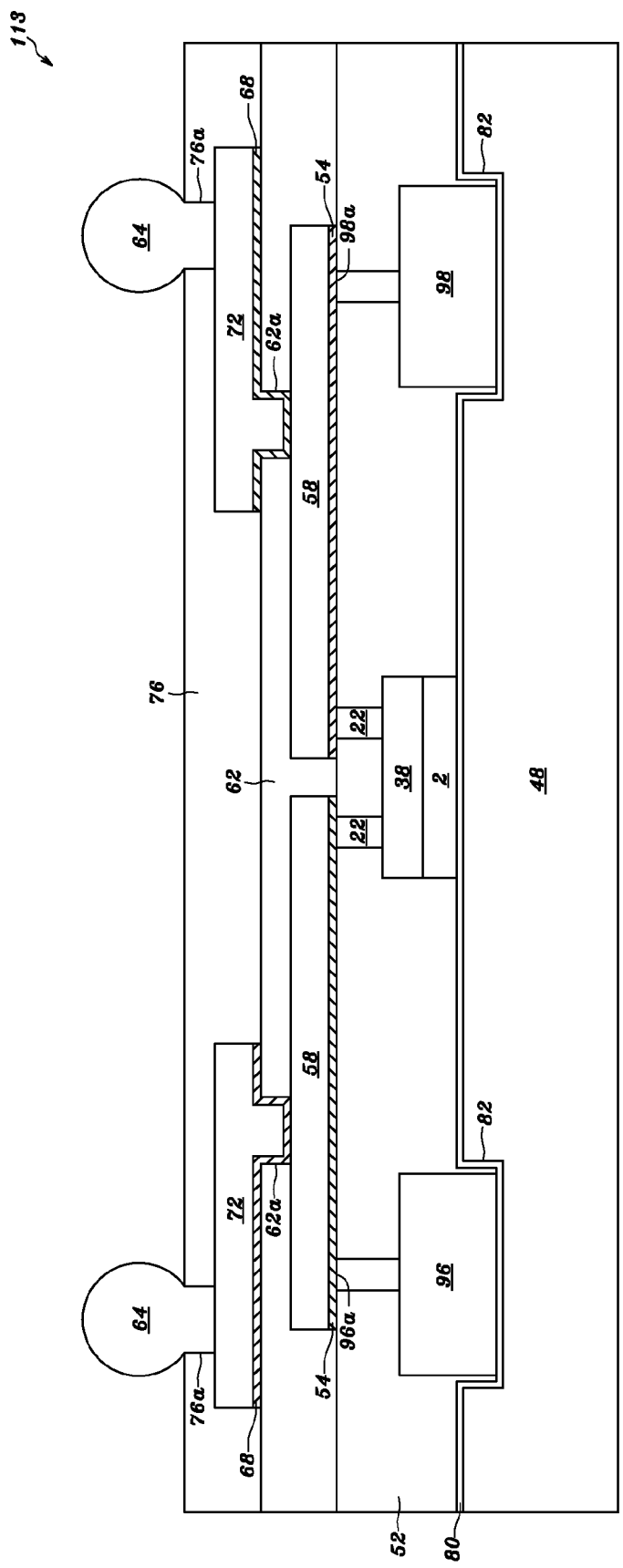

Alternatively, referring to FIG. 9L, these chip packages 113 may comprise a semiconductor chip 44 and two passive devices 96 and 98. The patterned circuit layer 60 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60 and the patterned circuit layer 74. Alternatively, these chip packages 113 may comprise a semiconductor chip 44 and two passive devices 96 and 98. The patterned circuit layers 60 and 74 may include a first interconnect trace connecting one of the metal bumps 22 of the semiconductor chip 44 to the contact point 96a of the passive device 96 for providing a power voltage, a ground reference voltage or for transmitting a signal, and a second interconnect trace connecting the other one of the metal bumps 22 of the semiconductor chip 44 to the contact point 98a of the passive device 98 for providing a power voltage, a ground reference voltage or for transmitting a signal. The tin-containing balls 64 are connected to the semiconductor chip 44 and the passive devices 96 and 98 via the patterned circuit layer 60 and the patterned circuit layer 74. When the passive device 96 is a resistor, the passive device 98 can be a capacitor. When the passive device 96 is a resistor, the passive device 98 can be an inductor. When the passive device 96 is a capacitor, the passive device 98 can be an inductor.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A chip package comprising:
a first semiconductor chip having a first surface, said first semiconductor chip comprising a passivation layer defining an opening exposing a contact pad;
a first polymer layer having a planar surface and a polymer surface opposite said planar surface, in which a portion of said first polymer layer is coupled to said first surface and sidewalls of said first semiconductor chip;
a first conductive interconnect having a coupling surface for coupling to said contact pad and a second surface opposite said coupling surface, in which said second surface of said first conductive interconnect is co-planar with said polymer surface of said first polymer layer opposite said first surface of said first semiconductor chip, wherein said first conductive interconnect comprises an adhesion/barrier layer directly on said first polymer layer and said contact pad, a conductive seed layer directly on said adhesion/barrier layer and an electroplated conductive layer directly on said seed layer, wherein a first sidewall of said electroplated conductive layer is flush with a first sidewall of said adhesion/barrier layer and a first sidewall of said seed layer, and a second sidewall opposite said first sidewall of said electroplated conductive layer is flush with a second sidewall of said adhesion/barrier layer and a second sidewall of said seed layer;
a second polymer layer coupled to said first polymer layer on said polymer surface;
a conductive layer having conductive elements within and directly on a surface of said second polymer layer and directly on said second surface opposite said coupling surface of said first conductive interconnect, and across an edge of said first semiconductor chip; and
a third polymer layer on said conductive layer, on said second polymer layer and across said edge of said first semiconductor chip.

2. The chip package of claim 1 further comprising a second semiconductor chip coupled to said first polymer layer, wherein said second semiconductor chip is coupled to said first semiconductor chip through said conductive layer.

3. The chip package of claim 1 further comprising a second conductive interconnect on a contact point of said conductive layer within an opening in said second polymer layer, wherein said second conductive interconnect is coupled to said contact point through said opening, wherein said second conductive interconnect comprises a tin-containing layer coupled to said contact point.

4. The chip package of claim 1 further comprising a substrate coupled to said first polymer layer.

5. The chip package of claim 1, wherein said first semiconductor chip further comprises a conductive trace coupled to said first semiconductor substrate, wherein said conductive trace comprises a second copper layer having a thickness between 1 and 20 micrometers, wherein said first copper layer is further directly on said second copper layer.

6. The chip package of claim 5, wherein said conductive trace further comprises a titanium-containing layer coupled to said second copper layer.

7. The chip package of claim 5, wherein said first semiconductor chip further comprises a third polymer layer coupled to said first semiconductor substrate, wherein said conductive trace is further on said third polymer layer, wherein said third polymer layer has a thickness between 3 and 15 micrometers.

8. A chip package comprising:
a first semiconductor chip having a first surface, said first semiconductor chip comprising a passivation layer having an opening exposing a contact pad;
a first polymer layer having a planar surface and a polymer surface opposite said planar surface, in which a portion of said first polymer layer is coupled to said first surface and sidewalls of said first semiconductor chip;
a first conductive interconnect having a coupling surface for coupling to said contact pad and a second surface opposite said coupling surface, in which said second surface of said first conductive interconnect is co-planar with said polymer surface of said first polymer layer opposite said first surface of said semiconductor chip, wherein said first conductive interconnect comprises an adhesion/barrier layer directly on said first polymer layer and said contact pad, a conductive first seed layer directly on said adhesion/barrier layer and an electroplated conductive layer directly on said seed layer, wherein a first sidewall of said electroplated conductive layer is flush with a first sidewall of said adhesion/barrier layer and a first sidewall of said seed layer, and a second sidewall opposite said first sidewall of said electroplated conductive layer is flush with a second sidewall of said adhesion/barrier layer and a second sidewall of said seed layer;

a second polymer layer coupled to said first polymer layer on said polymer surface;

a conductive layer having conductive elements within and directly on a surface of said second polymer layer and directly on said second surface opposite said coupling surface of said first conductive interconnect, and across an edge of said first semiconductor chip, wherein said conductive layer comprises a second conductive seed layer coupled to said surface of said second polymer layer and across said edge of said first semiconductor chip; and a third polymer layer on said conductive layer, on said second polymer layer and across said edge of said first semiconductor chip.

9. The chip package of claim 8 further comprising a second semiconductor chip coupled to said first polymer layer, wherein said second semiconductor chip is coupled to said first semiconductor chip through said conductive layer.

10. The chip package of claim 8 further comprising a second conductive interconnect on a contact point of said conductive layer within an opening in said second polymer layer, wherein said second conductive interconnect is coupled to said contact point through said opening, wherein said second conductive interconnect comprises a tin-containing layer coupled to said contact point.

11. The chip package of claim 8, wherein said second conductive seed layer has a thickness between 5 and 100 micrometers.

12. The chip package of claim 8 further comprising a substrate coupled to said first polymer layer.

13. The chip package of claim 8, wherein said first semiconductor chip further comprises a conductive trace coupled to said semiconductor substrate, wherein said conductive trace comprises a third copper layer having a thickness between 1 and 20 micrometers, wherein said first copper layer is further directly on said third copper layer.

14. The chip package of claim 13, wherein said conductive trace further comprises a titanium-containing layer coupled to said third copper layer.

15. The chip package of claim 13, wherein said first semiconductor chip further comprises a third polymer layer coupled to said semiconductor substrate, wherein said conductive trace is further on said third polymer layer, wherein said third polymer layer has a thickness between 3 and 15 micrometers.

16. A chip package comprising:
a first semiconductor chip having a first surface, said first semiconductor chip comprising a passivation layer having an opening exposing a contact pad;

a first polymer layer having a planar surface and a polymer surface opposite said planar surface, in which a portion of said first polymer layer is coupled to said first surface and sidewalls of said first semiconductor chip;

a first conductive interconnect having a coupling surface for coupling to said contact pad and a second surface opposite said coupling surface, in which said second surface of said first conductive interconnect is co-planar with said polymer surface of said first polymer layer opposite said first surface of said semiconductor chip, said first conductive interconnect comprising an adhesion/barrier layer directly on said first polymer layer and said contact pad, a conductive seed layer directly on said adhesion/barrier layer and an electroplated conductive layer directly on said seed layer, wherein a first sidewall of said electroplated conductive layer is flush with a first sidewall of said adhesion/barrier layer and a first sidewall of said seed layer, and a second sidewall opposite said first sidewall of said electroplated conductive layer is flush with a second sidewall of said adhesion/barrier layer and a second sidewall of said seed layer;

a second polymer layer coupled to said first polymer layer on said polymer surface;

a conductive layer having conductive elements within and directly on a surface of said second polymer layer and directly on said second surface opposite said coupling surface of said conductive interconnect, and across an edge of said first semiconductor chip;

a second semiconductor chip coupled to said first semiconductor chip through said conductive layer; and a third polymer layer on said conductive layer, on said surface of said second polymer layer and across said edge of said first semiconductor chip.

* * * * *